United States Patent
Zheng et al.

(10) Patent No.: US 12,410,367 B2
(45) Date of Patent: Sep. 9, 2025

(54) BLUE LUMINESCENT COMPOSITION AND ORGANIC ELECTROLUMINESCENT DEVICE COMPRISING BLUE LUMINESCENT COMPOSITION

(71) Applicant: Shijiazhuang Chengzhi Yonghua Display Material Co., Ltd., Hebei (CN)

(72) Inventors: Zaihao Zheng, Hebei (CN); Pengjun Bu, Hebei (CN); Shiwen Yue, Hebei (CN); Zhicheng Cao, Hebei (CN); Zenglin Zhang, Hebei (CN)

(73) Assignee: SHIJIAZHUANG CHENGZHI YONGHUA DISPLAY MATERIAL CO., LTD., Hebei (CN)

( * ) Notice: Subject to any disclaimer, the term of this patent is extended or adjusted under 35 U.S.C. 154(b) by 19 days.

(21) Appl. No.: 19/053,440

(22) Filed: Feb. 14, 2025

(65) Prior Publication Data
US 2025/0188345 A1    Jun. 12, 2025

(30) Foreign Application Priority Data
Oct. 30, 2024    (CN) .......................... 202411530515.2

(51) Int. Cl.
| H10K 50/12 | (2023.01) |
| C09K 11/02 | (2006.01) |
| C09K 11/06 | (2006.01) |
| H10K 85/60 | (2023.01) |

(52) U.S. Cl.
CPC .............. *C09K 11/06* (2013.01); *C09K 11/02* (2013.01); *H10K 85/626* (2023.02); H10K 85/6574 (2023.02); *H10K 85/658* (2023.02); *C09K 2211/1007* (2013.01); *C09K 2211/1011* (2013.01); *C09K 2211/1018* (2013.01); *H10K 50/12* (2023.02)

(58) Field of Classification Search
None
See application file for complete search history.

(56) References Cited

U.S. PATENT DOCUMENTS

| 2022/0246864 A1* | 8/2022 | Yoon ................ C07D 307/77 |
| 2022/0310924 A1* | 9/2022 | Joo ...................... H10K 85/322 |
| 2022/0310925 A1* | 9/2022 | Joo ...................... H10K 85/6574 |

FOREIGN PATENT DOCUMENTS

| CN | 118005666 A | 5/2024 |
| CN | 118406486 A | 7/2024 |

OTHER PUBLICATIONS

Dec. 3, 2024, Chinese Office Action issued for related CN Application No. 202411530515.2.
Jan. 8, 2025, Chinese Notification of Granting Patent Right issued for related CN Application No. 202411530515.2.

* cited by examiner

*Primary Examiner* — Robert S Loewe
(74) *Attorney, Agent, or Firm* — Paratus Law Group, PLLC

(57) ABSTRACT

The present invention discloses a blue luminescent composition and an organic electroluminescent device comprising the blue luminescent composition. The blue luminescent composition comprises a host material with a general structural formula as represented by Formula I and a guest material with a general structural formula as represented by Formula II. In the present invention, a composition composed by rational combination of a compound containing a dibenzofuran group and deuterium-substituted anthracene as a host material and a compound containing a cycloalkyl group and a steric hindrance group such as thiophene as a guest material is capable of significantly enhancing the stability and lifetime of a blue-light organic electroluminescent device while enhancing the electron migration and transfer efficiency and eliminating a host luminescence phenomenon.

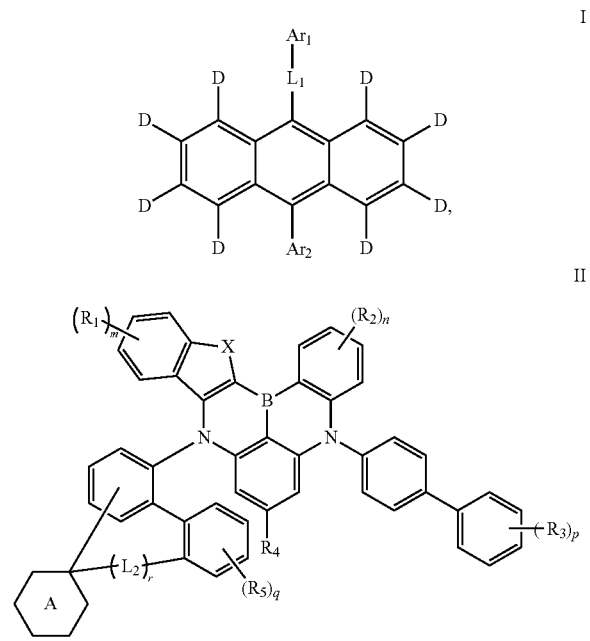

12 Claims, 1 Drawing Sheet

BLUE LUMINESCENT COMPOSITION AND ORGANIC ELECTROLUMINESCENT DEVICE COMPRISING BLUE LUMINESCENT COMPOSITION

CROSS REFERENCE TO PRIOR APPLICATION

This application claims priority to Chinese Patent Application No. 202411530515.2 (filed on Oct. 30, 2024), which is hereby incorporated by reference in its entirety.

TECHNICAL FIELD

The present invention belongs to the technical field of OLEDs and in particular comprises a blue luminescent composition and an organic electroluminescent device comprising the blue luminescent composition.

BACKGROUND ART

In recent years, optoelectronic devices based on organic materials have become more and more popular. Examples of such organic optoelectronic devices include organic light-emitting diodes (OLEDs), organic field effect transistors, organic photovoltaic cells, organic sensors, etc. Among them, OLEDs are developing particularly rapidly and have achieved commercial success in the field of information display. OLEDs can provide red, green, and blue colors with high saturations. Full-color display devices made of OLEDs do not need an additional backlight source and have the advantages of dazzling colors, a short response time, a wide color gamut, a high contrast, etc.

In an OLED blue fluorescent device, a host material and a guest material are used in a combined form, wherein the host material is responsible for the function of carrier transport and recombination to form excitons and transfer of the exciton energy to the guest material, while the guest material emits light in a target wavelength range after receiving the energy transferred from the host material, and sometimes the energy transmission efficiency between the host material and the guest material is improved by further introducing a sensitizer. The energy transmission efficiency varies between different host and guest materials. When the energy transmission between the host material and the guest material is poor, the performance of the device will be reduced. In addition, the energy transmission between the host material and the guest material is also influenced by the interaction between the host material and the guest material. At present, commonly used host materials are mainly anthracene-based primary structures with fused ring structures such as naphthalene being generally used as substituents. Although some deuterium-substituted host material structures have been reported, the comprehensive performance of the device has not been actually significantly improved due to the selection of substitution positions, and in terms of the combination of the host material and guest material, the interaction between the host material and the guest material is also not fully exploited to achieve a better functionality.

In addition, after a problem of poor energy transmission occurs between the host and guest materials, deep blue light also appears in the range of 410-430 nm, that is, a "host luminescence" phenomenon occurs, as shown in FIG. 2 (the Y axis is a logarithmic coordinate axis with a numerical range of 0.01 to 1). The generation of deep blue light causes damage to human eyes and greatly reduces the efficiency of the device, which is also another problem that needs to be solved urgently at present in organic electroluminescent devices.

Therefore, it is very necessary to adjust the structural configuration of the host material and the guest material and promote the rational combination thereof to improve the performance of an organic luminescent device.

SUMMARY OF THE INVENTION

In view of the above problems existing in the prior art, the present invention provides a blue luminescent composition and an organic electroluminescent device comprising the blue luminescent composition.

In order to achieve the above objective, the technical solution used by the present invention comprises the following content:

In a first aspect, the present invention provides a blue luminescent composition comprising a compound with a general structural formula as represented by Formula I and a compound with a general structural formula as represented by Formula II:

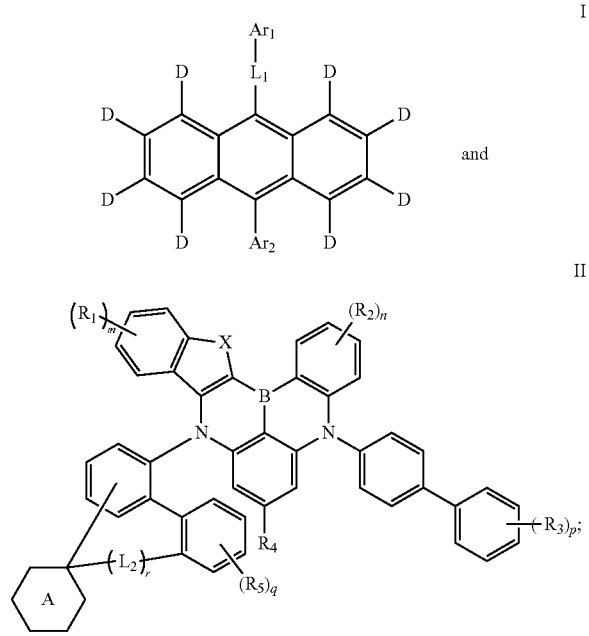

wherein Formula I,
Ar$_1$ represents one of a deuterium-substituted or unsubstituted phenyl group, a deuterium-substituted or unsubstituted naphthyl group, a deuterium-substituted or unsubstituted phenanthryl group, and a deuterium-substituted or unsubstituted pyrenyl group;
L$_1$ represents one of a single bond, a deuterium-substituted or unsubstituted phenylene group, and a deuterium-substituted or unsubstituted naphthylene group;

Ar$_2$ represents

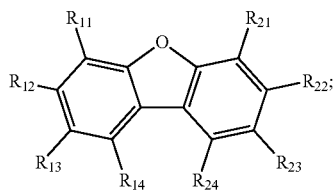

R$_{11}$ to R$_{14}$ and R$_{21}$ to R$_{24}$ each independently represent hydrogen or deuterium;
any one of R$_{11}$ to R$_{14}$ and R$_{21}$ to R$_{24}$ is bonded to the anthracene structure in Formula I; and
when any one of R$_{11}$ to R$_{14}$ is selected from deuterium, none of R$_{21}$ to R$_{24}$ is selected from deuterium; when none of R$_{11}$ to R$_{14}$ is selected from deuterium, at least one of R$_{21}$ to R$_{24}$ is selected from deuterium; and when any one of R$_{11}$ to R$_{14}$ and R$_{21}$ to R$_{24}$ is selected from deuterium, hydrogens in the same benzene ring to which the deuterium belongs are all replaced by deuterium; and
in Formula II,
ring A represents a substituted or unsubstituted cycloalkyl group with a carbon atom number of 3 to 10; and L$_2$ represents a single bond;
R$_1$, R$_2$, R$_3$, and R$_5$ each independently represent any one of hydrogen, deuterium, halogen, a substituted or unsubstituted alkyl group with a carbon atom number of 1 to 30, a substituted or unsubstituted alkenyl group with a carbon atom number of 2 to 30, a substituted or unsubstituted cycloalkyl group with a carbon atom number of 3 to 30, a substituted or unsubstituted aryl group with a carbon atom number of 6 to 60, a substituted or unsubstituted heteroaryl group with a carbon atom number of 5 to 60, a substituted or unsubstituted fused cyclic aryl group with a carbon atom number of to 60, a substituted or unsubstituted fused cyclic heteroaryl group with a carbon atom number of 5 to 60, and a substituted or unsubstituted amino group; two or more of R$_1$, R$_2$, R$_3$, and R$_5$ can be connected to each other to form a cyclic structure;
R$_4$ represents any one of hydrogen, deuterium, halogen, a substituted or unsubstituted alkyl group with a carbon atom number of 1 to 30, a substituted or unsubstituted alkoxy group with a carbon atom number of 1 to 30, a substituted or unsubstituted cycloalkyl group with a carbon atom number of 3 to 30, a substituted or unsubstituted aryl group with a carbon atom number of 6 to 60, a substituted or unsubstituted heteroaryl group with a carbon atom number of 5 to 60, a substituted or unsubstituted fused cyclic aryl with a carbon atom number of 5 to 60, a substituted or unsubstituted fused cyclic heteroaryl with a carbon atom number of 5 to 60, and a substituted or unsubstituted amino group; 15
X represents O or S;
m, n, and q each independently represent 0, 1, 2, 3, or 4; when m represents 2, 3, or 4, R$_1$ can be the same or different; when n represents 2, 3, or 4, R$_2$ can be the same or different; and when q represents 2, 3, or 4, R$_5$ can be the same or different;
p represents 0, 1, 2, 3, 4, or 5; and when p represents 2, 3, 4, or 5, R$_3$ can be the same or different;
r represents 0 or 1;
substituents in ring A, R$_1$, R$_2$, R$_3$, R$_4$, and R$_5$ can be the same or different and are each independently selected from one of deuterium, halogen, cyano, an alkyl group with a carbon atom number of 1 to 10, an aryl group with a carbon atom number of 6 to 60, a heteroaryl group with a carbon atom number of 5 to 60, a fused cyclic aryl group with a carbon atom number of 5 to 60, a cycloalkyl group with a carbon atom number of 3 to 30, and amino, wherein two or more of the substituents can be connected to each other to form an aliphatic ring, an aromatic ring, or a fused ring; and
in Formulas I and II, any hydrogen can be replaced by deuterium, any nitrogen can be replaced by 15N, any sulfur can be replaced by 33S, 34S, or 36S, any oxygen can be replaced by 17O or 18O, any carbon can be replaced by 13C, and any boron can be replaced by 11B.

Furthermore, when L$_1$ represents a single bond, Ar$_1$ represents one of a deuterium-substituted or unsubstituted phenyl group, a deuterium-substituted or unsubstituted naphthyl group, a deuterium-substituted or unsubstituted phenanthryl group, and a deuterium-substituted or unsubstituted pyrenyl group;

when L$_1$ represents phenylene, Ar$_1$ represents phenyl or naphthyl;

when L$_1$ represents a deuterium-substituted phenylene group, Ar$_1$ represents a deuterium-substituted phenyl group or a deuterium-substituted naphthyl group;

when L$_1$ represents naphthylene, Ar$_1$ represents phenyl; and when L$_1$ represents a deuterium-substituted naphthylene group, Ar$_1$ represents a deuterium-substituted phenyl group.

Furthermore, Ar$_2$ is selected from one of structures represented by Formulas A-1 to A-8 below:

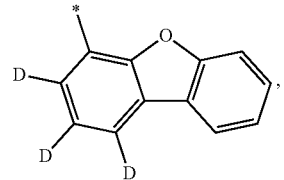

A-1

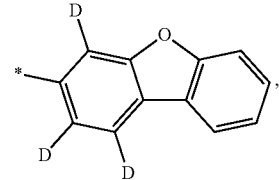

A-2

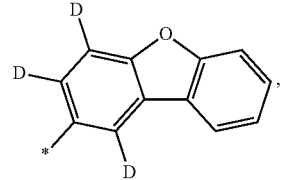

A-3

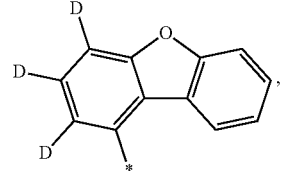

A-4

-continued

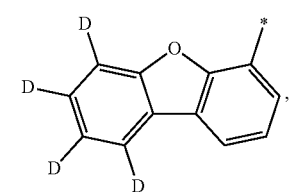
A-5

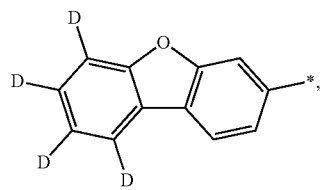
A-6

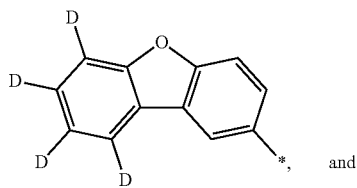
A-7, and

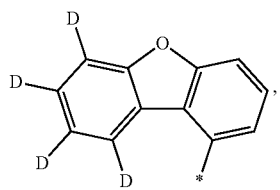
A-8 wherein

\* represents a site at which Ar₂ is bonded to the anthracene structure in Formula I.

Furthermore, the compound represented by Formula II is selected from any one of Formulas II-1 to II-4:

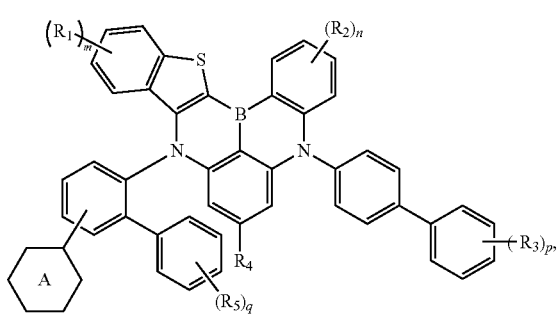
II-1

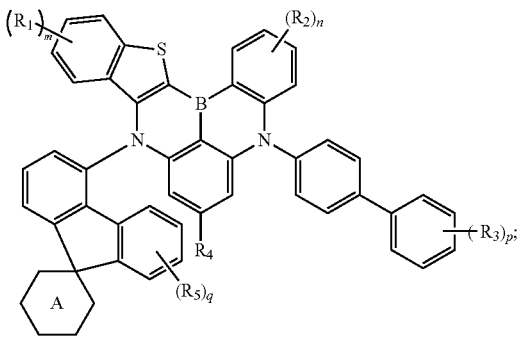
II-2

II-3

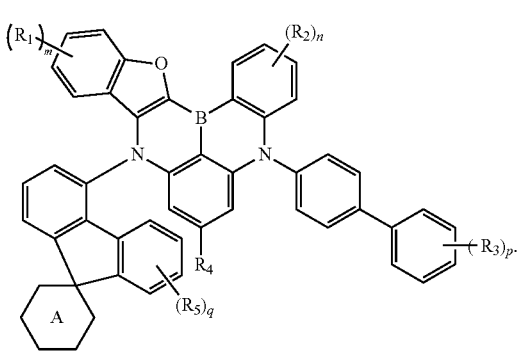
and

II-4

Furthermore, $R_1$, $R_2$, $R_3$, and $R_5$ each independently represent hydrogen, deuterium, a substituted or unsubstituted alkyl group with a carbon atom number of 1 to 10, a substituted or unsubstituted alkenyl group with a carbon atom number of 2 to 10, a substituted or unsubstituted cycloalkyl group with a carbon atom number of 3 to 10, and a substituted or unsubstituted aryl group with a carbon atom number of 6 to 12, wherein two or more of $R_1$, $R_2$, $R_3$, and $R_5$ can be connected to each other to form a cyclic structure;

$R_4$ represents hydrogen, deuterium, a substituted or unsubstituted alkyl group with a carbon atom number of 1 to 10, a substituted or unsubstituted cycloalkyl group with a carbon atom number of 3 to 10, and a substituted or unsubstituted aryl group with a carbon atom number of 6 to 12; and substituents in ring A, $R_1$, $R_2$, $R_3$, $R_4$, and $R_5$ can be the same or different and are each independently selected from deuterium and an alkyl group with a carbon atom number of 1 to 10.

Furthermore, the cycloalkyl group represents cyclohexyl or cyclopentyl.
Furthermore, m, n, p, and q each independently represent 0, 1, or 2.
Furthermore, the compound represented by Formula I is selected from any one of the following compounds:
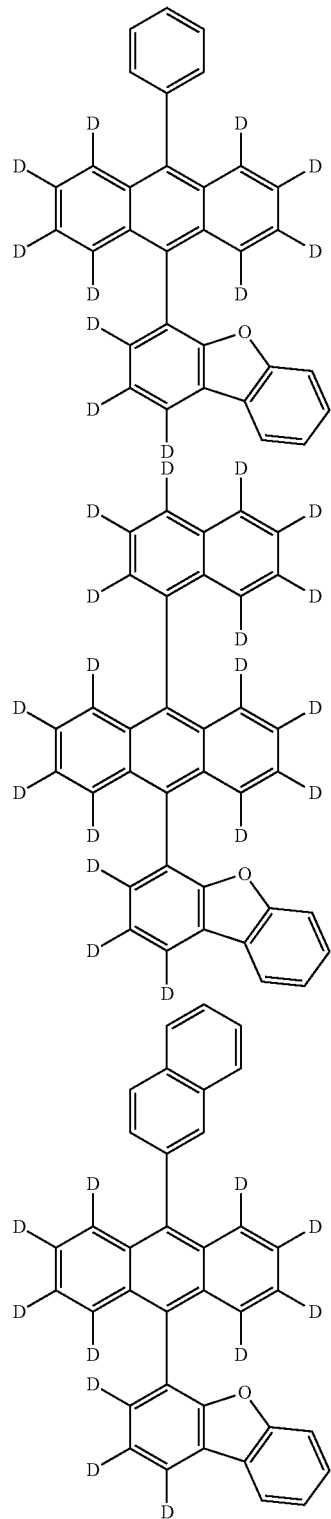
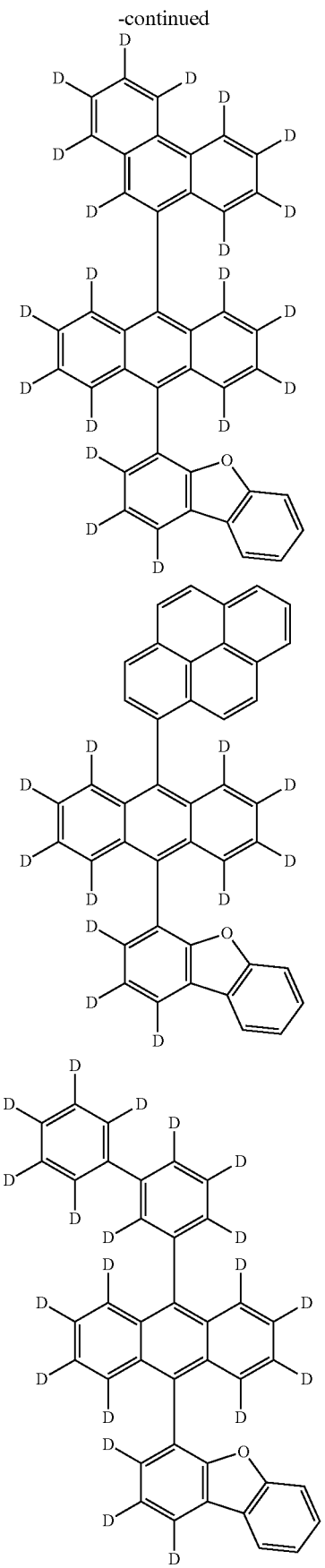

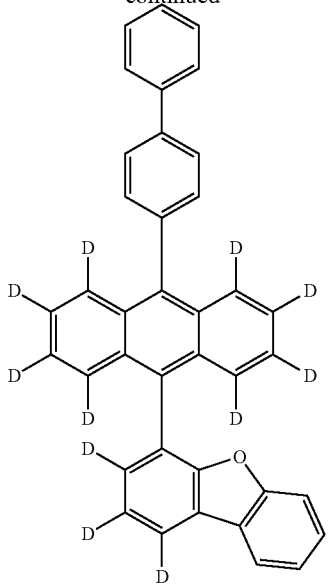
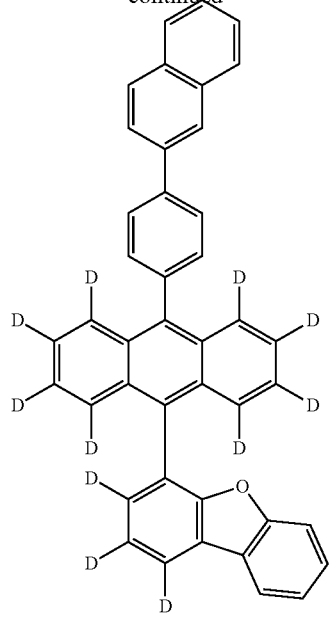
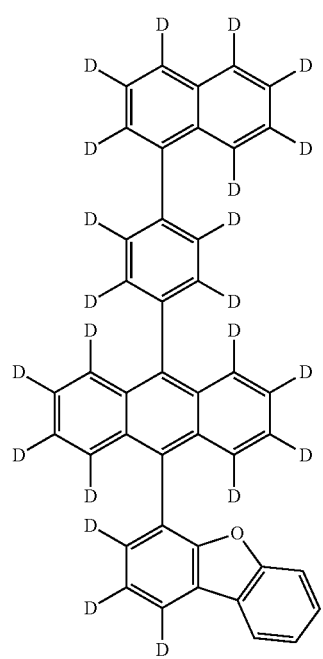
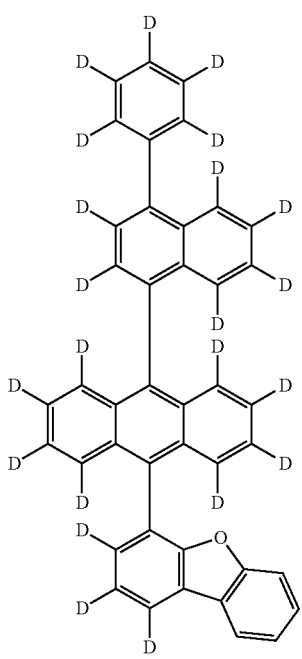

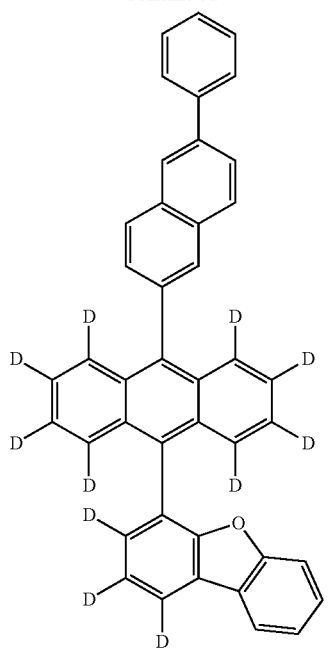
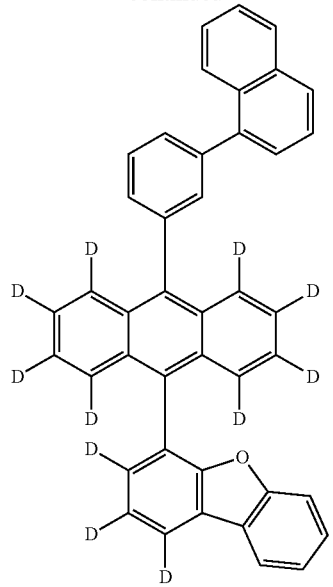
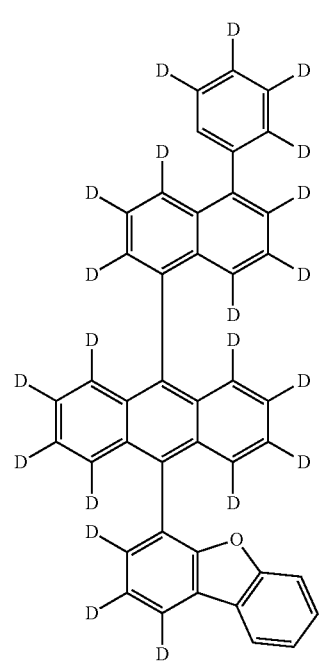
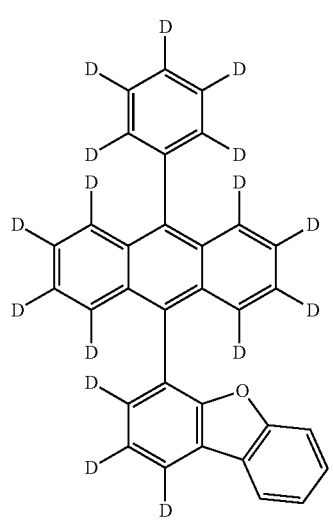

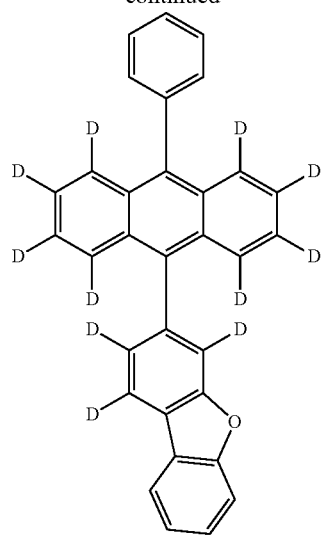
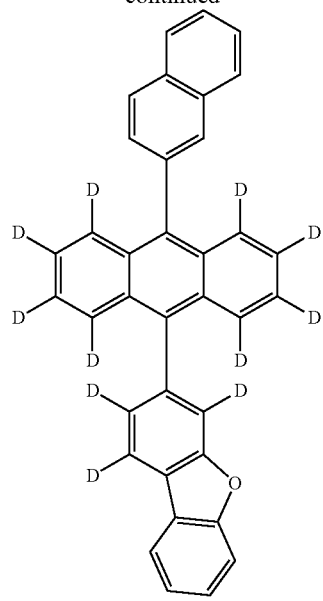

-continued
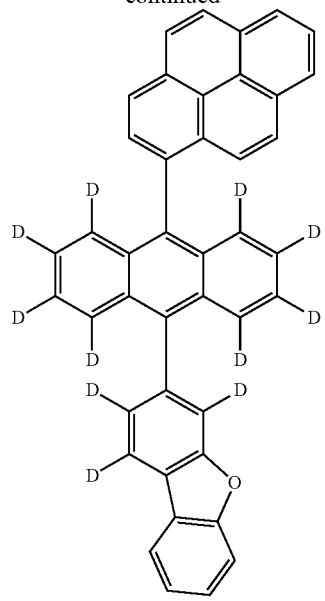
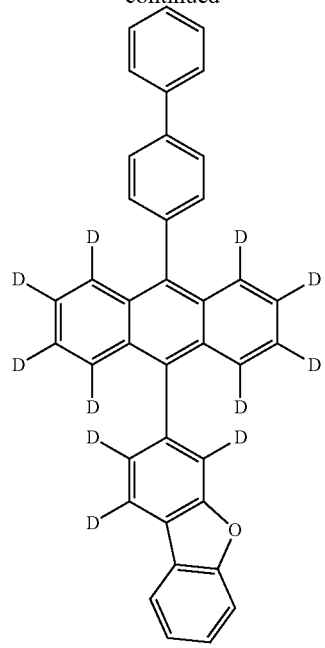
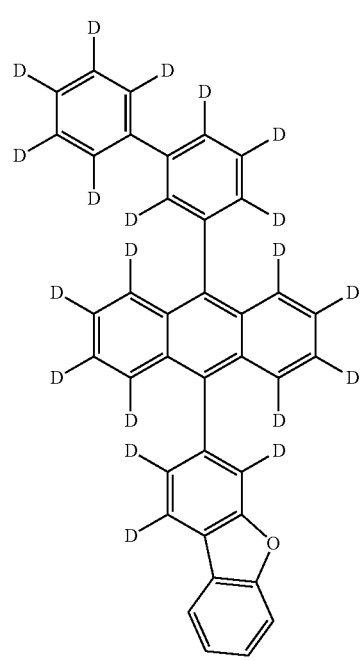
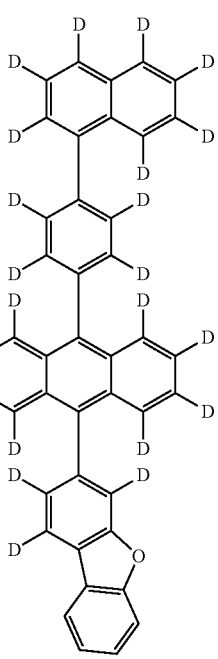
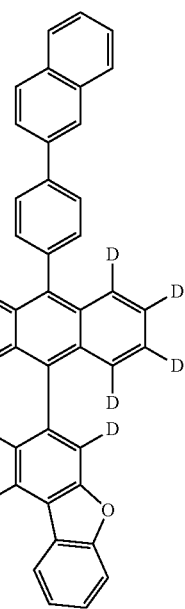

17
-continued
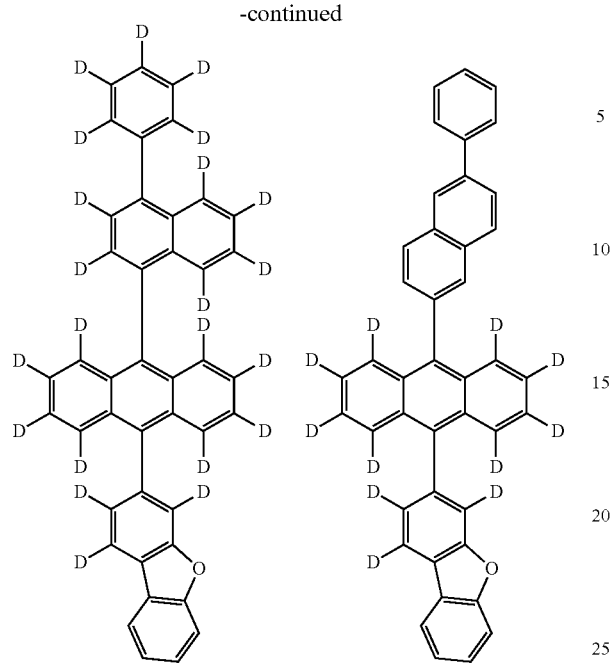
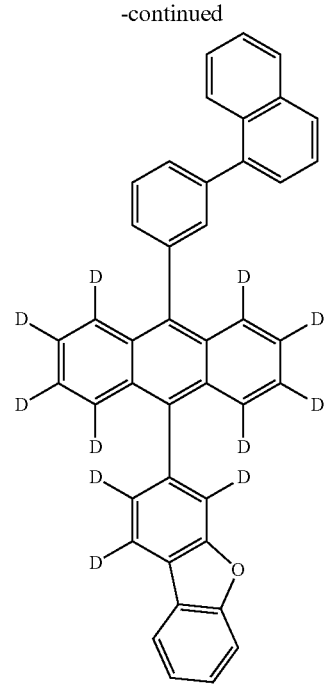
18
-continued
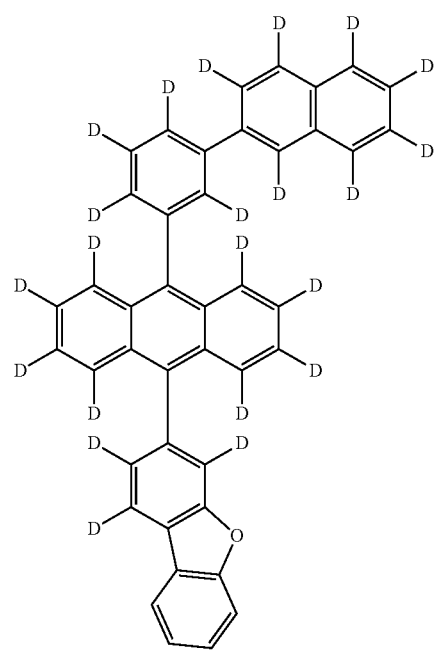
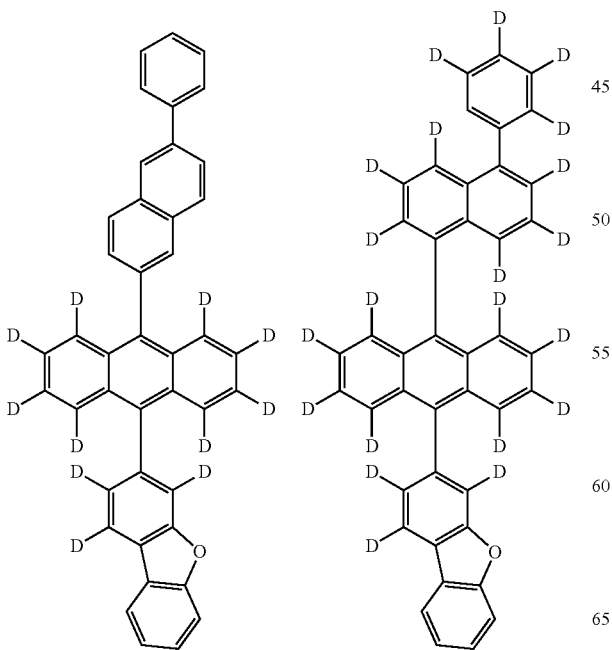

-continued
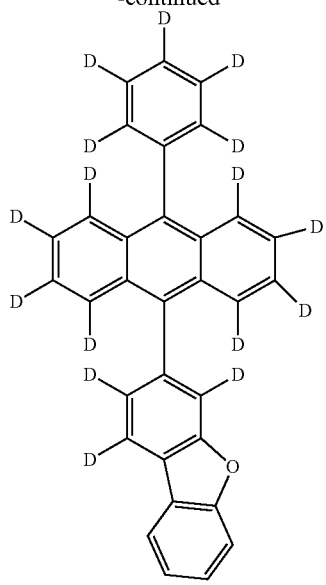
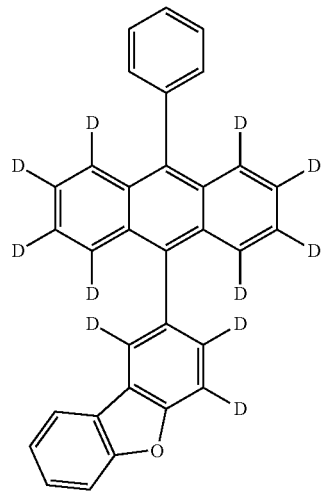
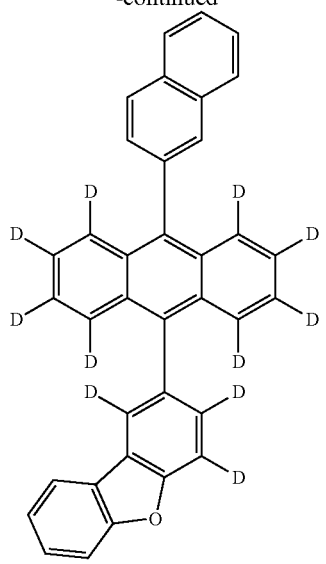
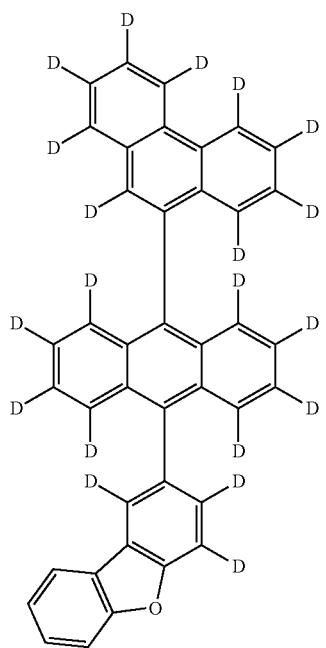

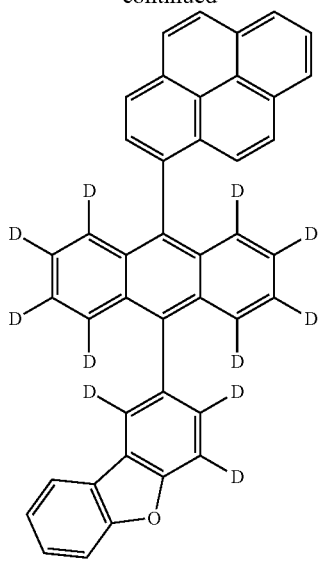
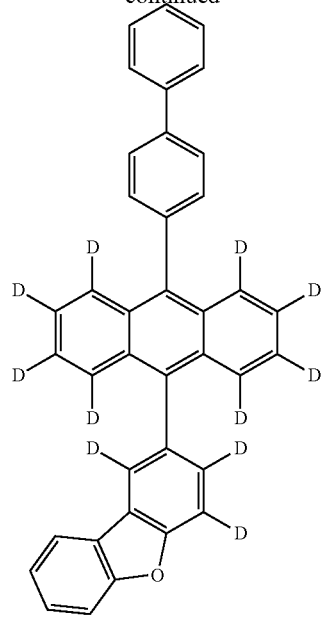
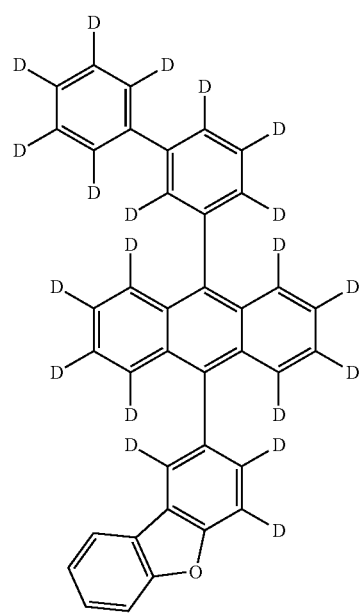
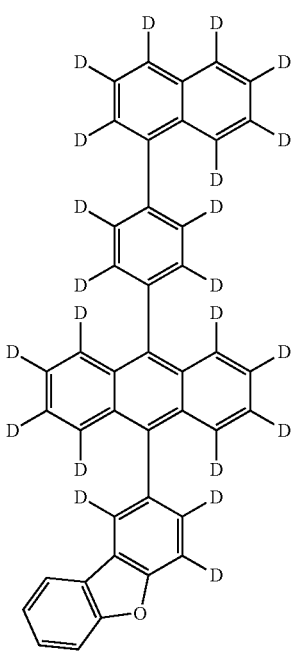

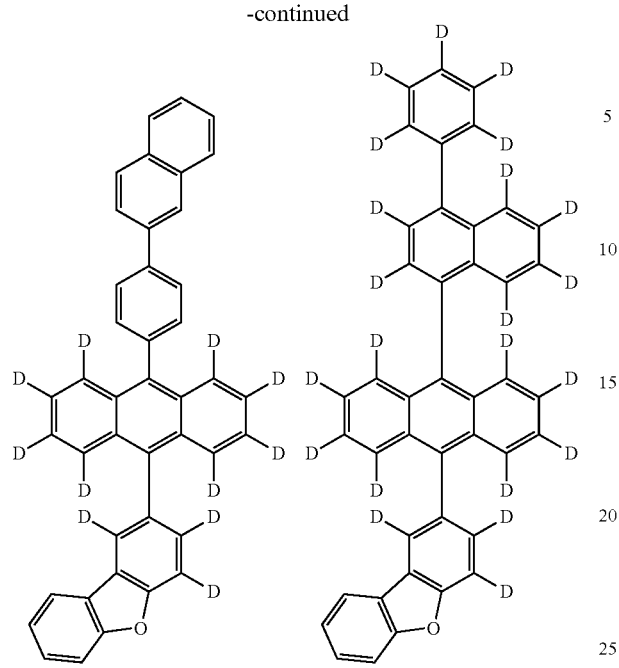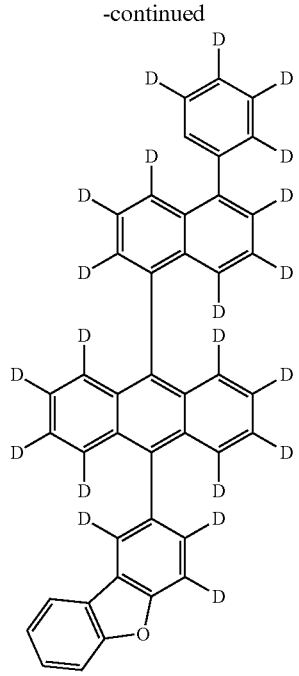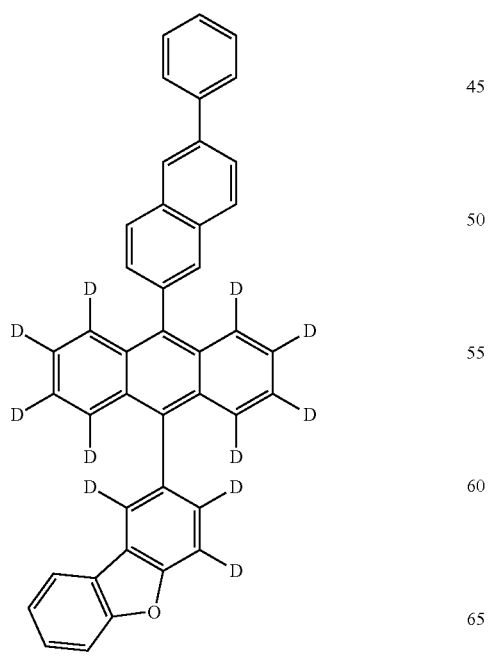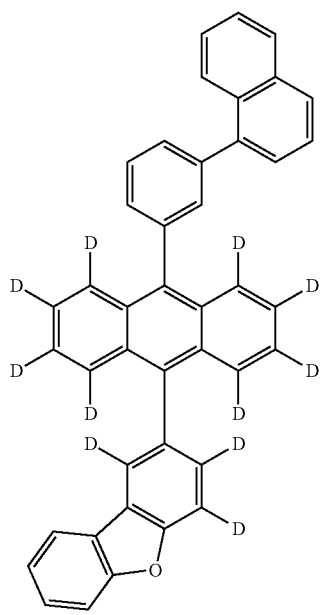

-continued
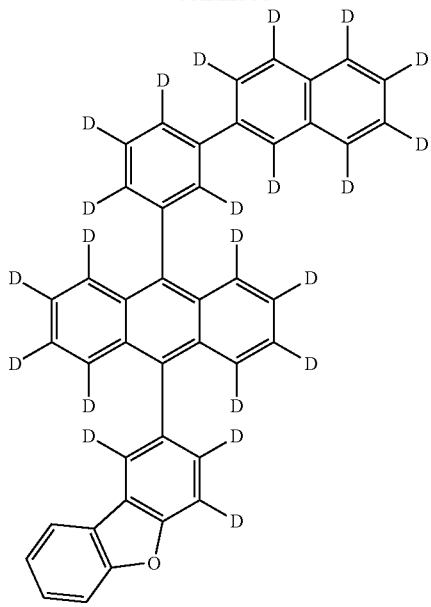
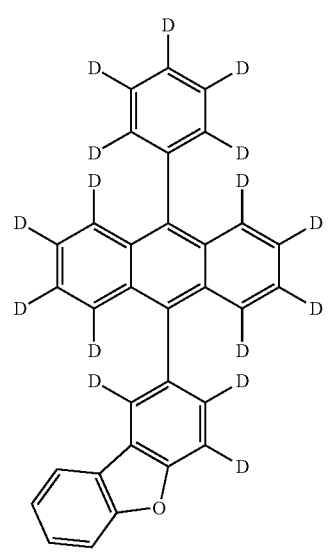
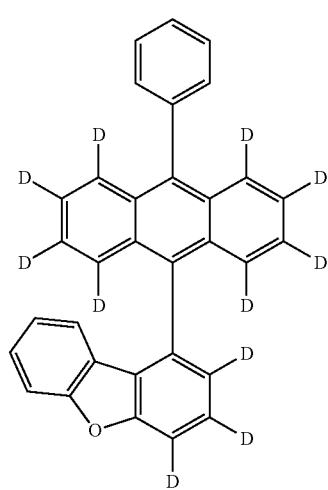
-continued
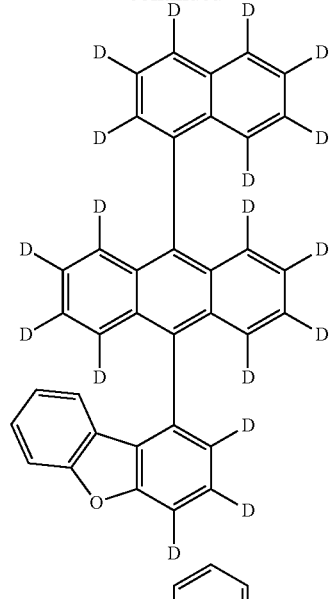
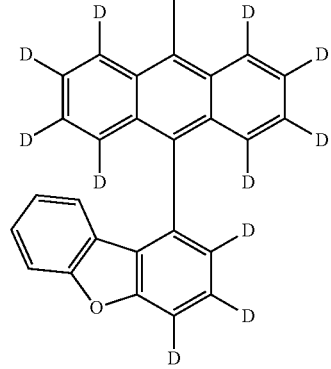
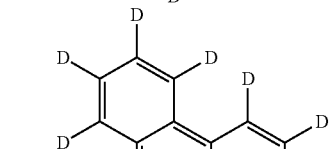
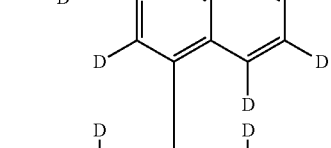
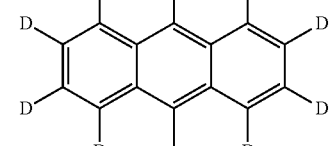
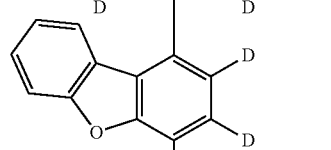

-continued
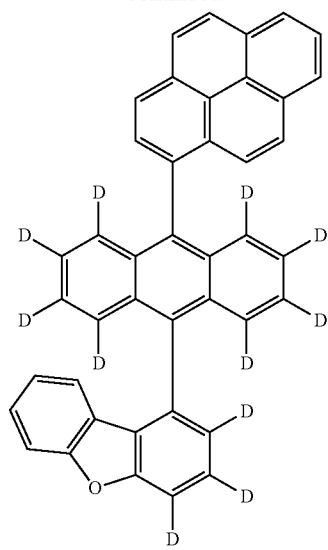
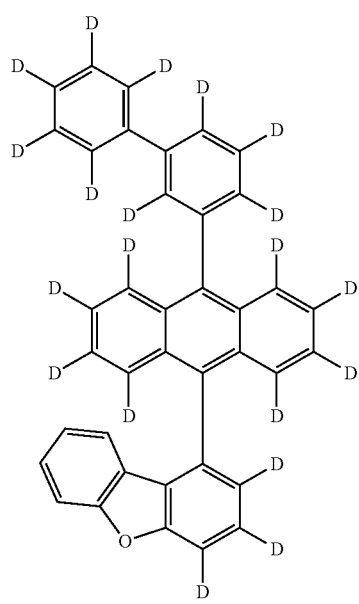
-continued
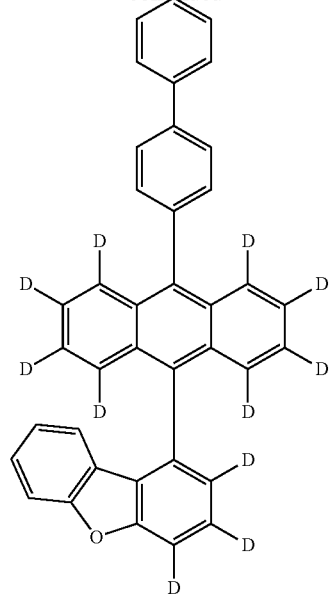
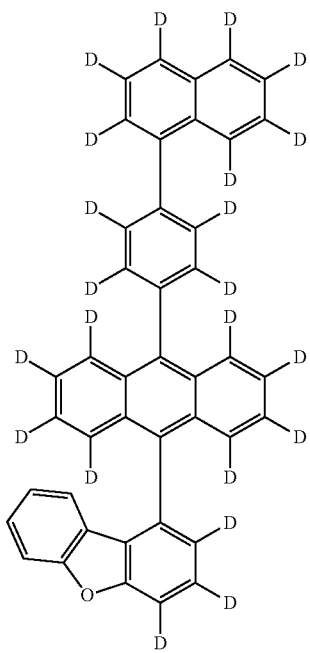

-continued
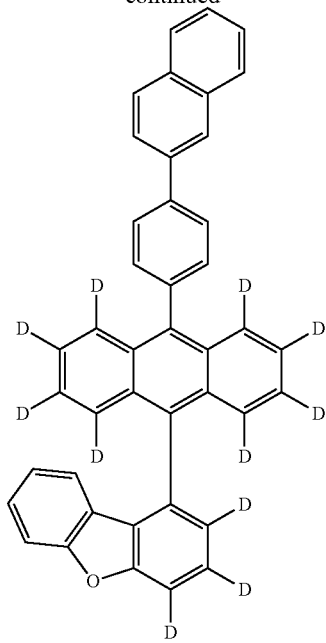
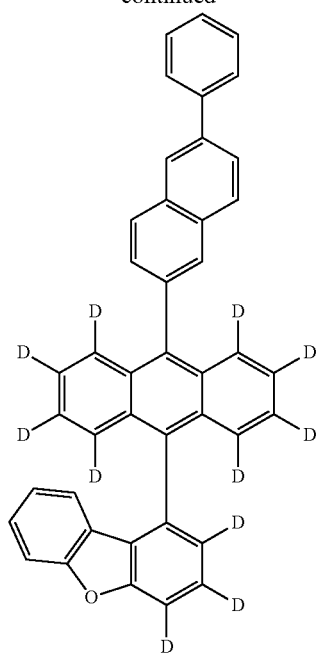
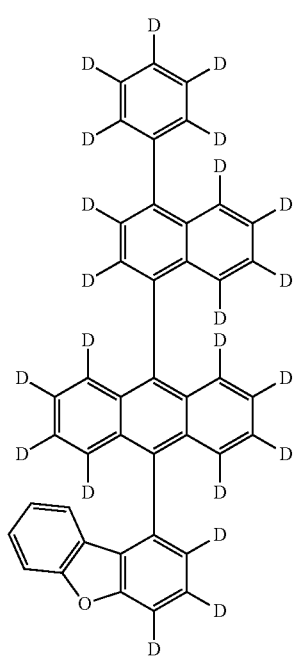
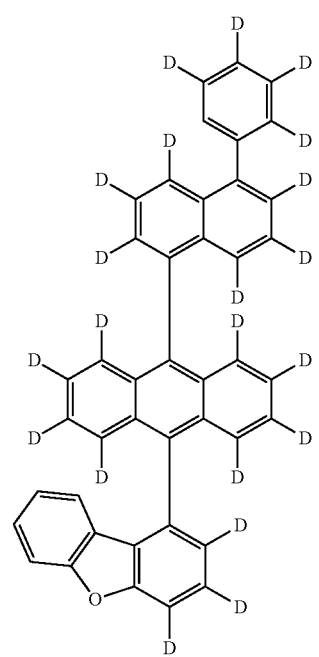

-continued
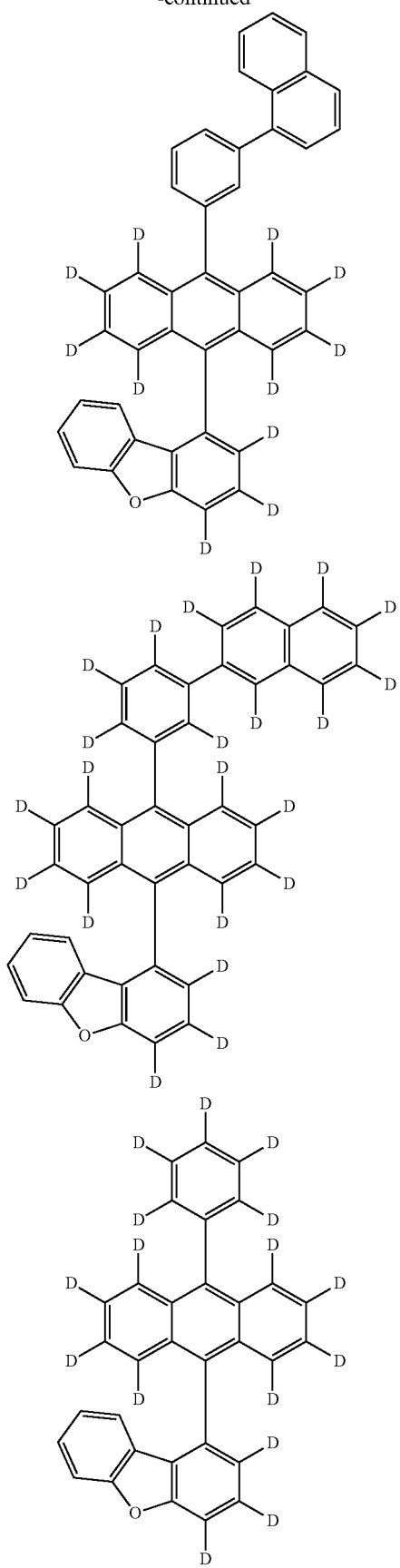
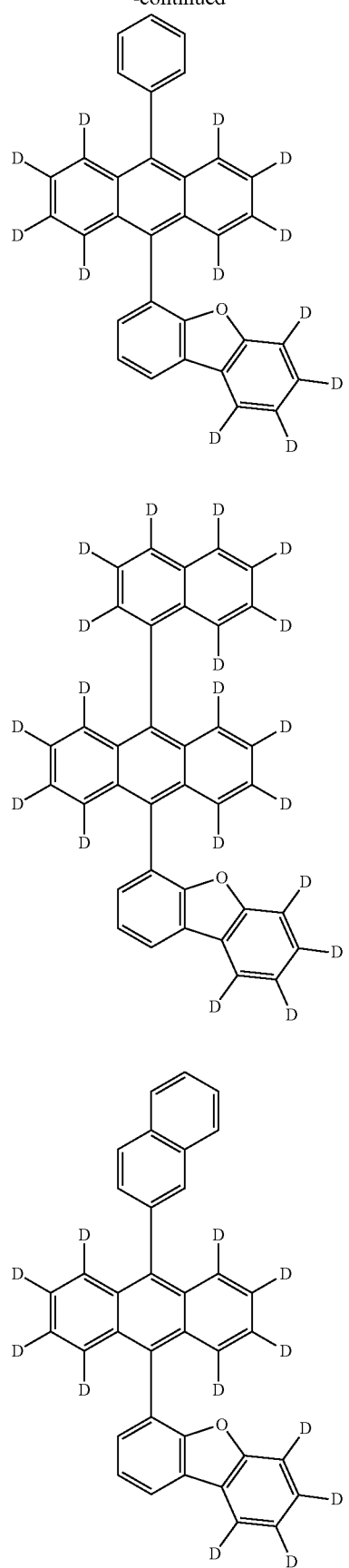

33
-continued
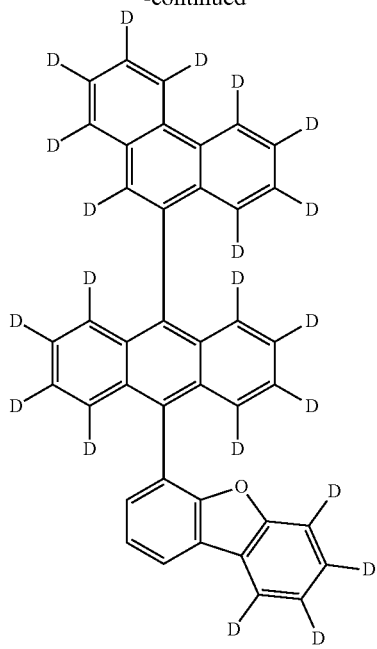
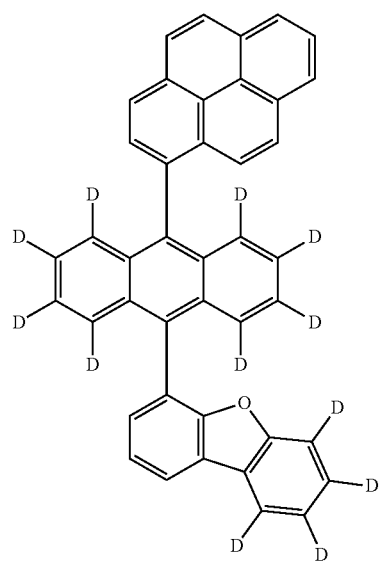
34
-continued
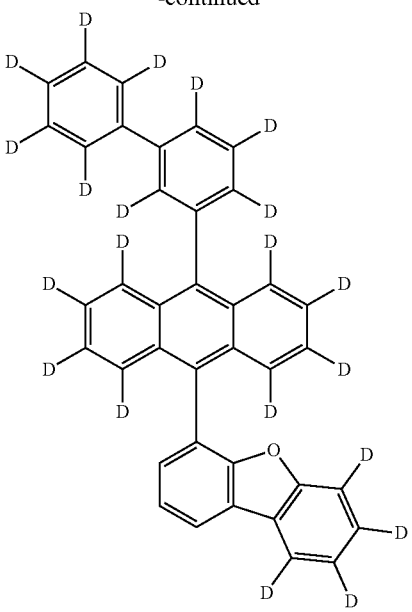
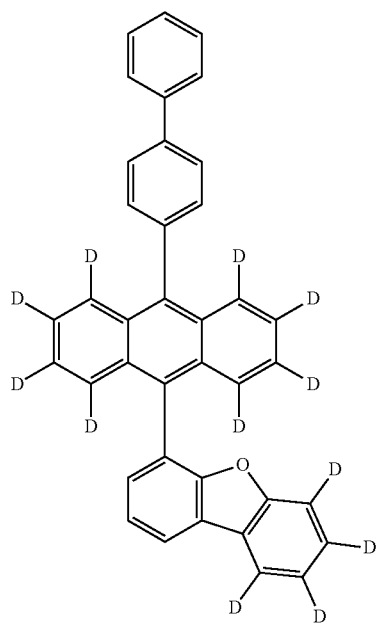

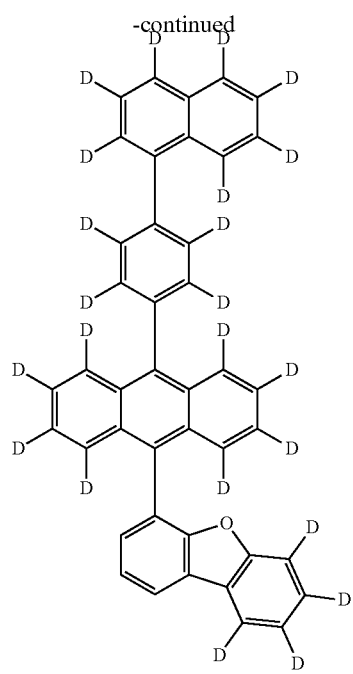
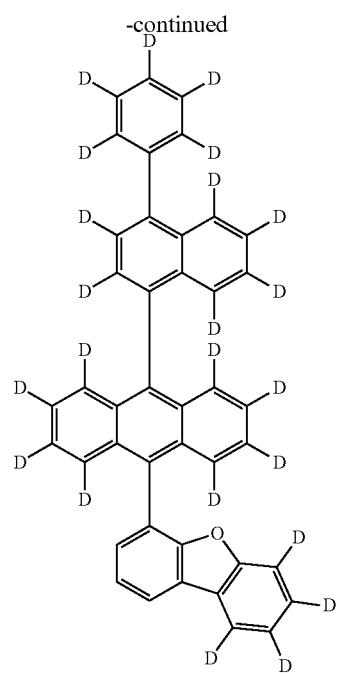
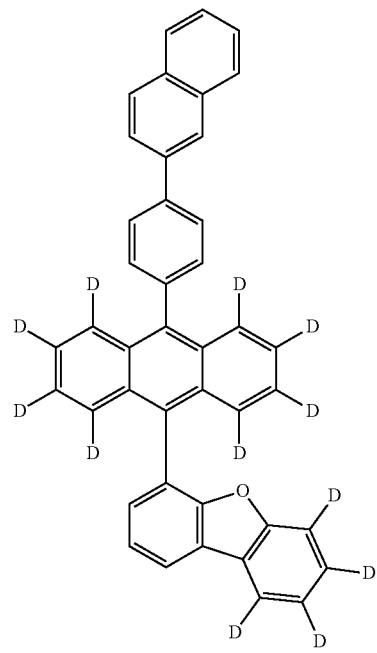
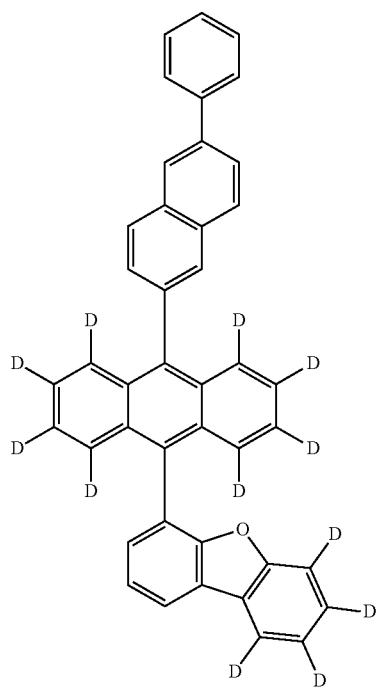

37
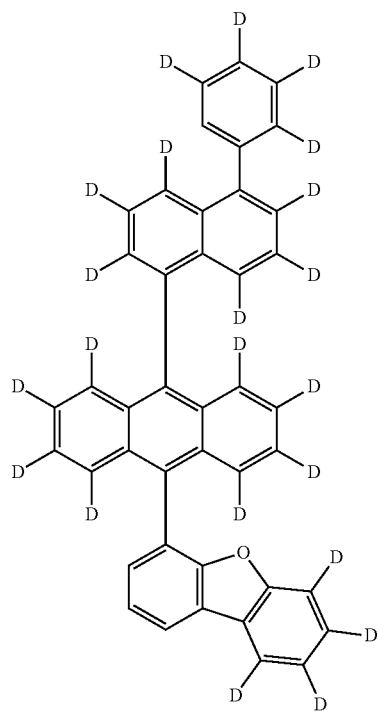
38
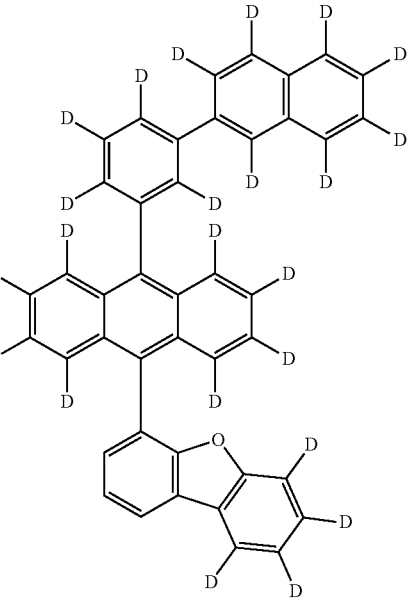
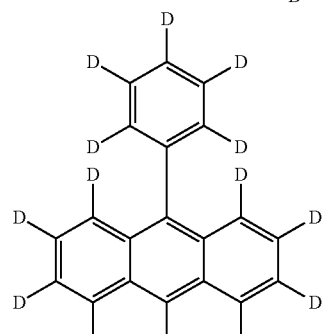
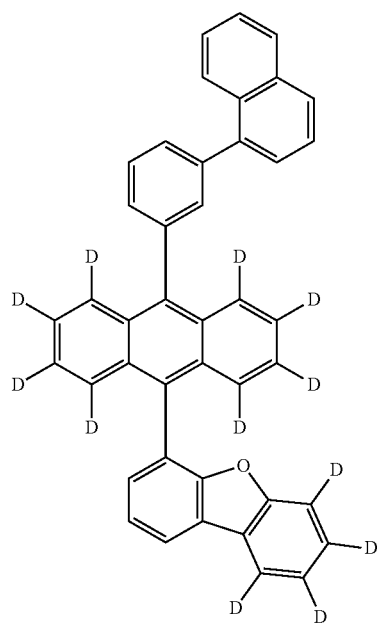
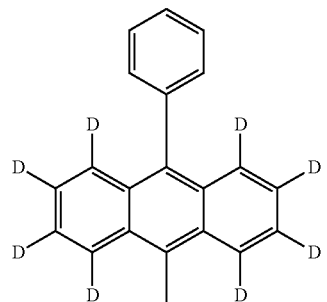

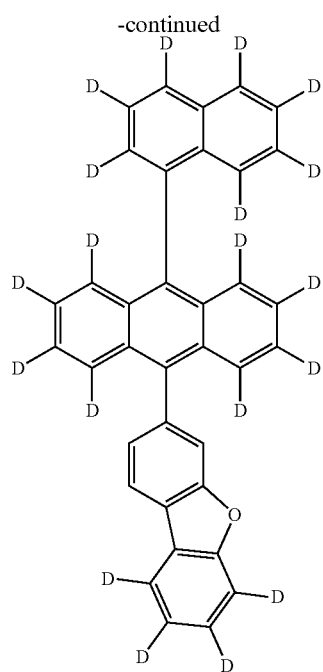
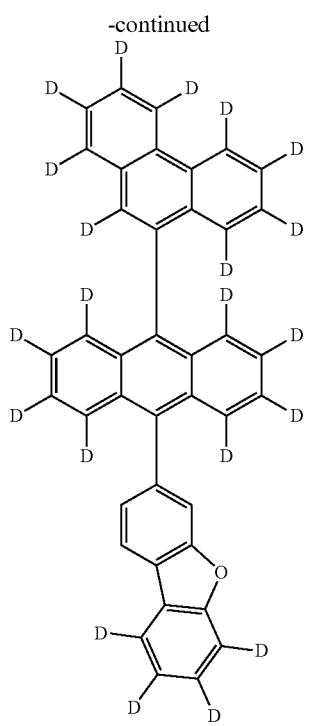
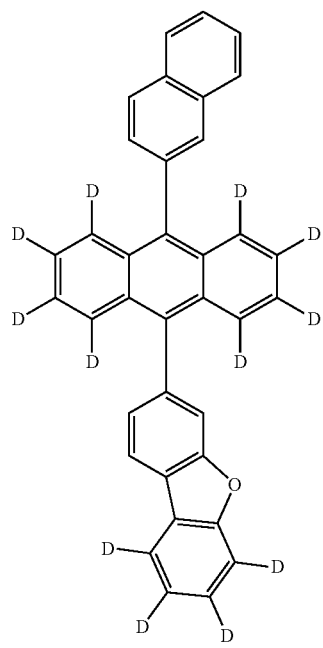
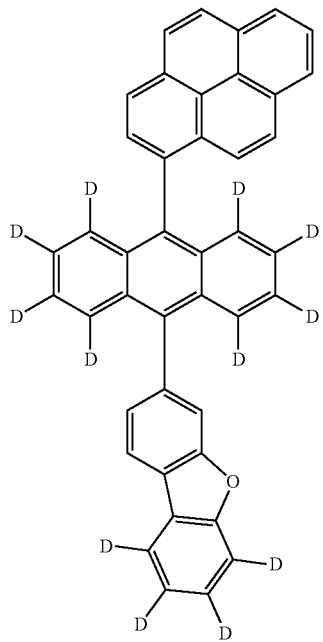

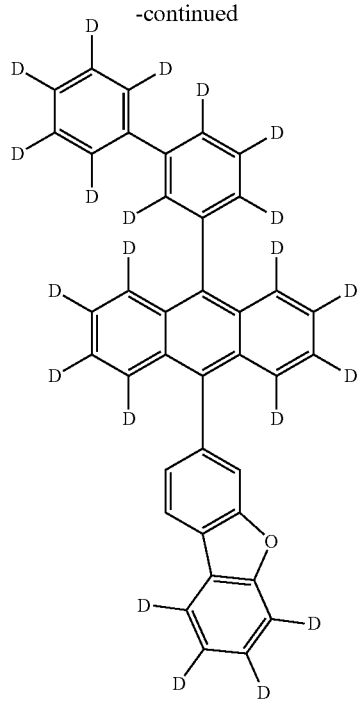
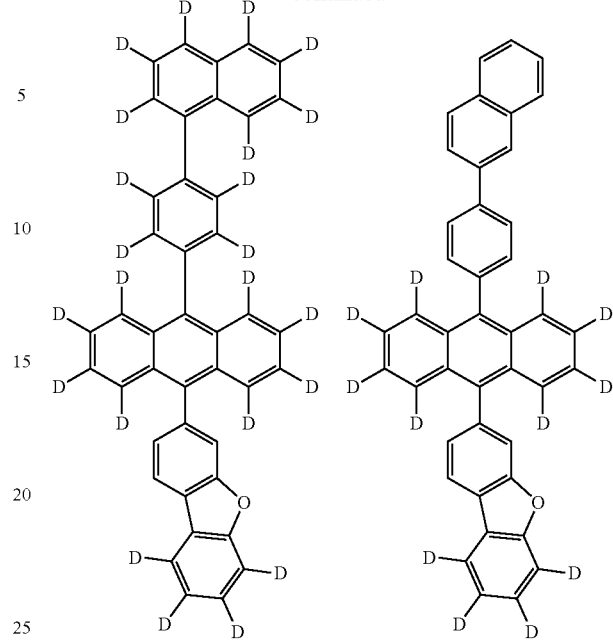
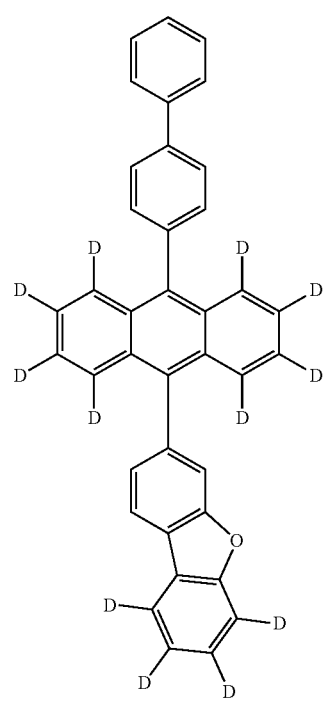
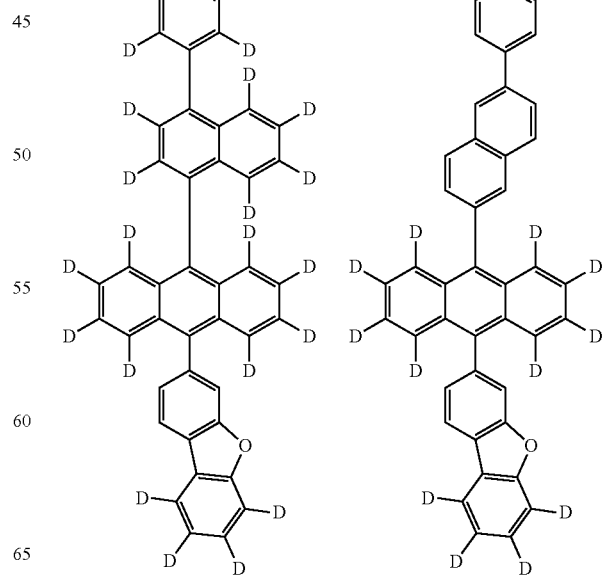

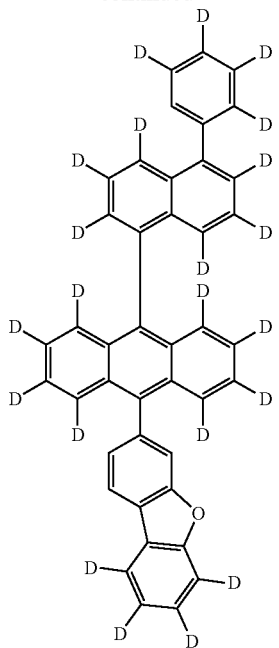
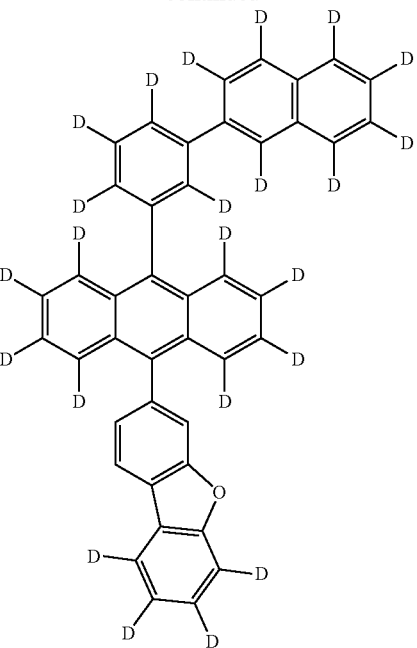
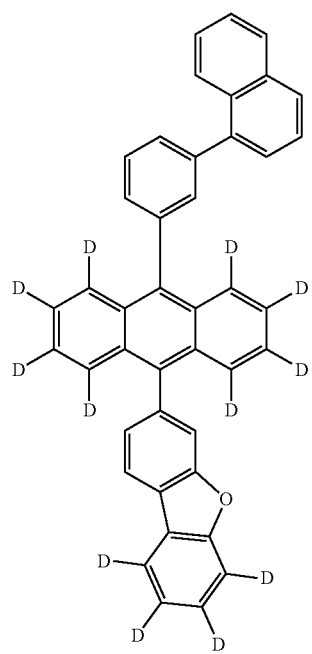
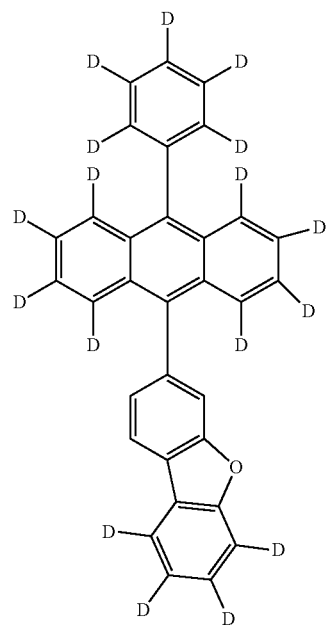

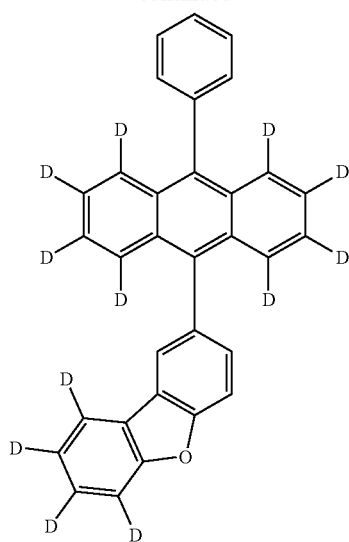
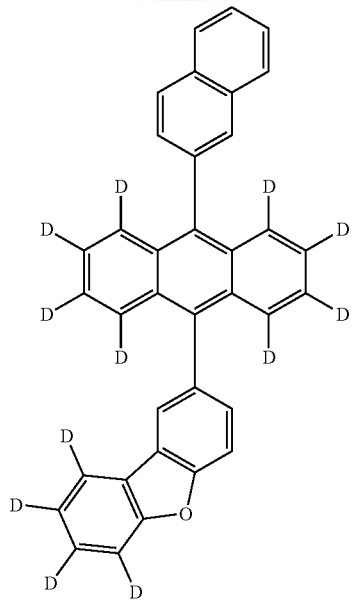

-continued
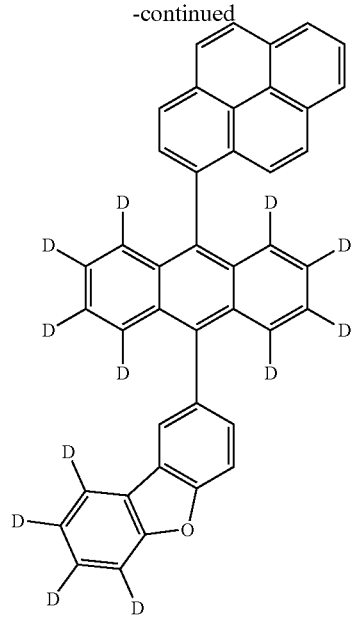
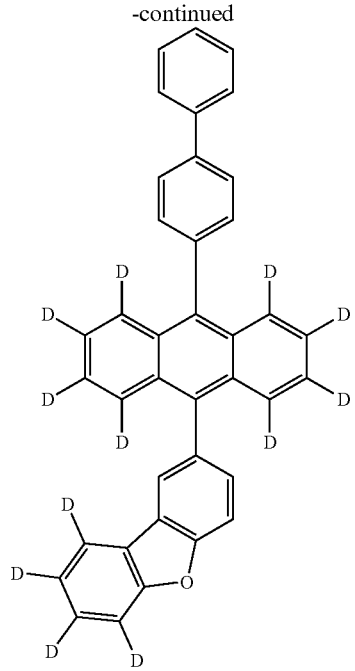
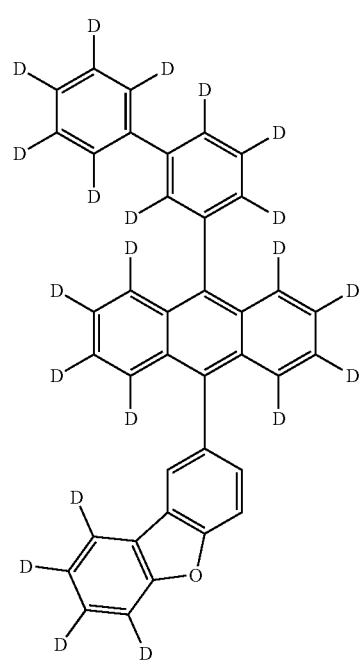
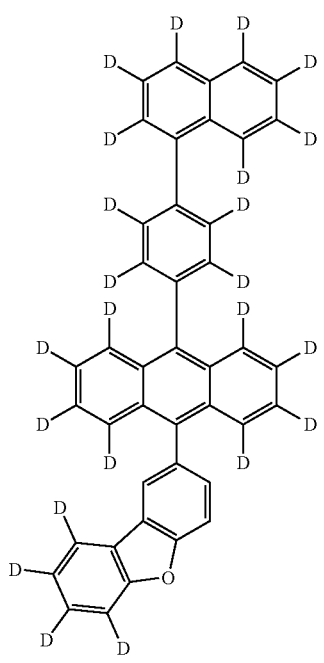

49
-continued
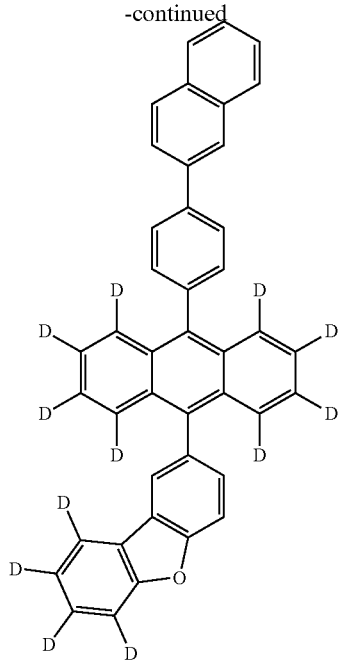
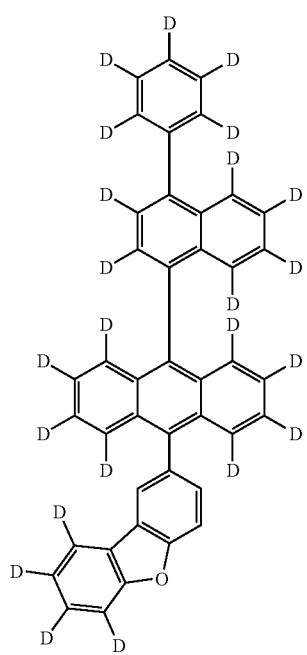
50
-continued
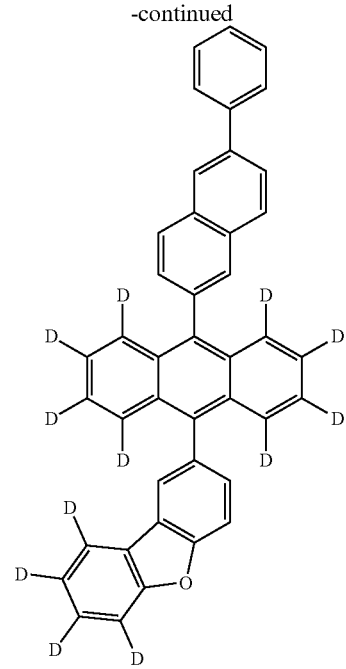
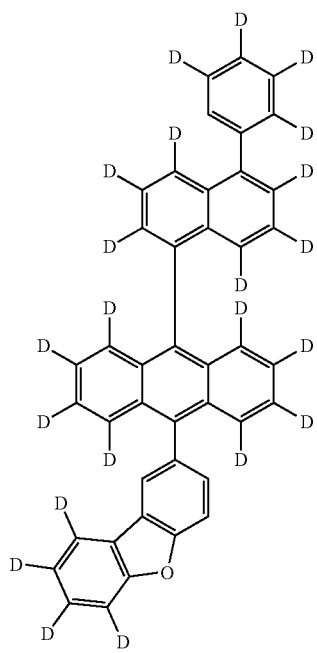

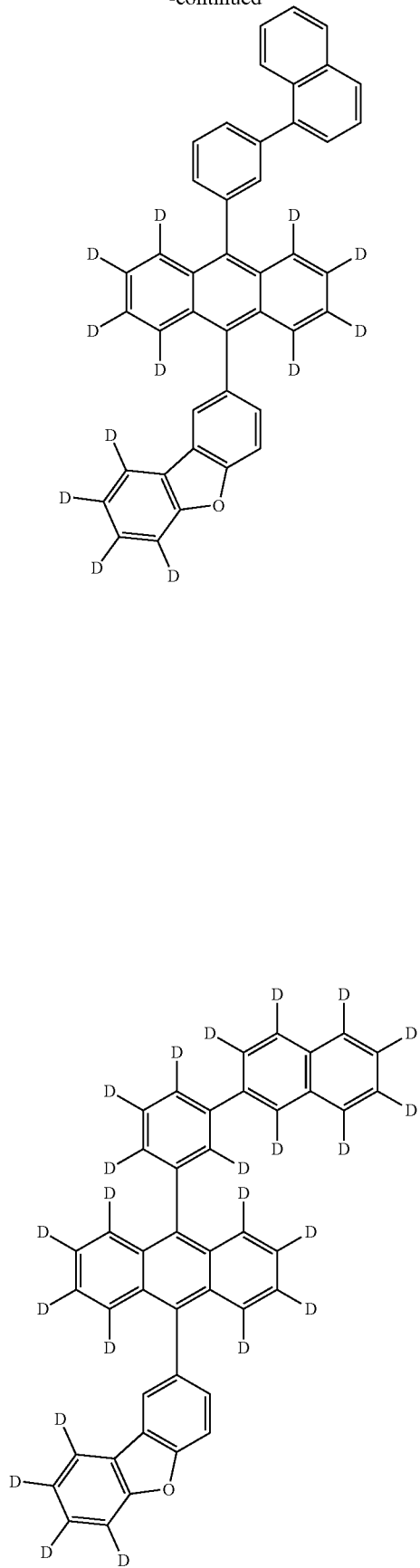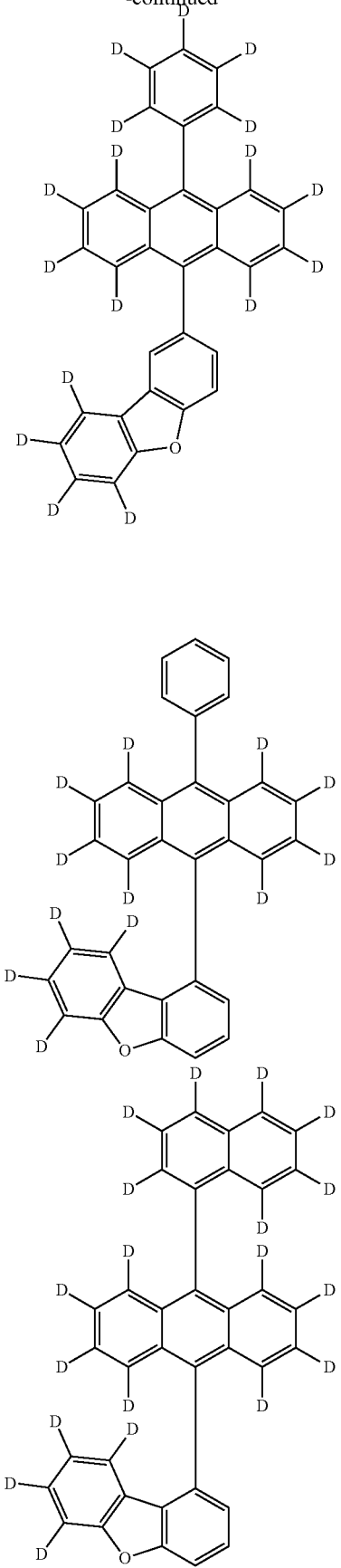

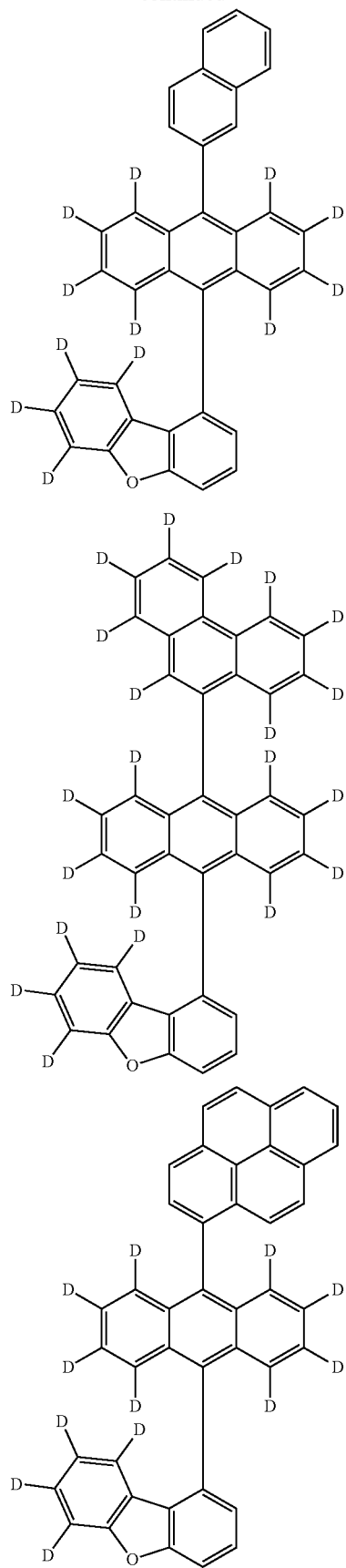

-continued
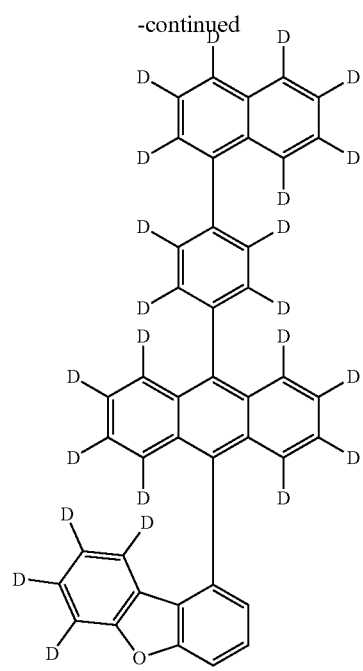
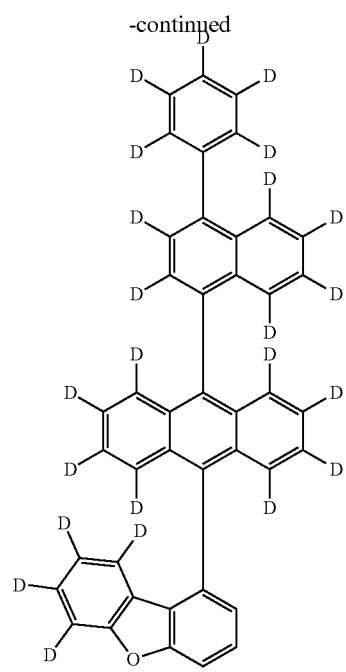
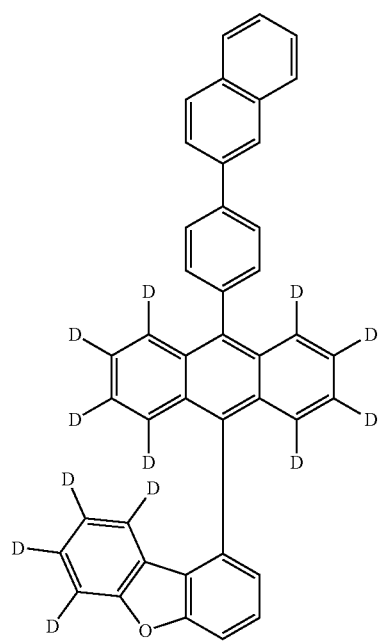
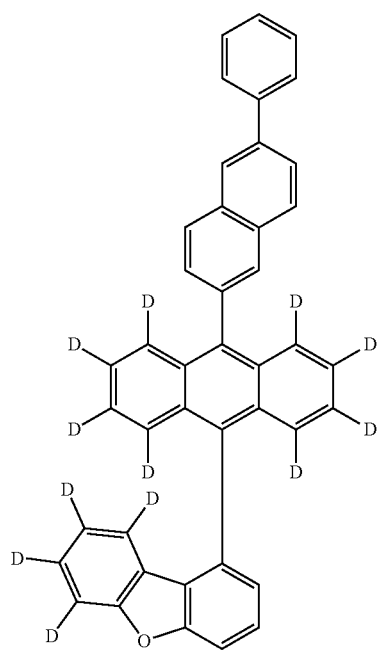

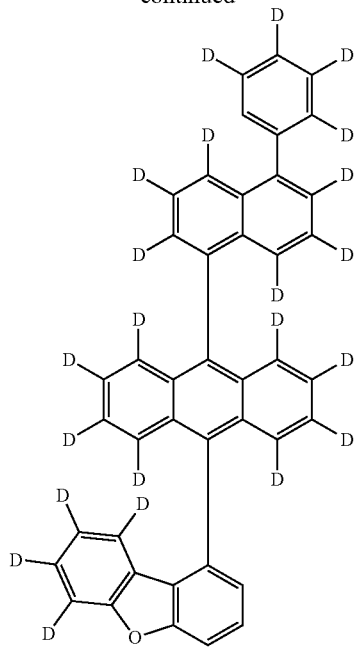
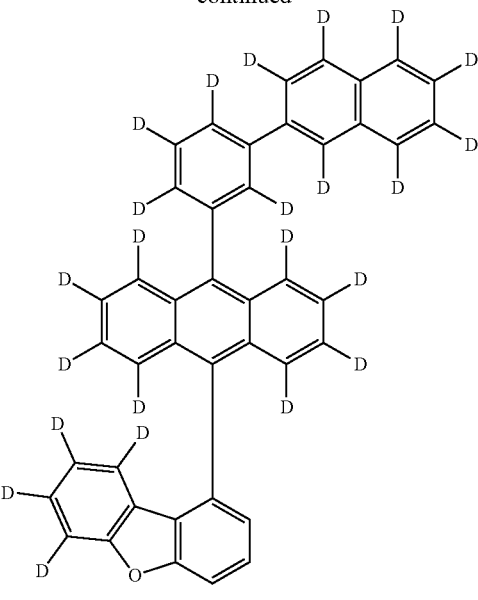
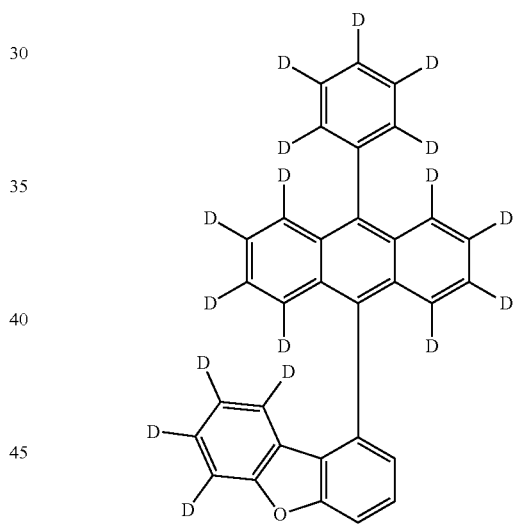
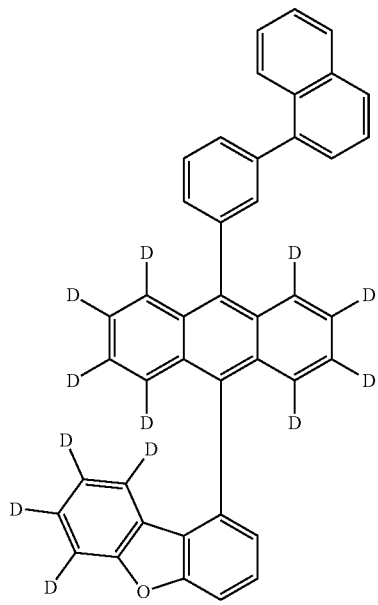
Furthermore, the compound represented by Formula II is selected from any one of the following compounds:
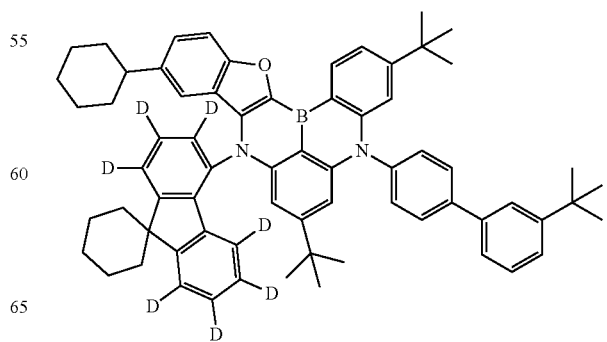

| 59 -continued | 60 -continued |
|---|---|
| 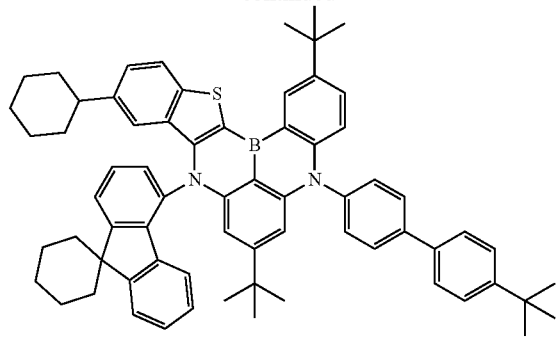 | 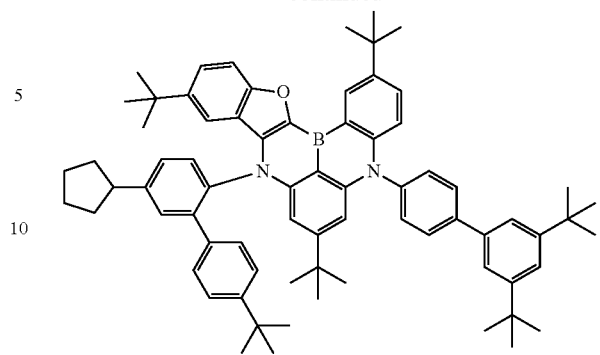 |
| 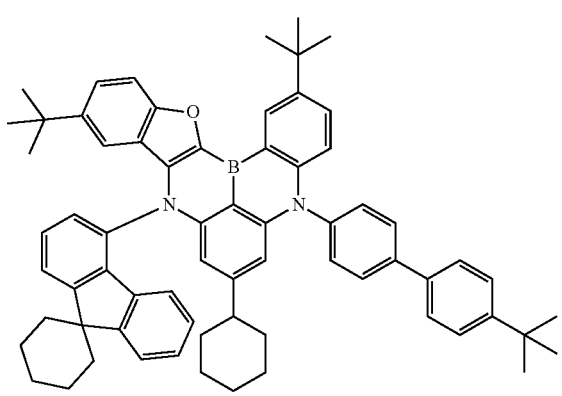 | 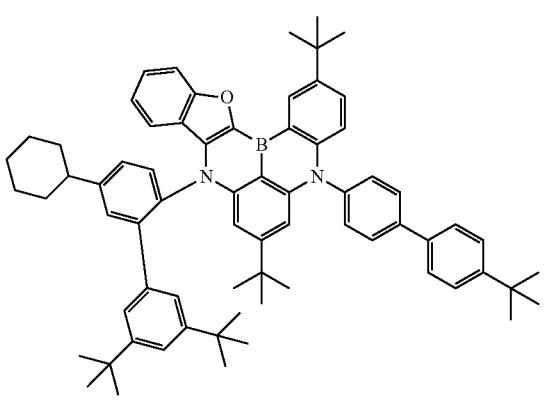 |
| 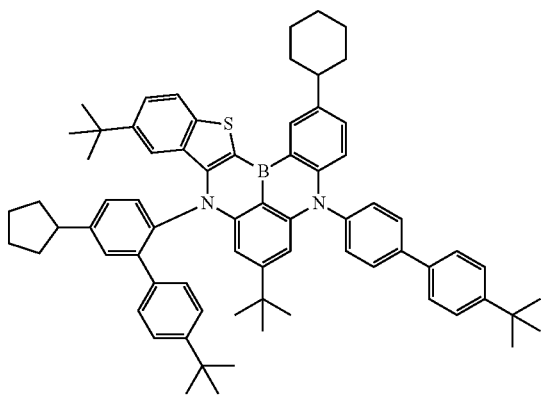 | 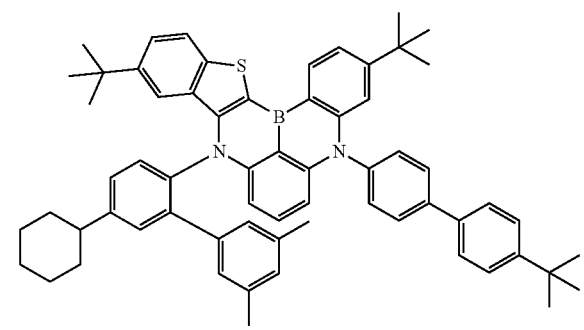 |
| 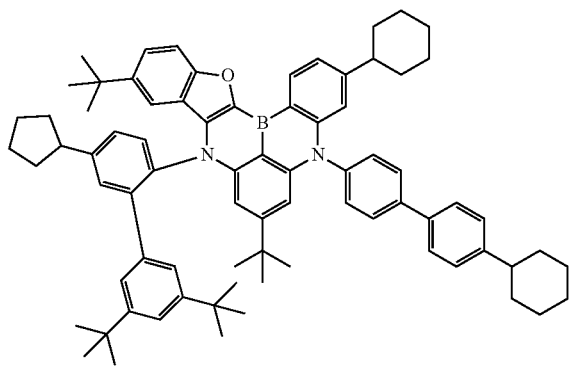 | 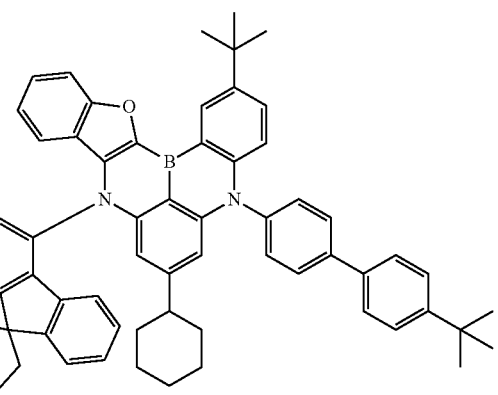 |

61
-continued
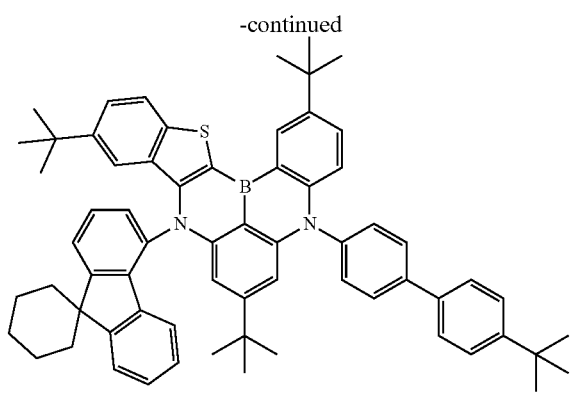
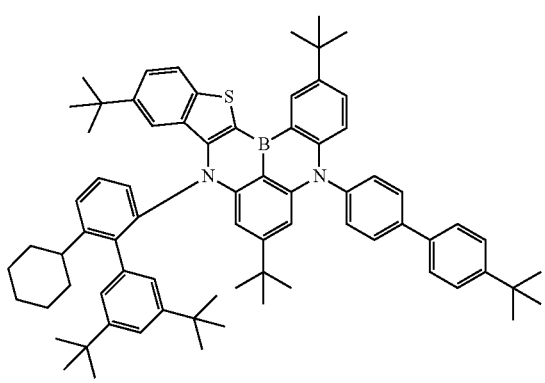
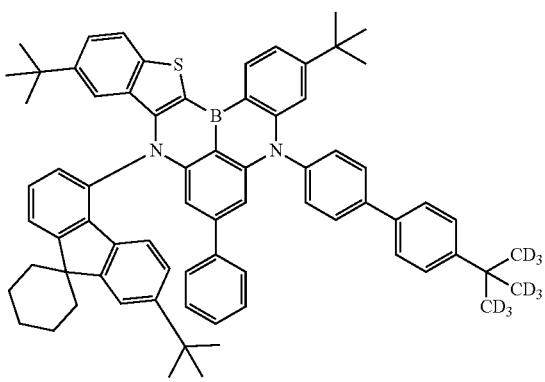
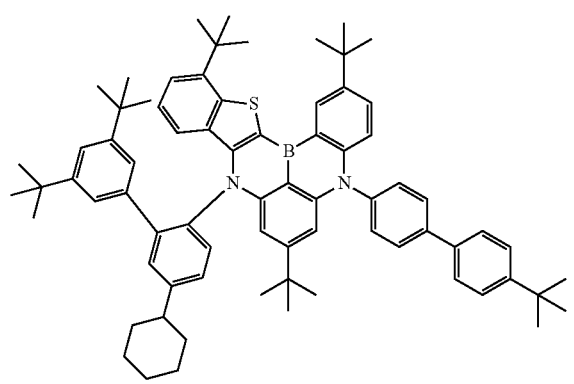
62
-continued
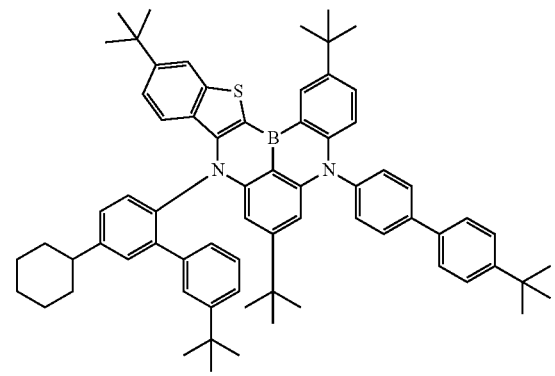
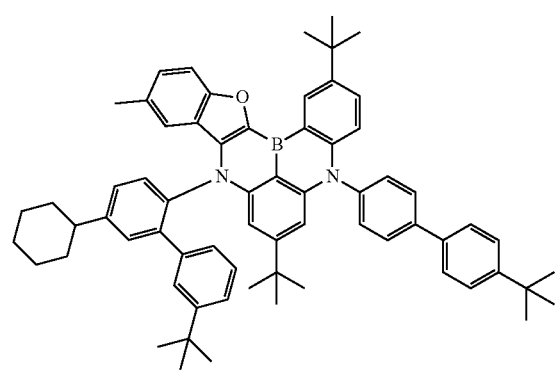
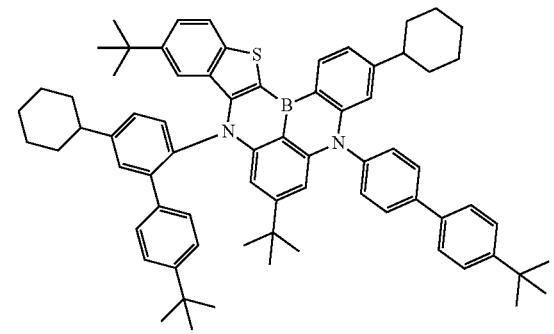
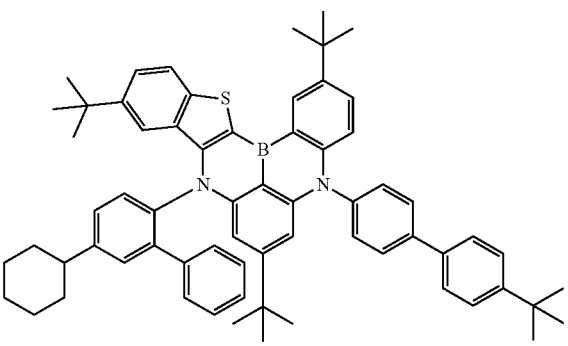

63
-continued
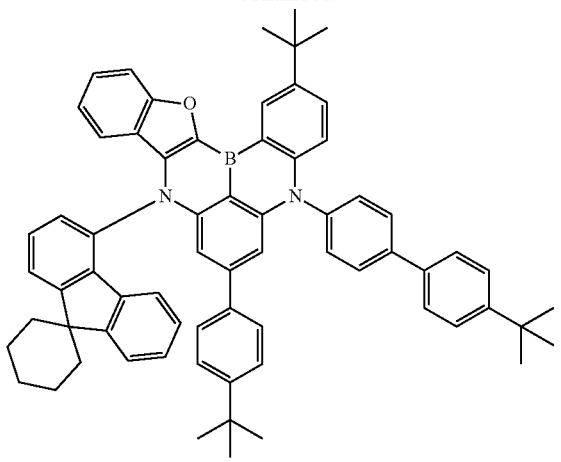
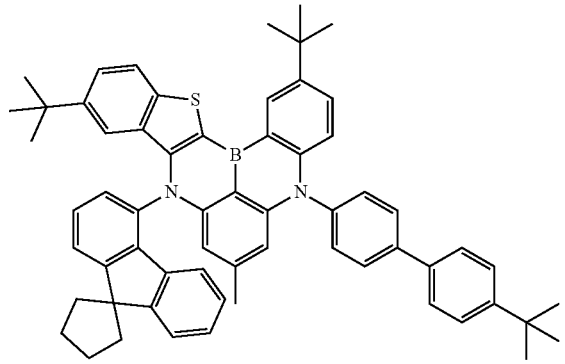
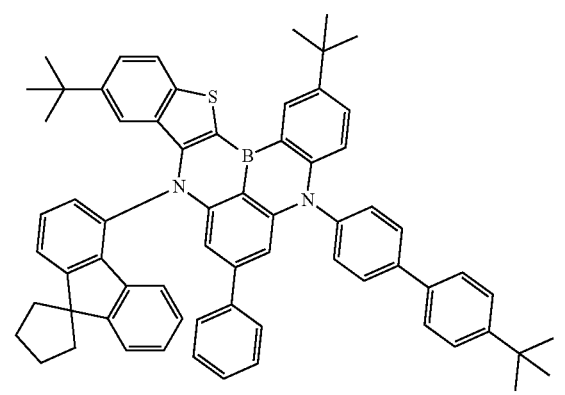
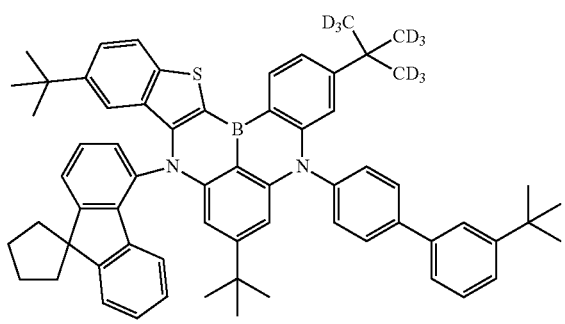
64
-continued
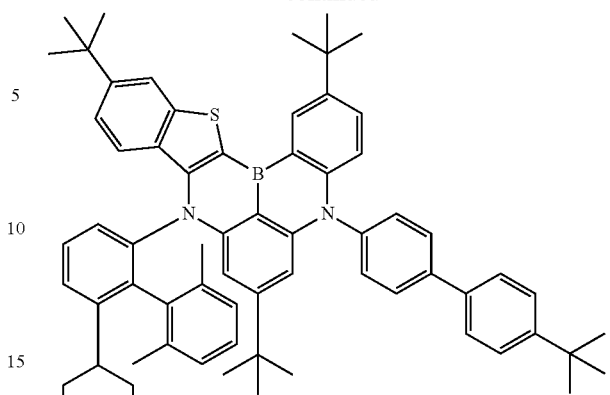
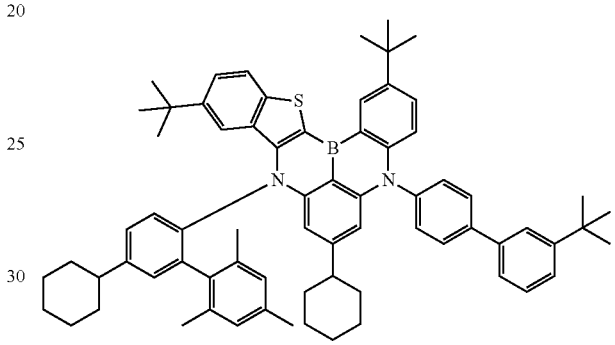
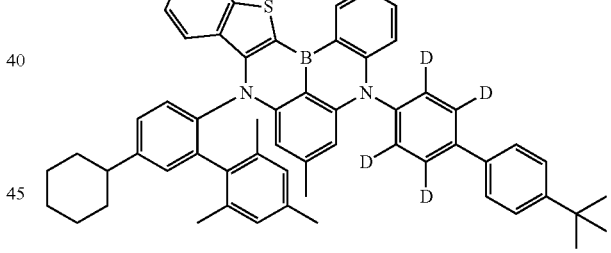
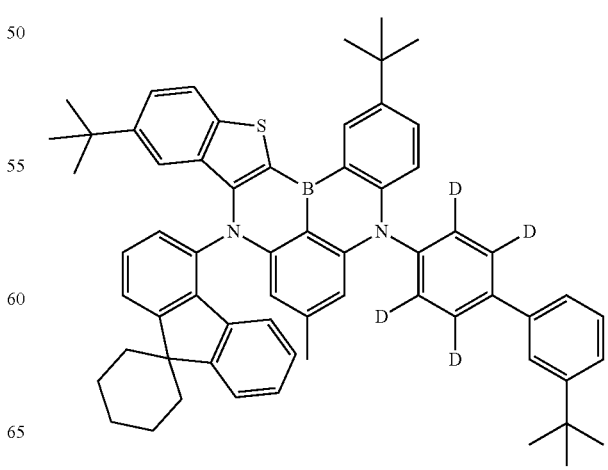

65
-continued
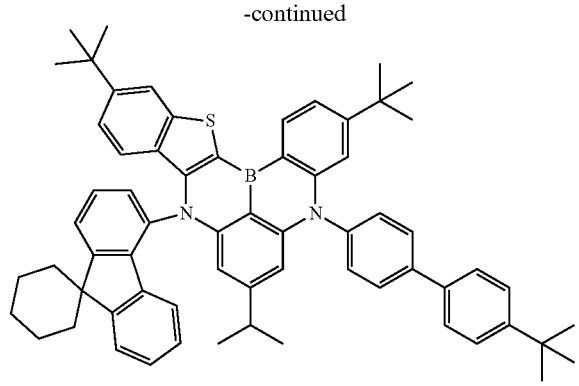
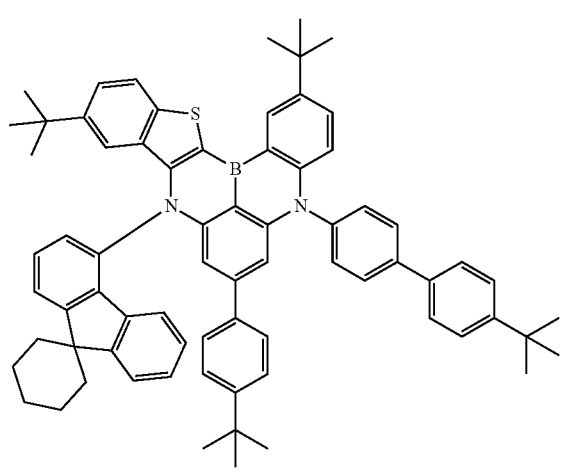
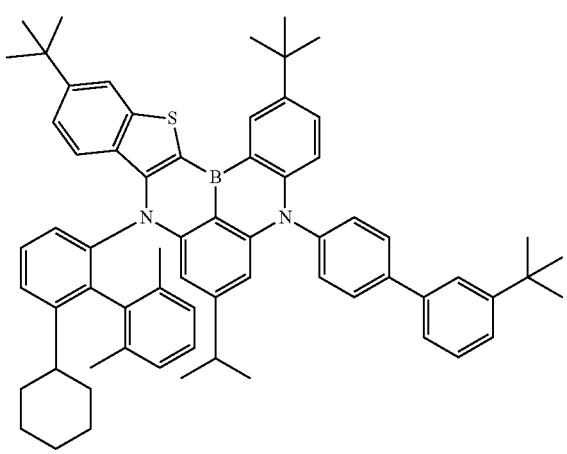
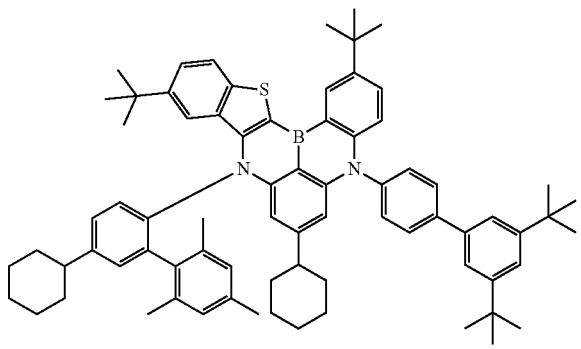
66
-continued
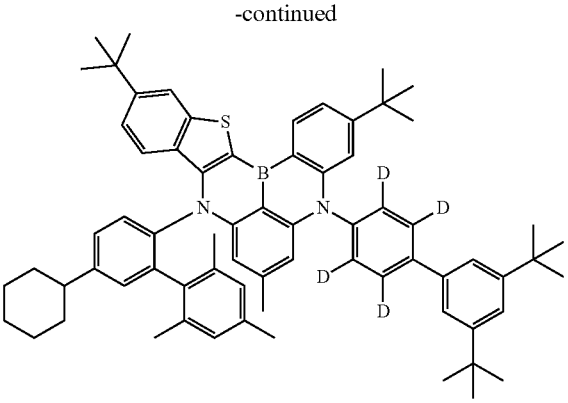
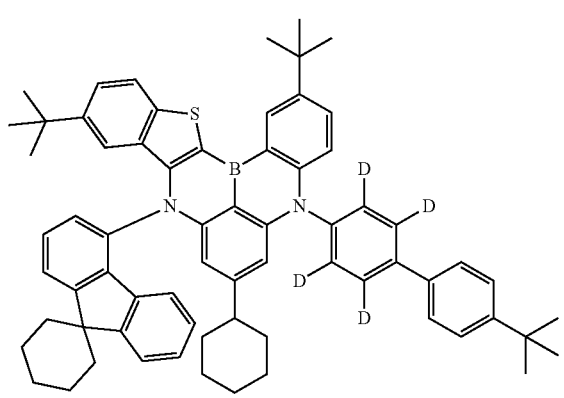
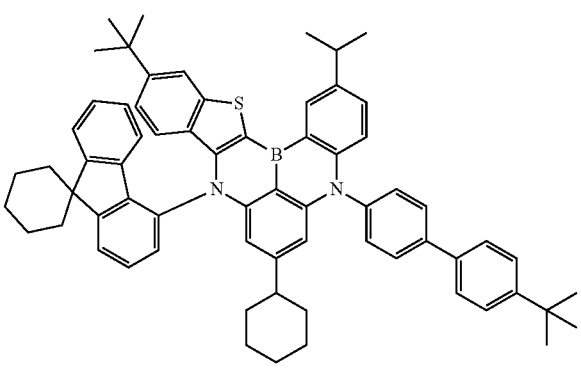
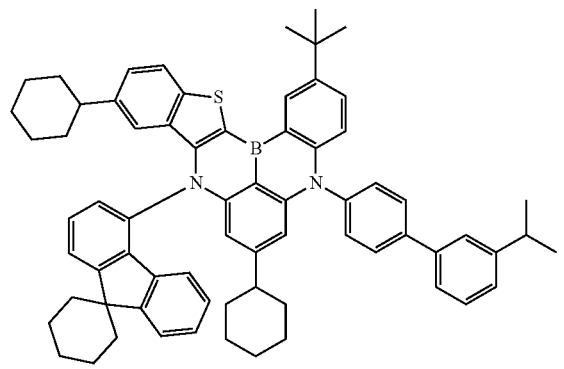

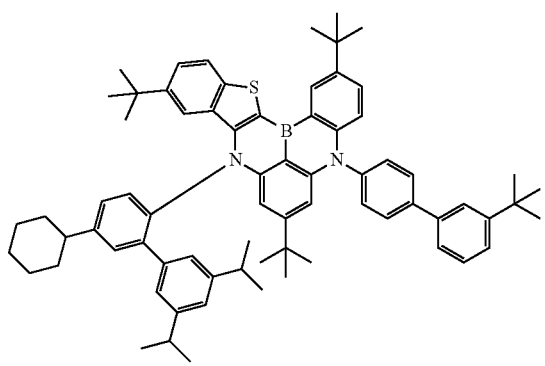
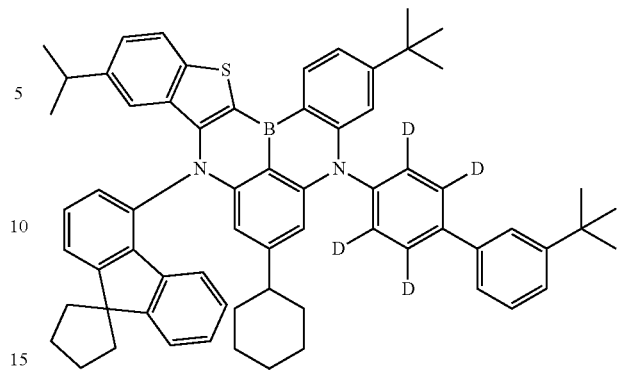
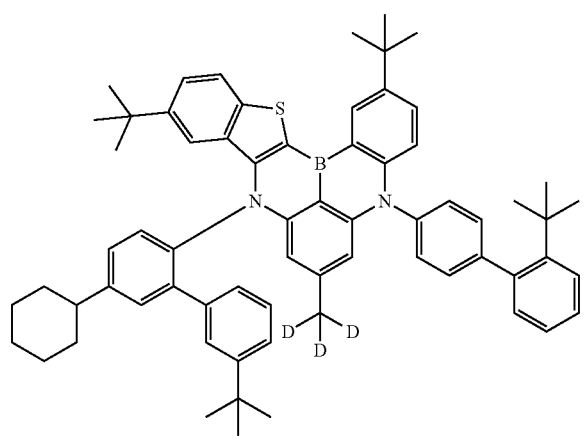
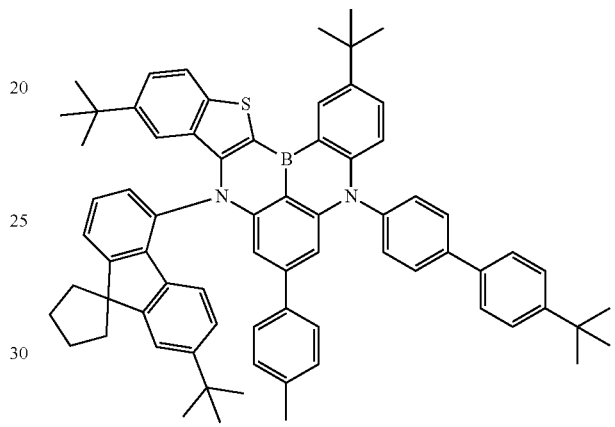
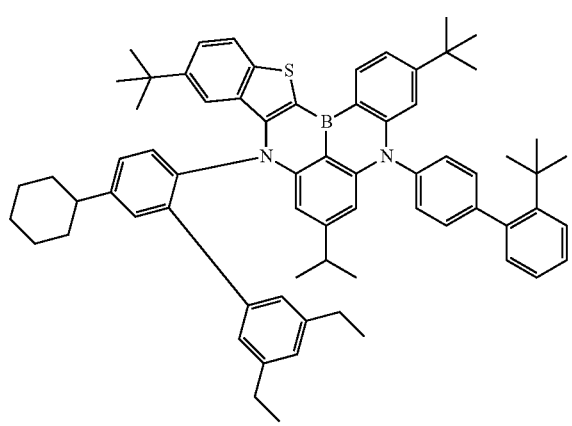
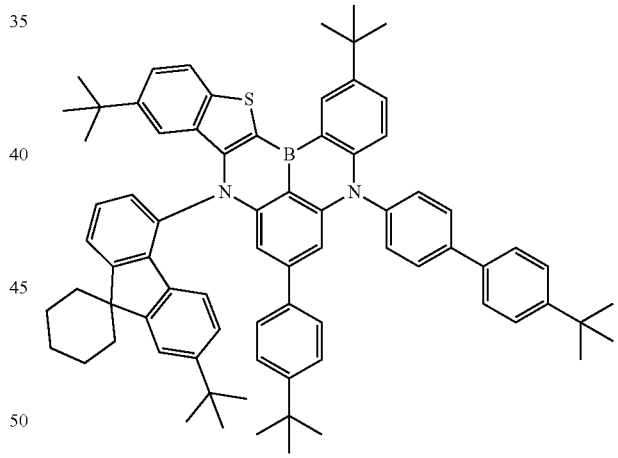
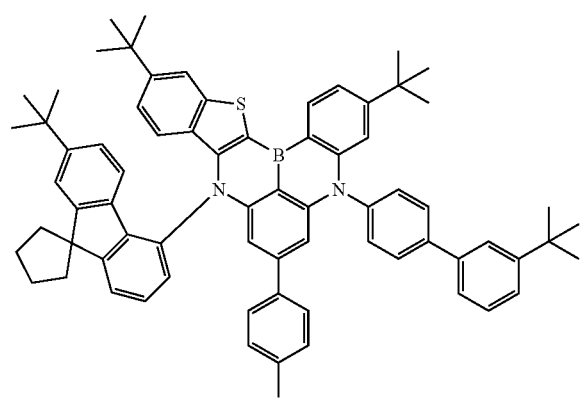
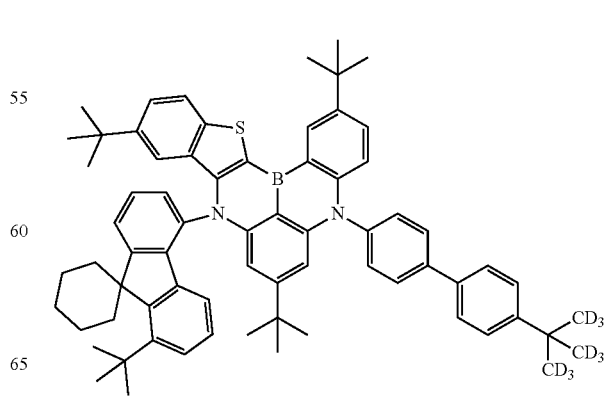

69
-continued
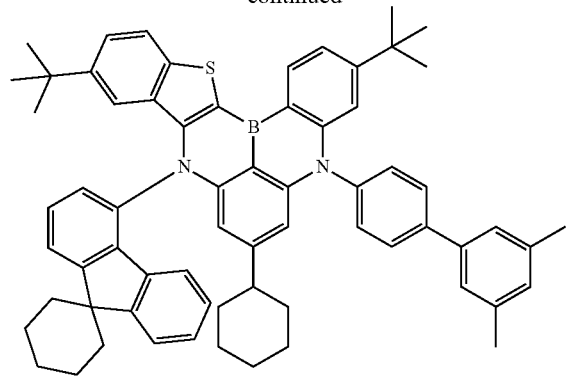
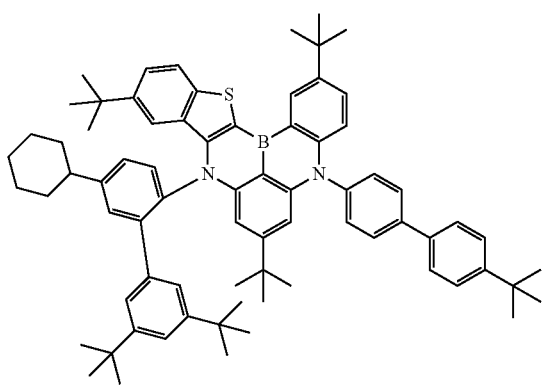
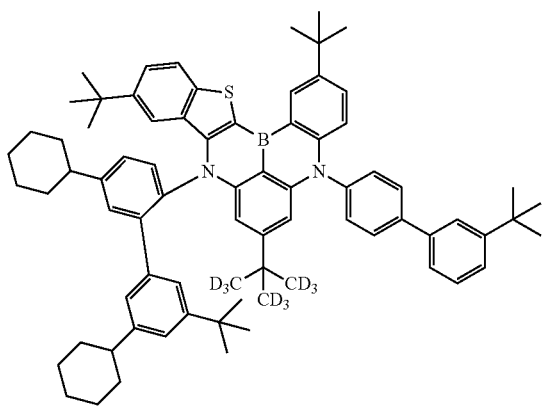
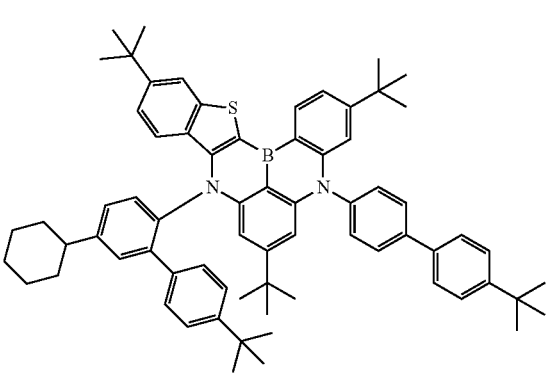
70
-continued
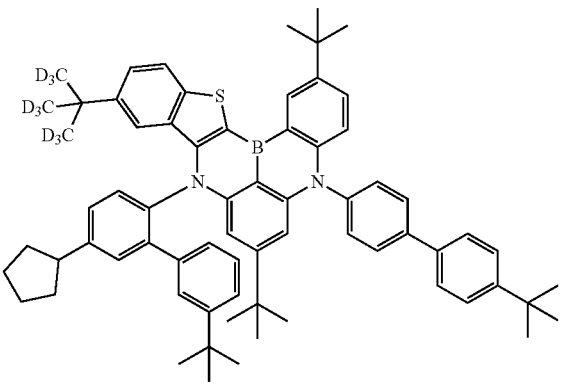
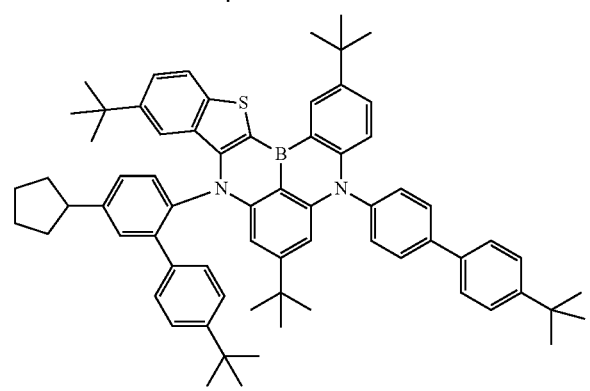
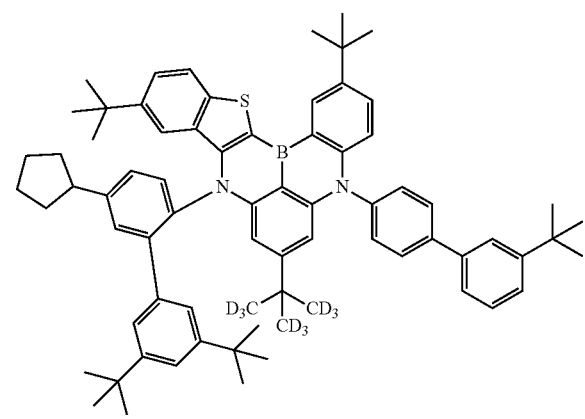
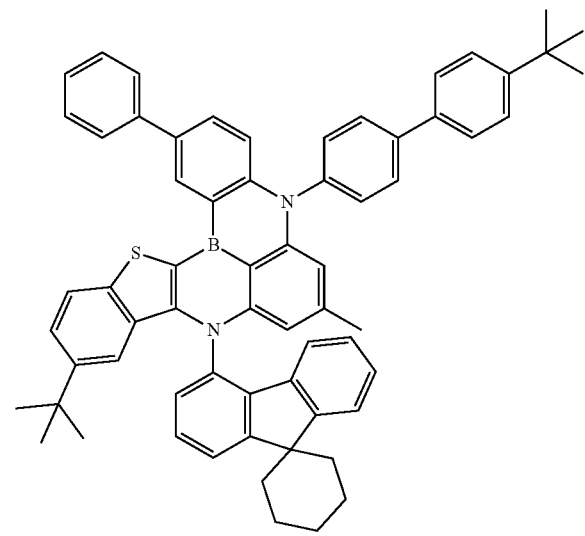

71
-continued
72
-continued
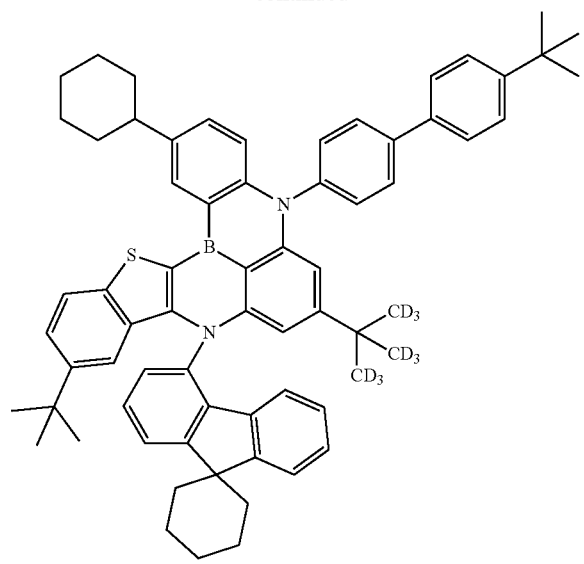
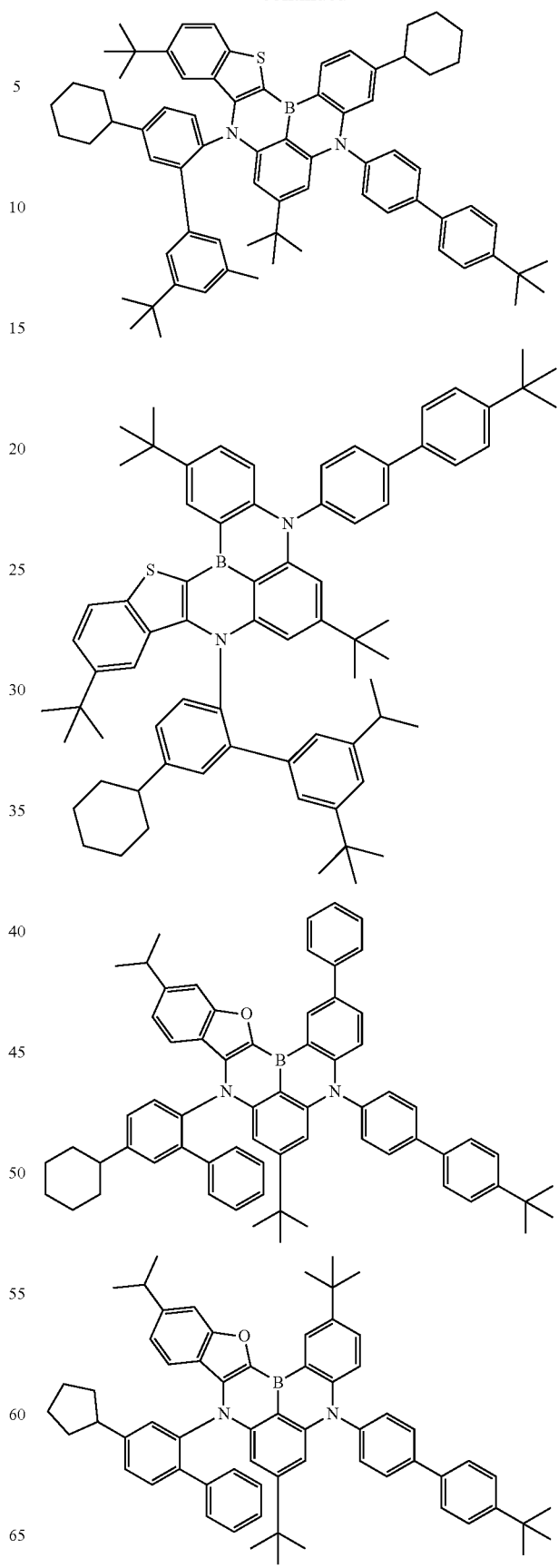

73
-continued
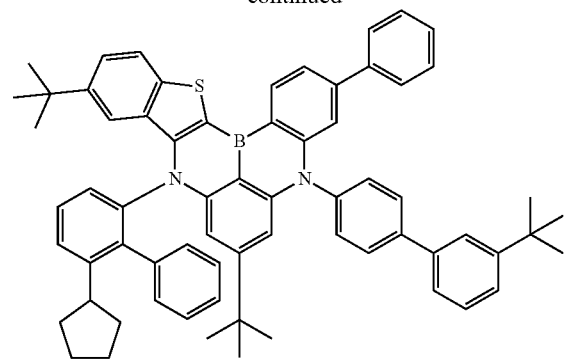
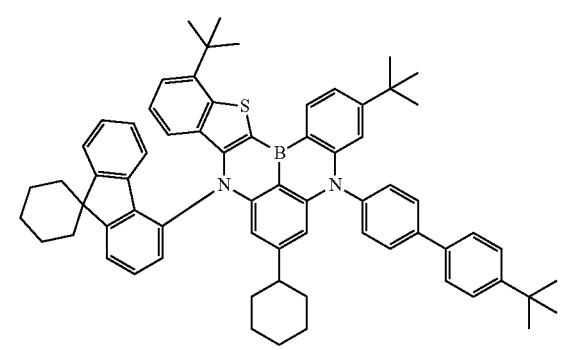
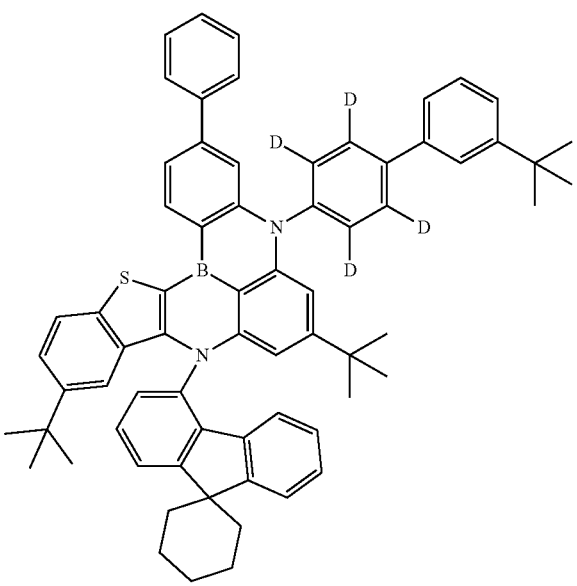
74
-continued
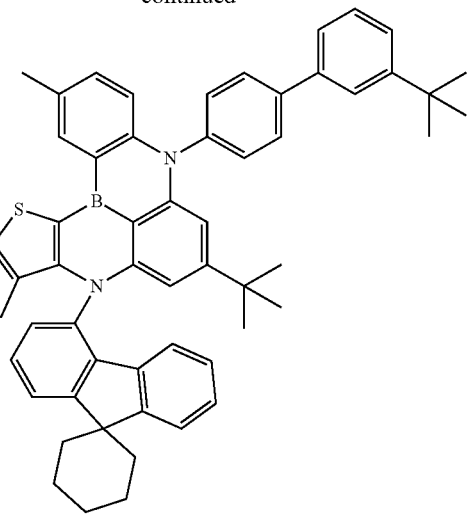
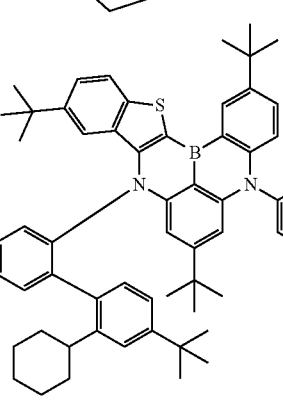
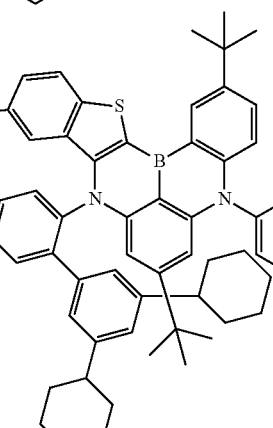
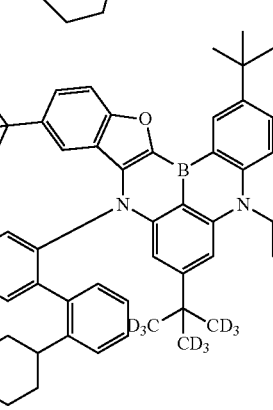

-continued
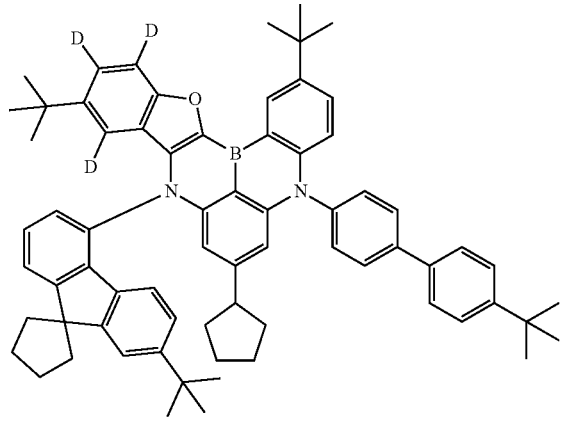
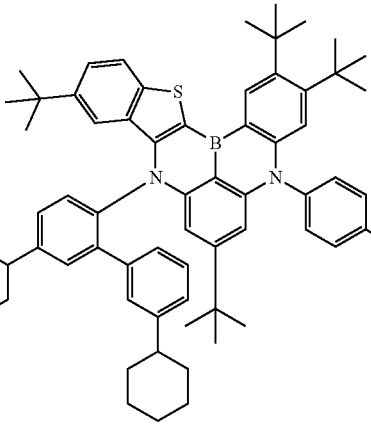
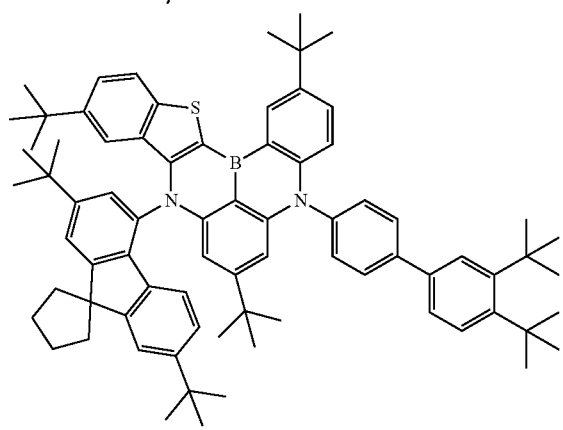
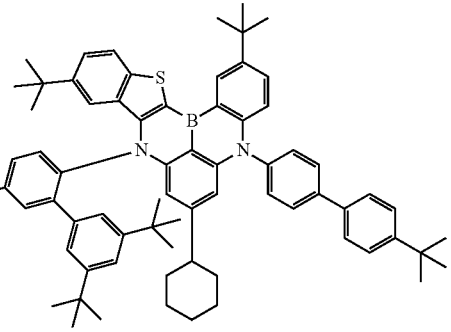
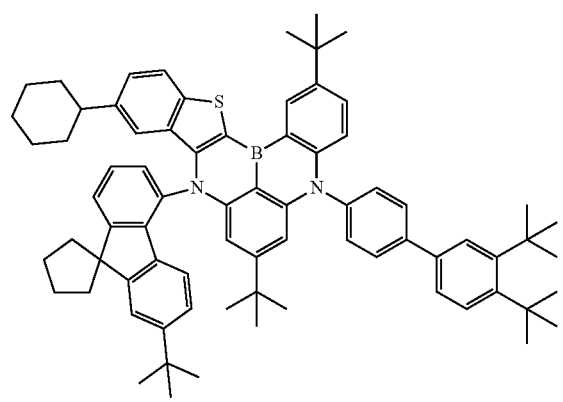
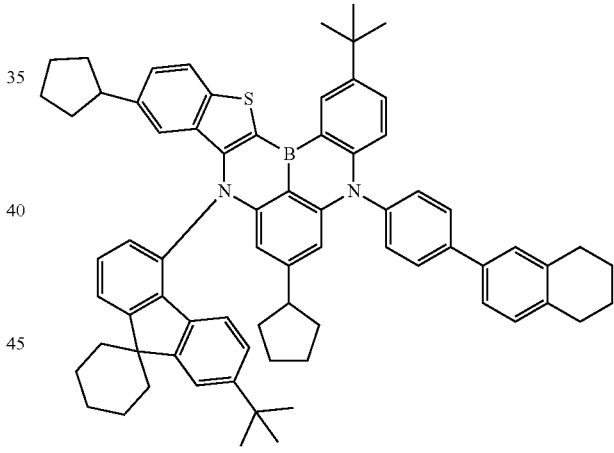
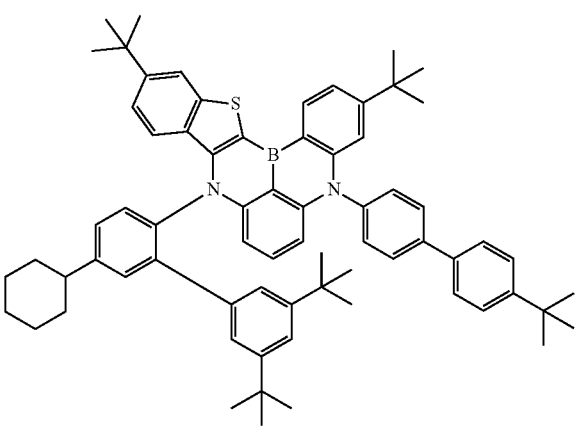
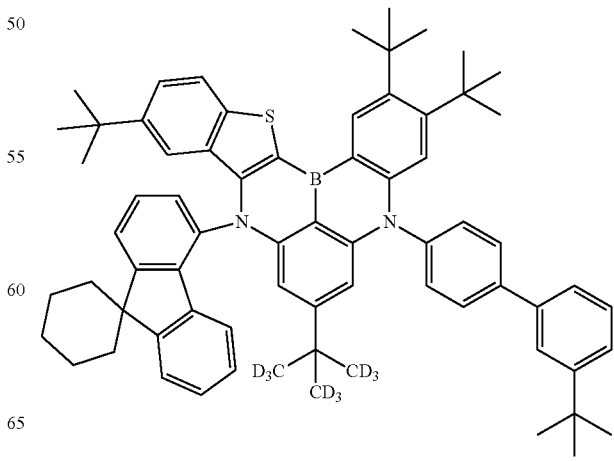

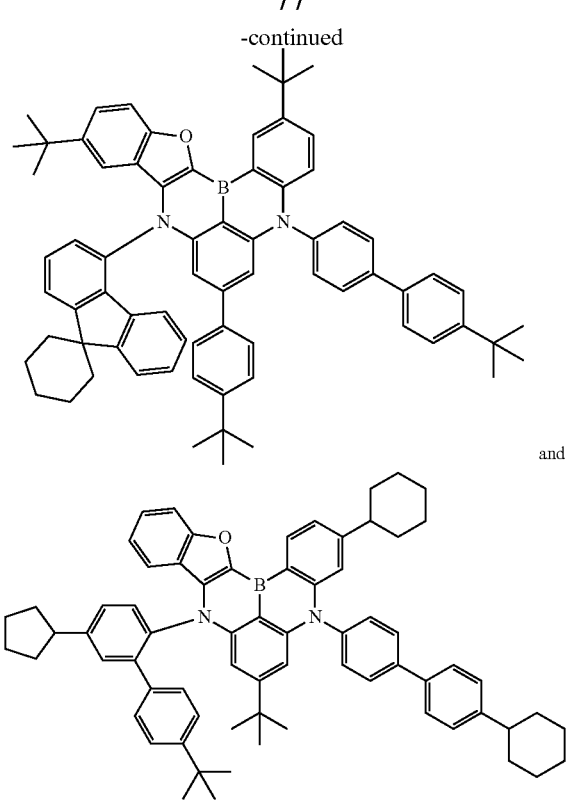

and

In a second aspect, the present invention provides an organic electroluminescent device comprising an anode, a hole transport region, a luminescent layer, an electron transport region, and a cathode, which are sequentially arranged on a substrate plate, wherein the luminescent layer comprises one or more blue luminescent compositions as described above.

Furthermore, the luminescent layer comprises a host material and a guest material, wherein the host material comprises one or more compounds with general structural formulas as represented by Formula I, and the guest material comprises one or more compounds with general structural formulas as represented by Formula II.

Beneficial Effects of the Invention:

In the blue-light host material (BH) provided by the present invention, by fully deuterating the anthracene structure in the parent nucleus structure, the energy of the luminescent material is reduced, and the stability and lifetime of the luminescent device are both significantly enhanced; in addition, by introducing deuteration into the dibenzofuran structure and/or substituents such as phenyl, naphthyl, phenanthryl, and pyrene, the device shows a long lifetime without increasing the voltage, and the energy loss is reduced; moreover, after deuteration, the host material can co-act with cycloalkyl on the guest material to strengthen the dipole-dipole interaction between the host material and the guest material, thus improving the exciton energy transmission In the blue-light guest material (BD) provided by the present invention, the introduction of sterically hindrance groups such as thiophene can inhibit the vibration of the parent nucleus, so that the energy loss and FWHM generated during excitation are reduced; in addition, the introduction of cycloalkyl into the structure can result in three-dimensional interference and interfere with the packaging of the guest material and the guest material, thus reducing the optical loss between guest materials, leading to a significant improvement in efficiency.

In the present invention, by means of the rational combination of the host material and the guest material and the use of the host material with a large polarity and the guest material with a good dispersion effect, not only can the occurrence of host luminescence be effectively avoided, but the occurrence of concentration quenching can also be reduced. Therefore, by using the blue luminescent composition provided by the present invention, the effects of improving the orientation of the organic luminescent material, prolonging the lifetime, and reducing quenching can be achieved, and an organic electroluminescent device prepared by using the blue luminescent composition of the present invention has good performance in external quantum efficiency, lifetime, and driving voltage.

In the Brief Description of the Drawings: 1-substrate, 2-anode, 3-hole injection layer, 4-hole transport layer, 5-luminescent auxiliary layer, 6-luminescent layer, 7-hole barrier layer, 8-electron transport layer, 9-electron injection layer, and 10-cathode.

DETAILED DESCRIPTION OF EMBODIMENTS

In order to understand the content of the present invention more clearly, the present invention will be described in detail in conjunction with the accompanying drawings and examples.

Figure 1:
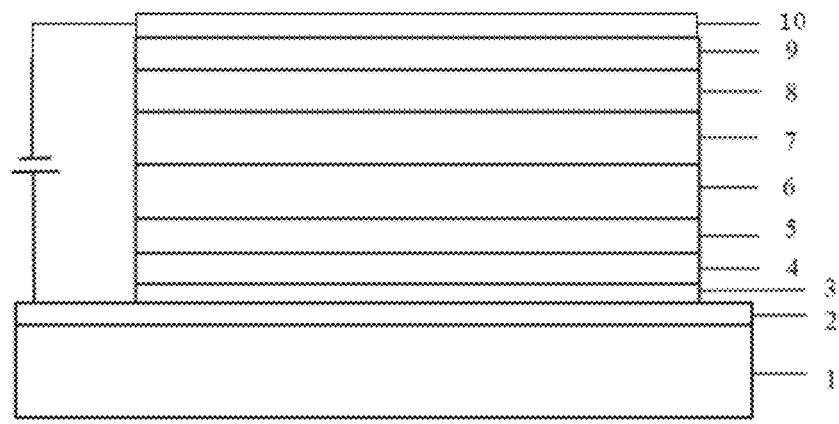
FIG. 1 is a schematic structural diagram of an organic electroluminescent device of the present invention.
Figure 2:
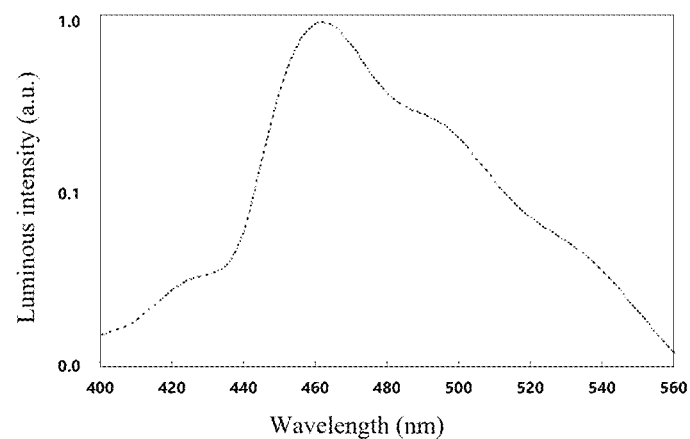
FIG. 2 is a UV-PL diagram with host luminescence.

The compound of the present invention is suitable for light-emitting elements, display panels, and electronic devices, especially for organic electroluminescent devices. The electronic device described in the present invention is a device that comprises a layer of at least one organic compound, and the device may also comprise an inorganic material or a layer formed entirely of an inorganic material. The electronic device is preferably an organic electroluminescent device (OLED), an organic integrated circuit (O-IC), an organic field-effect transistor (O-FET), an organic thin film transistor (O-TFT), an organic light-emitting transistor (O-LET), an organic solar cell (O-SC), an organic dye-sensitized solar cell (O-DSSC), an organic optical detector, an organic photosensor, an organic field-quenching device (O-FQD), a luminescent electrochemical cell (LEC), an organic laser diode (O-laser), and an organic plasma emitting device. The electronic device is preferably an organic electroluminescent device (OLED). The schematic structural diagram of an exemplary organic electroluminescent device is as shown in FIG. 1.

Experimental Part

In order to understand the content of the present invention more clearly, the polycyclic compound, the preparation method for the compound, and the luminescent characteristics of the device will be explained in detail in conjunction with examples. Various chemical reactions can be applied to the synthesis method for a compound according to one embodiment of the present invention. However, it should be noted that the synthesis method for the compound according to one embodiment of the present invention is not limited to the synthesis method described below. Unless otherwise specified, the subsequent synthesis is carried out in an anhydrous solvent in a protective gas atmosphere. Solvents and reagents can be purchased from conventional reagent suppliers.

SYNTHESIS EXAMPLE 1

This synthesis example provided Compound H-1, and the synthesis route of the compound was as follows:

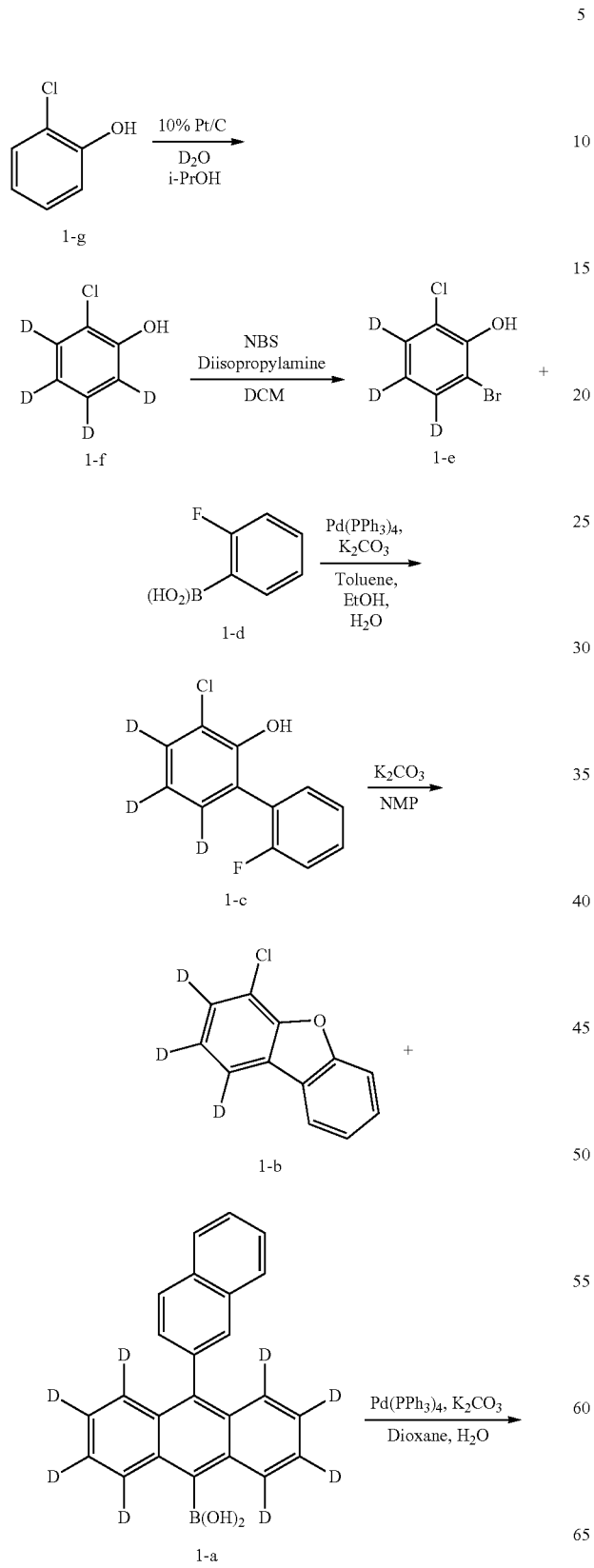

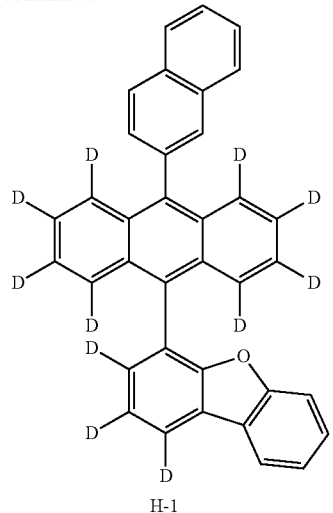

To a 100 mL reaction flask, Compound 1-g (1.29 g, 10 mmol), 10 mL of $D_2O$, 2 mL of isopropanol, and 2 mL of n-hexane were added. In an argon atmosphere, Pt/C (1.0 g, 0.5 mmol) was added, and the mixture was warmed to 90° C. and reacted for 24 h. After cooling to room temperature, the reaction product was filtered to remove Pt/C, and 20 mL of dichloromethane was added. The mixture was stirred and left to stand for phase separation. The lower layer was dried over anhydrous sodium sulfate, filtered, and distilled under reduced pressure to obtain 1-f (0.96 g, yield: 72%).

To a 250 mL reaction flask, 1-f (1.33 g, 10 mmol), diisopropylamine (0.10 g, 1 mmol), and 20 mL of dichloromethane were added, and N-bromosuccinimide (3.92 g, 22 mmol) was slowly added. The mixture was warmed to 30° C. and reacted for 12 h, and the reaction product was cooled to room temperature. The pH of the system was adjusted to 5 with a 1 mol/L hydrochloric acid solution. 20 ml of water was added, and the mixture was stirred and left to stand for liquid separation. The organic phase was taken. The aqueous phase was extracted with 20 mL of dichloromethane, and the organic phases were combined, dried over anhydrous sodium sulfate, concentrated under reduced pressure, and passed through a silica gel column to obtain 1-e (1.30 g, yield: 62%).

To a 250 mL three-necked flask, 30 mL of toluene, 15 mL of ethanol, and 15 mL of water were added under nitrogen protection, and Compound 1-e (2.10 g, 10 mmol), Compound 1-d (1.40 g, 10 mmol), potassium carbonate (4.15 g, 30 mmol), and tetrakis (triphenylphosphine) palladium (0.35 g, 0.3 mmol) were then added. The mixture was heated to 80° C. and reacted for 12 h, and the reaction product was cooled to room temperature. 15 mL of water was added, and the mixture was stirred and left to stand for layering. The organic phase was evaporated to dryness under reduced pressure and passed through a silica gel column to obtain 1-c (1.67 g, yield: 74%).

To a 250 mL three-necked flask, 1-c (2.26 g, 10 mmol), potassium carbonate (4.15 g, 30 mmol), and 30 mL of NMP were added under nitrogen protection, heated to 120° C., and reacted for 16 h. After the reaction was complete, the reaction product was cooled to room temperature, and 40 mL of water was added. The mixture was stirred and left to stand for layering. The aqueous phase was extracted with 30 mL of ethyl acetate, the organic phase was dried over anhydrous sodium sulfate, filtered, then evaporated to dryness under reduced pressure, and passed through a silica gel column to obtain 1-b (1.46 g, yield: 71%).

To a 250 mL three-necked flask, 40 mL of 1,4-dioxane and 10 mL of water were added under nitrogen protection, followed by 1-b (2.06 g, 10 mmol), 1-a (3.56 g, 10 mmol), potassium phosphate (6.37 g, 30 mmol), and tetrakis (triphenylphosphine) palladium (0.35 g, 0.3 mmol), and the mixture was heated to 90° C. and reacted for 8 h. After the reaction was complete, the reaction product was cooled to room temperature, and 40 ml of water and 30 mL of dichloromethane were added. The mixture was stirred and left to stand for layering. The aqueous phase was extracted with 30 mL of dichloromethane, and the organic phases were combined. The organic phases were dried over anhydrous sodium sulfate, filtered, then distilled under reduced pressure, passed through a silica gel column, and then recrystallized to obtain compound H-1 (3.18 g, yield: 66%), MS: m/z 481.24 [m+].

SYNTHESIS EXAMPLE 2

This synthesis example provided Compound H-2, and the synthesis route of the compound was as follows:

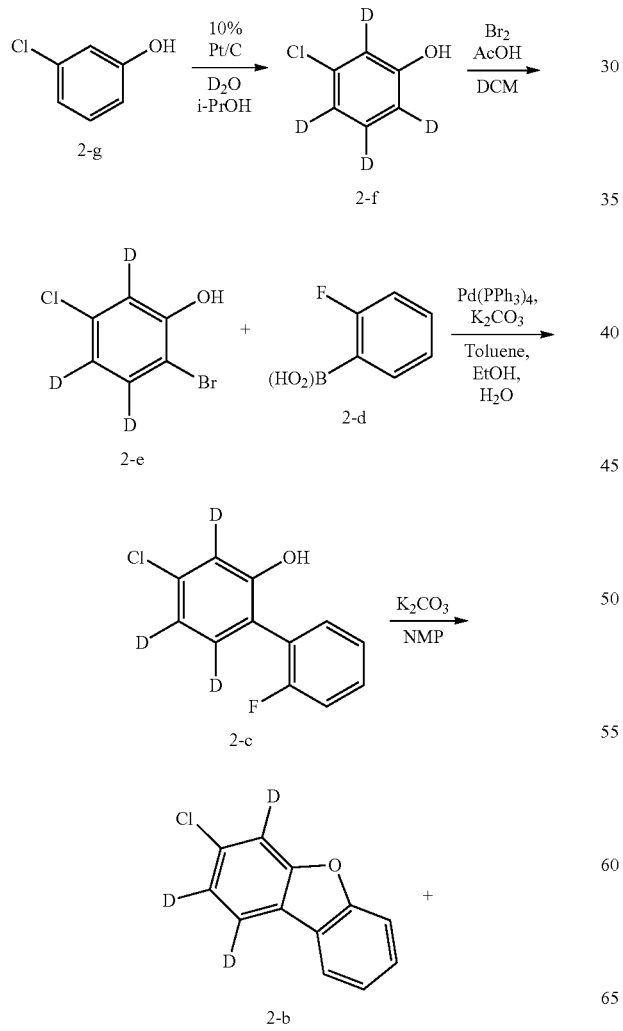

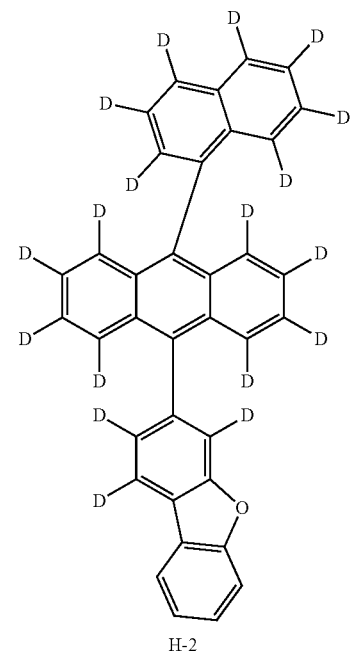

Referring to the synthesis method for Compound 1-f, 1-g was replaced with 2-g (1.29 g, 10 mmol) to obtain Compound 2-f (0.92 g, yield: 69%).

To a 100 mL reaction flask, Compound 2-f (1.33 g, 10 mmol), 20 mL of dichloromethane, and 1 mL of glacial acetic acid were added and cooled to 0° C., and bromine (1.60 g, 10 mmol) was slowly dropwise added. After the dropwise addition was complete, the mixture was stirred at 0° C. for 30 min, then heated to room temperature, and reacted for 16 h. 30 mL of a sodium thiosulfate solution was added, and the mixture was stirred and left to stand for phase separation. The aqueous phase was extracted with 20 mL of dichloromethane, the organic phases were combined, dried over anhydrous sodium sulfate, filtered, then distilled under reduced pressure, and passed through a silica gel column to obtain 2-e (0.51 g, yield: 24%).

Referring to the synthesis method for Compound 1-c, 1-e was replaced with 2-e (2.10 g, 10 mmol) and 1-d was replaced with 2-d (1.40 g, 10 mmol) to obtain Compound 2-c (1.60 g, yield: 71%).

Referring to the synthesis method for Compound 1-b, 1-c was replaced with 2-c (2.26 g, 10 mmol) to obtain Compound 2-b (1.48 g, yield: 72%).

Referring to the synthesis method for Compound H-1, 1-b was replaced with 2-b (2.06 g, 10 mmol) and 1-a was replaced with 2-a (3.63 g, 10 mmol) to obtain Compound H-2 (3.32 g, yield: 68%), MS: m/z 488.28 [M+].

SYNTHESIS EXAMPLE 3

This synthesis example provided Compound H-3, and the synthesis route of the compound was as follows:

SYNTHESIS EXAMPLE 4

This synthesis example provided Compound H-4, and the synthesis route of the compound was as follows:

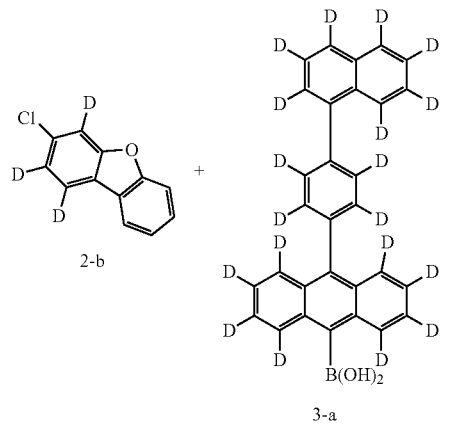

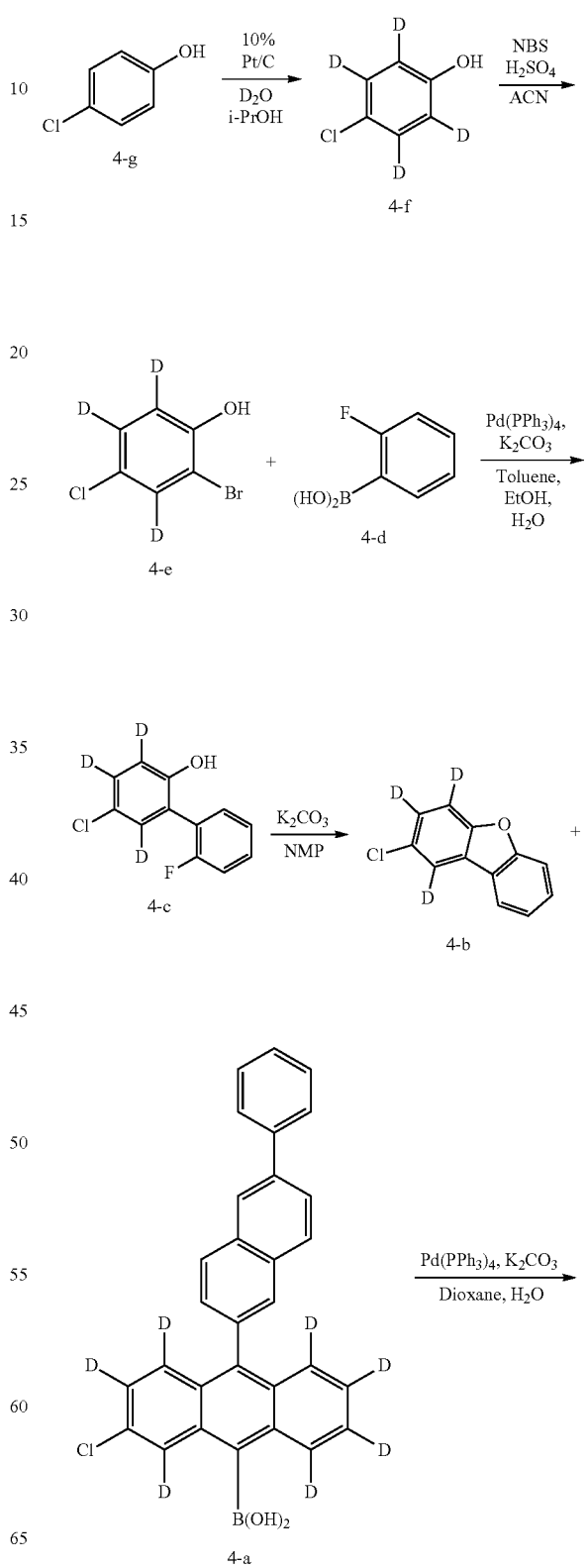

Referring to the synthesis method for Compound H-1, 1-b was replaced with 2-b (2.06 g, 10 mmol) and 1-a was replaced with 3-a (4.43 g, 10 mmol) to obtain Compound H-3 (3.70 g, yield: 65%), MS: m/z 568.34 [M+].

85
-continued

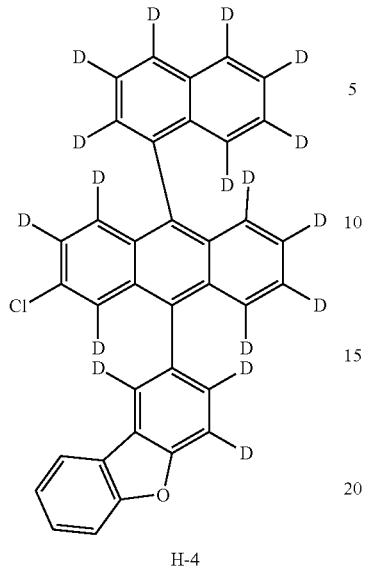

H-4

Referring to the synthesis method for Compound 1-f, 1-g was replaced with 4-g (1.29 g, 10 mmol) to obtain Compound 4-f (0.88 g, yield: 66%).

To a 100 mL reaction flask, Compound 4-f (1.33 g, 10 mmol), 20 mL of acetonitrile, and concentrated sulfuric acid (1.08 g, 11 mmol) were added. After stirring at room temperature for 5 min, NBS (1.96 g, 11 mmol) was slowly added and reacted at room temperature for 3 h. 20 ml of water was added. The aqueous phase was extracted three times with 30 mL of dichloromethane. The organic phases were combined, dried over anhydrous sodium sulfate, filtered, distilled under pressure, and passed through a silica gel column to obtain 4-e (1.60 g, yield: 76%).

Referring to the synthesis method for Compound 1-c, 1-e was replaced with 4-e (2.10 g, 10 mmol) and 1-d was replaced with 4-d (1.40 g, 10 mmol) to obtain Compound 4-c (1.65 g, yield: 73%).

Referring to the synthesis method for Compound 1-b, 1-c was replaced with 4-c (2.26 g, 10 mmol) to obtain Compound 4-b (1.46 g, yield: 71%).

Referring to the synthesis method for Compound H-1, 1-b was replaced with 4-b (2.06 g, 10 mmol) and 1-a was replaced with 4-a (3.63 g, 10 mmol) to obtain Compound H-4 (3.27 g, yield: 67%), MS: m/z 488.28 [M+].

86

SYNTHESIS EXAMPLE 5

This synthesis example provided Compound H-5, and the synthesis route of the compound was as follows:

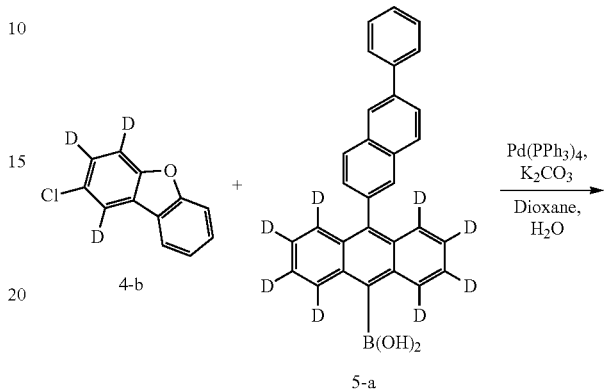

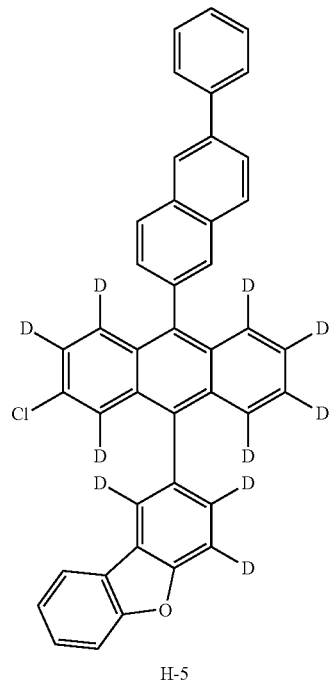

H-5

Referring to the synthesis method for Compound H-1, 1-b was replaced with 4-b (2.06 g, 10 mmol) and 1-a was replaced with 5-a (4.32 g, 10 mmol) to obtain Compound H-5 (3.85 g, yield: 69%), MS: m/z 557.27 [M+].

SYNTHESIS EXAMPLE 6

This synthesis example provided Compound H-6, and the synthesis route of the compound was as follows:

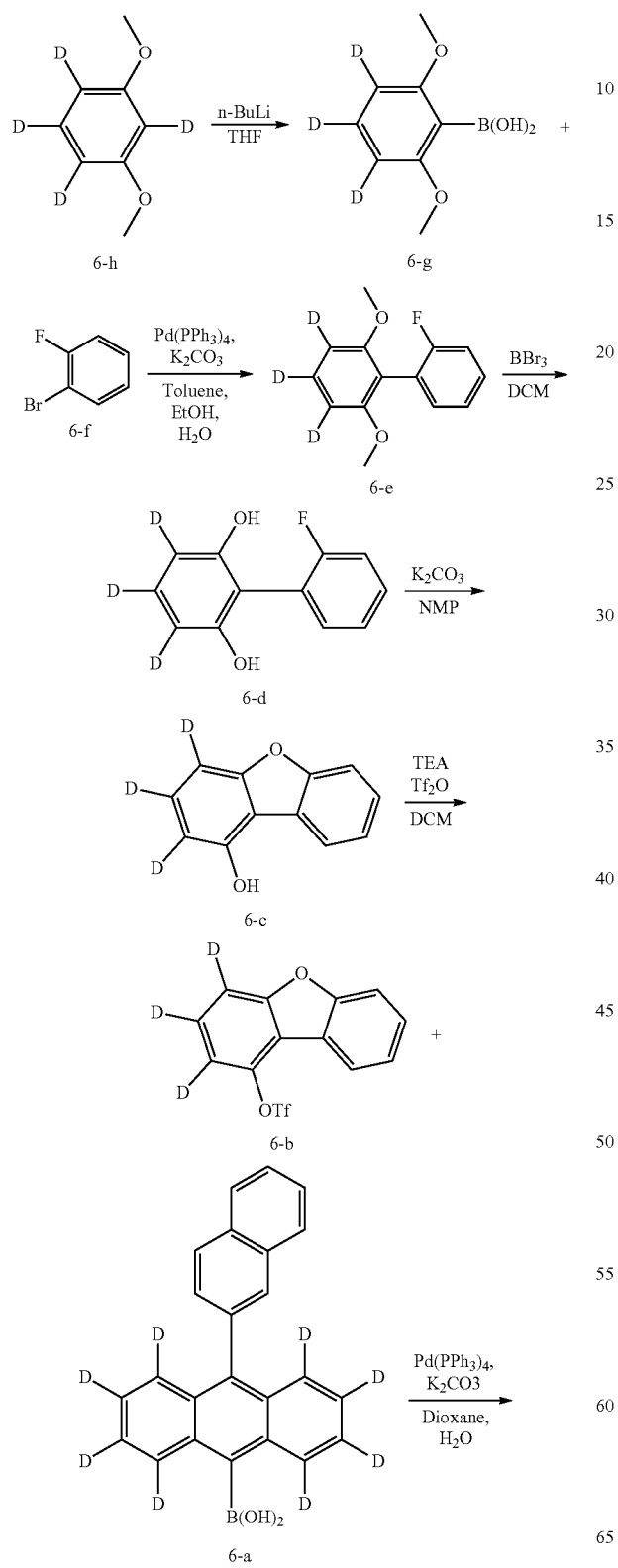

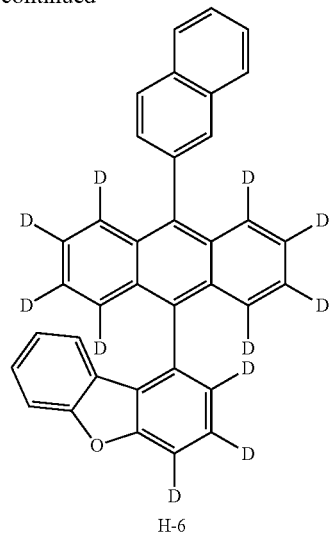

H-6

To a 100 mL reaction flask, Compound 6-h (1.42 g, 10 mmol) and 20 mL of tetrahydrofuran were added. Under nitrogen protection, the mixture was cooled to −40° C., and 2M n-butyl lithium (10 mL, 20 mmol) was slowly added dropwise. After the dropwise addition was complete, the mixture was stirred for 1 h, and trimethyl borate (2.08 g, 20 mmol) was slowly added and stirred for 30 min. The mixture was then warmed to room temperature, stirred for 2 h, and cooled to −10° C. 30 mL of dilute hydrochloric acid was slowly added, and the mixture was warmed to room temperature and stirred for 1 h. 30 mL of dichloromethane was added, stirred, and left to stand for phase separation. The aqueous phase was extracted with 20 mL of dichloromethane, the organic phases were combined, dried over anhydrous sodium sulfate, filtered, and then distilled under reduced pressure to obtain 6-g (1.52 g, yield: 82%).

Referring to the synthesis method for Compound 1-c, 1-e was replaced with 6-g (1.85 g, 10 mmol) and 1-d was replaced with 6-f (1.75 g, 10 mmol) to obtain Compound 6-e (1.76 g, yield: 75%).

To a 250 mL reaction flask, 6-e (2.35 g, 10 mmol) and 25 mL of dichloromethane were added under nitrogen protection and cooled to −78° C., and BBr3 (10.02 g, 40 mmol) was slowly added. The mixture was slowly warmed to room temperature and reacted for 2 h. A saturated $NaHCO_3$ solution was added to terminate the reaction, and the pH was adjusted to about 7. 20 ml of water was added, and the mixture was stirred, and left to stand for liquid separation. The organic phase was taken. The aqueous phase was extracted with 30 mL of dichloromethane. The organic phases were combined, dried over sodium sulfate, and filtered, and the solvent was removed under reduced pressure. After passing through a silica gel column, 6-d (1.53 g, yield: 74%) was obtained.

Referring to the synthesis method for Compound 1-b, 1-c was replaced with 6-d (2.07 g, 10 mmol) to obtain Compound 6-c (1.35 g, yield: 72%).

To a 100 mL reaction flask, Compound 6-c (1.87 g, 10 mmol), 20 mL dichloromethane, and triethylamine (1.52 g, 15 mmol) were added. Under nitrogen protection, the mixture was cooled to 0° C., and trifluoromethanesulfonic anhydride (4.23 g, 15 mmol) was slowly added. The mixture was stirred for 30 min and warmed to room temperature at which the reaction continued for 4 h. 30 mL of a saturated ammonium chloride solution was added, stirred, and left to stand for phase separation. Subsequently, the organic phase was washed with 20 mL of a copper sulfate solution and then with 20 mL of water, dried over anhydrous sodium sulfate, filtered, and then distilled under reduced pressure to obtain 6-b (2.52 g, yield: 79%).

Referring to the synthesis method for Compound H-1, 1-b was replaced with 6-b (3.19 g, 10 mmol) and 1-a was replaced with 6-a (3.56 g, 10 mmol) to obtain Compound H-6 (3.03 g, yield: 63%), MS: m/z 481.24 [M+].

SYNTHESIS EXAMPLE 7

This synthesis example provided Compound H-7, and the synthesis route of the compound was as follows:

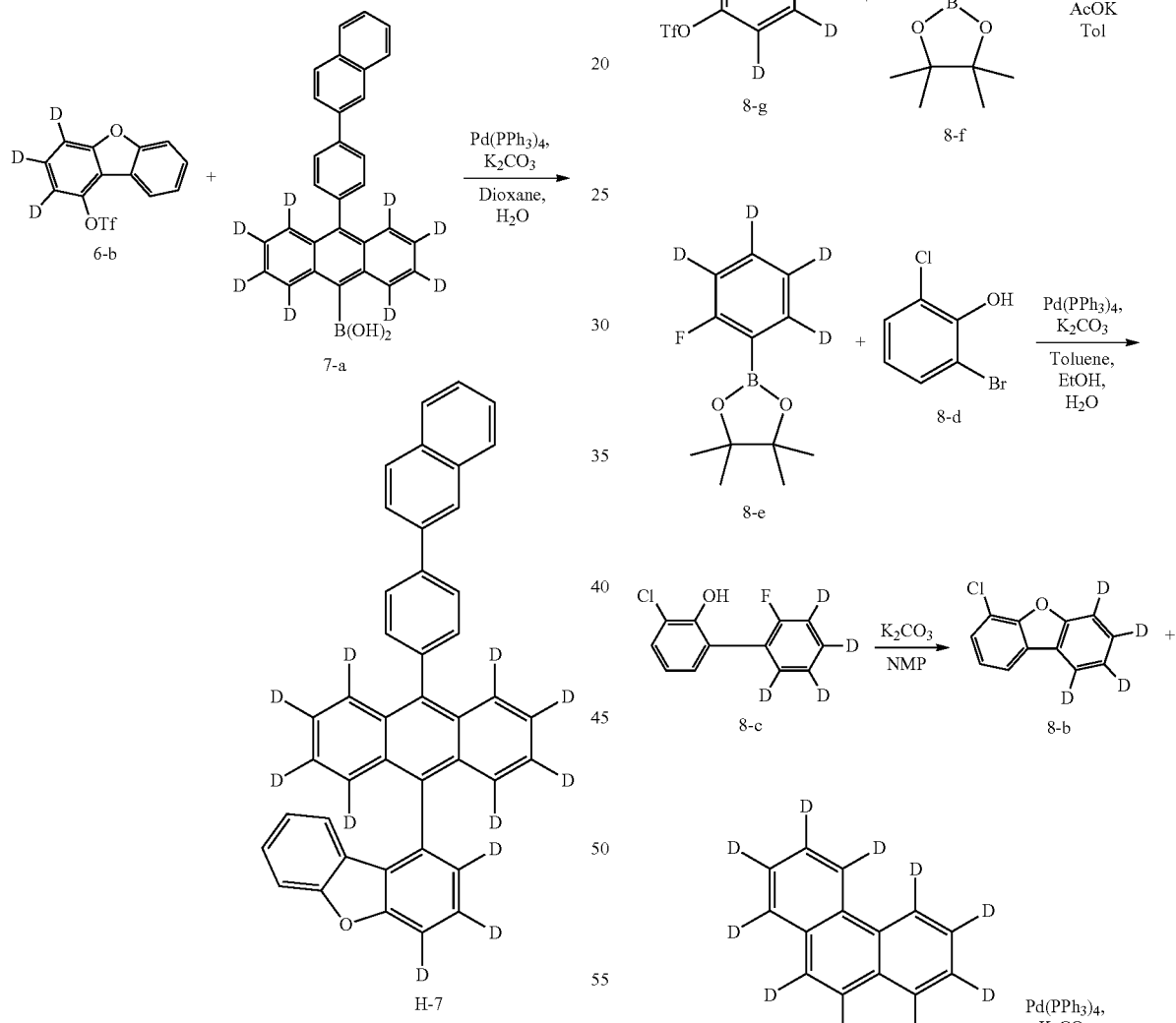

Referring to the synthesis method for Compound H-1, 1-b was replaced with 6-b (3.19 g, 10 mmol) and 1-a was replaced with 7-a (4.32 g, 10 mmol) to obtain Compound H-7 (3.68 g, yield: 66%), MS: m/z 557.27 [M+].

SYNTHESIS EXAMPLE 8

This synthesis example provided Compound H-8, and the synthesis route of the compound was as follows:

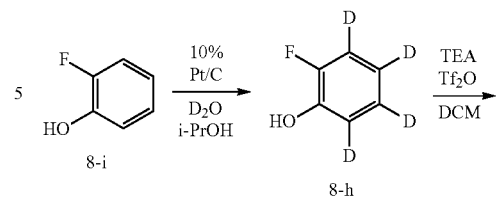

91

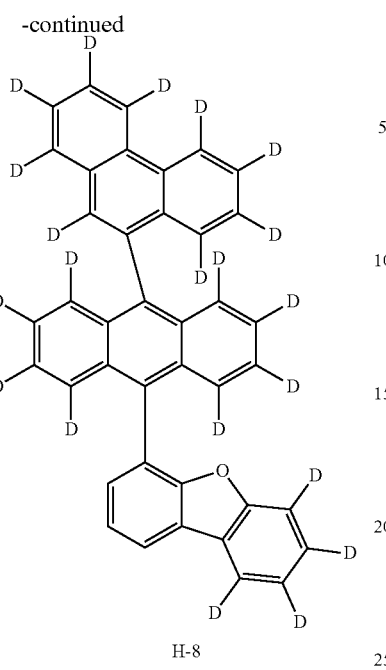

H-8

To a 100 mL reaction flask, 8-i (1.12 g, 10 mmol), 10 mL of $D_2O$, and 5 mL of isopropanol were added. In an argon atmosphere, Pt/C (0.12 g, 0.06 mmol) was added, and the mixture was warmed to 180° C. and reacted for 12 h. The reaction product was cooled to room temperature, filtered to remove Pt/C, and distilled under reduced pressure to obtain 8-h (0.85 g, yield: 73%).

Referring to the synthesis method for Compound 6-b, 6-c was replaced with 8-h (1.16 g, 10 mmol) to obtain Compound 8-g (2.04 g, yield: 82%).

To a 250 ml reaction flask, under nitrogen protection, 35 mL of toluene, potassium acetate (1.96 g, 20 mmol), 8-g (2.48 g, 10 mmol), 8-f (3.05 g, 12 mmol), and palladium dichloride (0.07 g, 0.1 mmol) were added, warmed to reflux, and reacted for 8 h. The reaction product was cooled to room temperature, and 20 mL of water was added. The mixture was stirred and left to stand for layering, and the organic phase was taken, evaporated to dryness under reduced pressure, and passed through a silica gel column to obtain 8-e (1.63 g, yield: 72%).

Referring to the synthesis method for Compound 1-c, 1-e was replaced with 8-e (2.26 g, 10 mmol) and 1-d was replaced with 8-d (2.07 g, 10 mmol) to obtain Compound 8-c (1.68 g, yield: 74%).

Referring to the synthesis method for Compound 1-b, 1-c was replaced with 8-c (2.27 g, 10 mmol) to obtain Compound 8-b (1.45 g, yield: 70%).

Referring to the synthesis method for Compound H-1, 1-b was replaced with 8-b (2.07 g, 10 mmol) and 1-a was replaced with 8-a (4.15 g, 10 mmol) to obtain Compound H-8 (3.85 g, yield: 71%), MS: m/z 541.31 [M+].

92

SYNTHESIS EXAMPLE 9

This synthesis example provided Compound H-9, and the synthesis route of the compound was as follows:

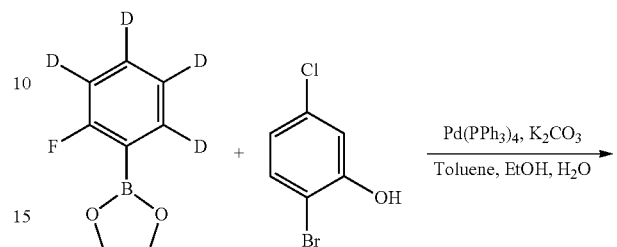
8-e    9-d

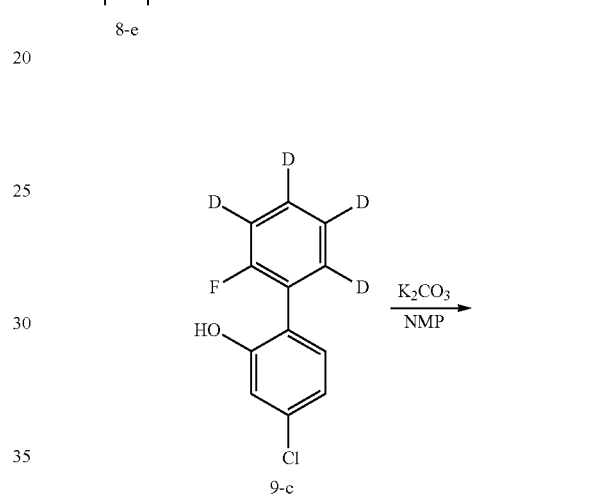
9-c

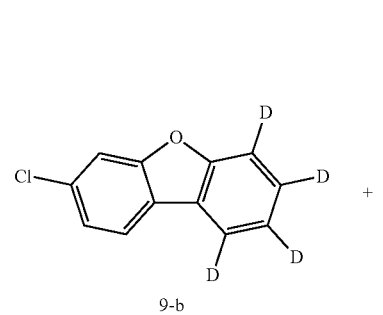
9-b

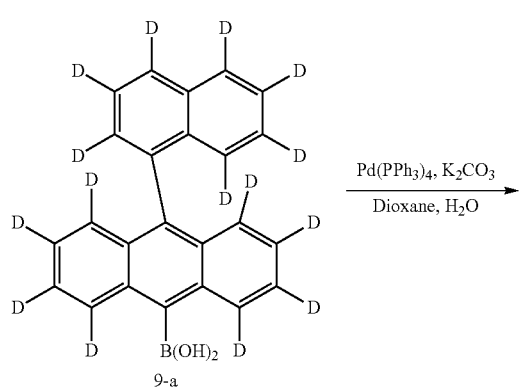
9-a

-continued

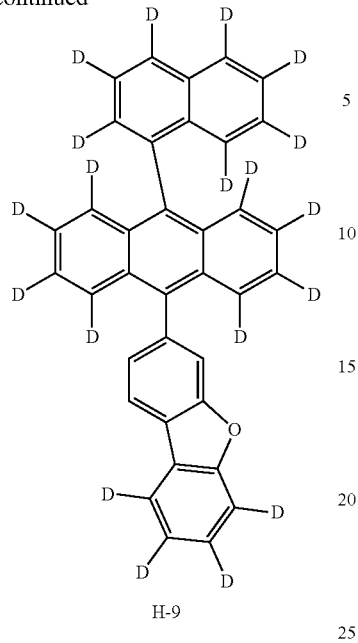
H-9

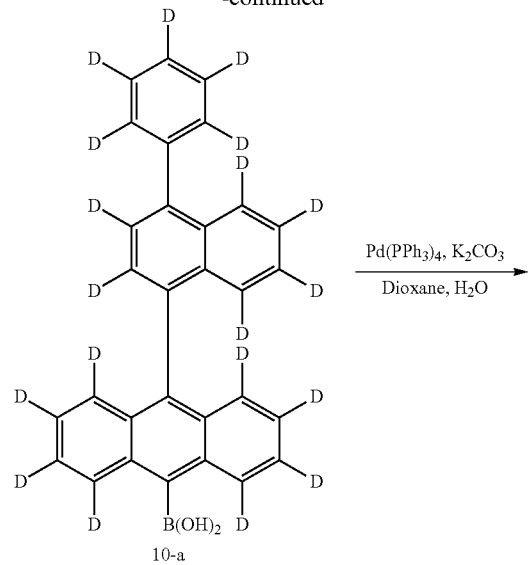
10-a

Referring to the synthesis method for Compound 1-c, 1-e was replaced with 8-e (2.26 g, 10 mmol) and 1-d was replaced with 9-d (2.07 g, 10 mmol) to obtain Compound 9-c (1.63 g, yield: 72%).

Referring to the synthesis method for Compound 1-b, 1-c was replaced with 9-c (2.27 g, 10 mmol) to obtain Compound 9-b (1.41 g, yield: 68%).

Referring to the synthesis method for Compound H-1, 1-b was replaced with 9-b (2.07 g, 10 mmol) and 1-a was replaced with 9-a (3.63 g, 10 mmol) to obtain Compound H-9 (3.38 g, yield: 69%), MS: m/z 489.29 [M+].

SYNTHESIS EXAMPLE 10

This synthesis example provided Compound H-10, and the synthesis route of the compound was as follows:

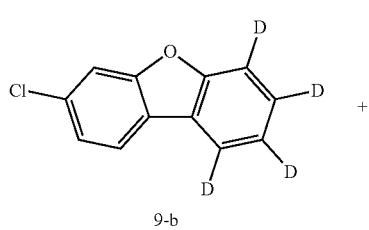
9-b

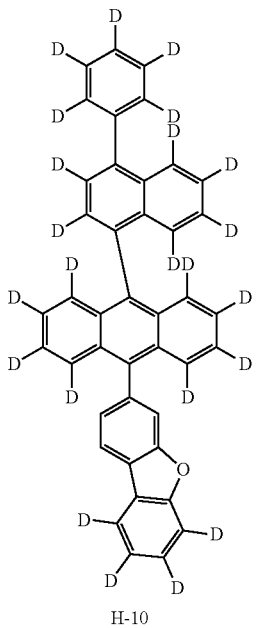
H-10

Referring to the synthesis method for Compound H-1, 1-b was replaced with 9-b (2.07 g, 10 mmol) and 1-a was replaced with 10-a (4.43 g, 10 mmol) to obtain Compound H-10 (3.99 g, yield: 70%), MS: m/z 569.34 [M+].

SYNTHESIS EXAMPLE 11

This synthesis example provided Compound H-11, and the synthesis route of the compound was as follows:

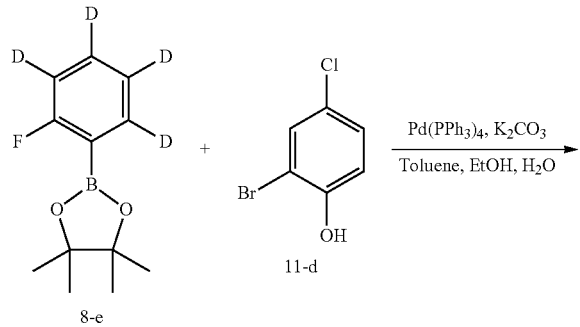

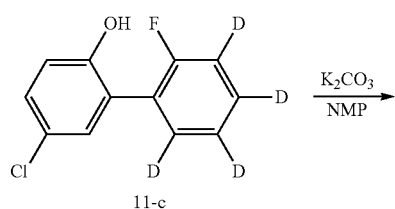

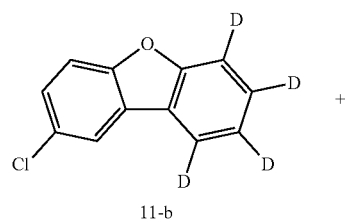

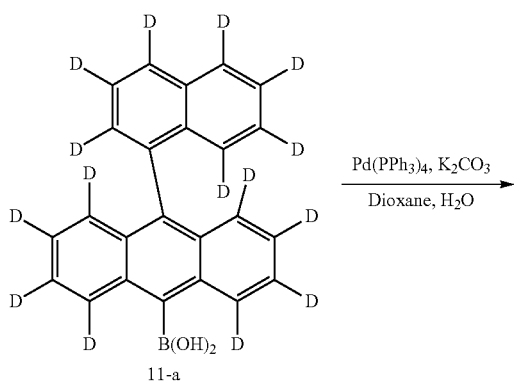

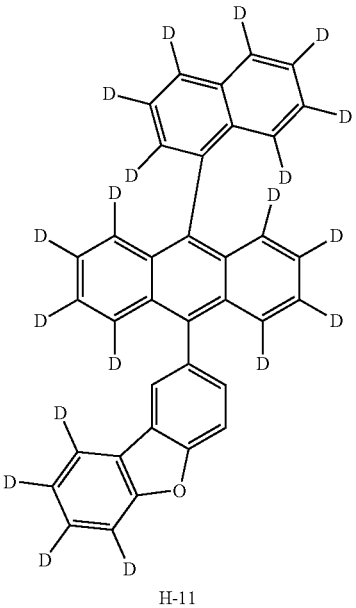

Referring to the synthesis method for Compound 1-c, 1-e was replaced with 8-e (2.26 g, 10 mmol) and 1-d was replaced with 11-d (2.07 g, 10 mmol) to obtain Compound 11-c (1.70 g, yield: 75%).

Referring to the synthesis method for Compound 1-b, 1-c was replaced with 11-c (2.27 g, 10 mmol) to obtain Compound 11-b (1.47 g, yield: 71%).

Referring to the synthesis method for Compound H-1, 1-b was replaced with 11-b (2.07 g, 10 mmol) and 1-a was replaced with 11-a (3.63 g, 10 mmol) to obtain Compound H-11 (3.62 g, yield: 74%), MS: m/z 489.29 [M+].

SYNTHESIS EXAMPLE 12

This synthesis example provided Compound H-12, and the synthesis route of the compound was as follows:

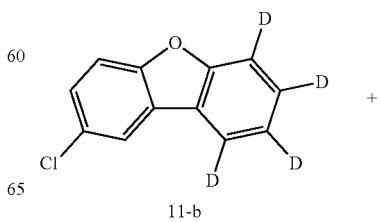

-continued
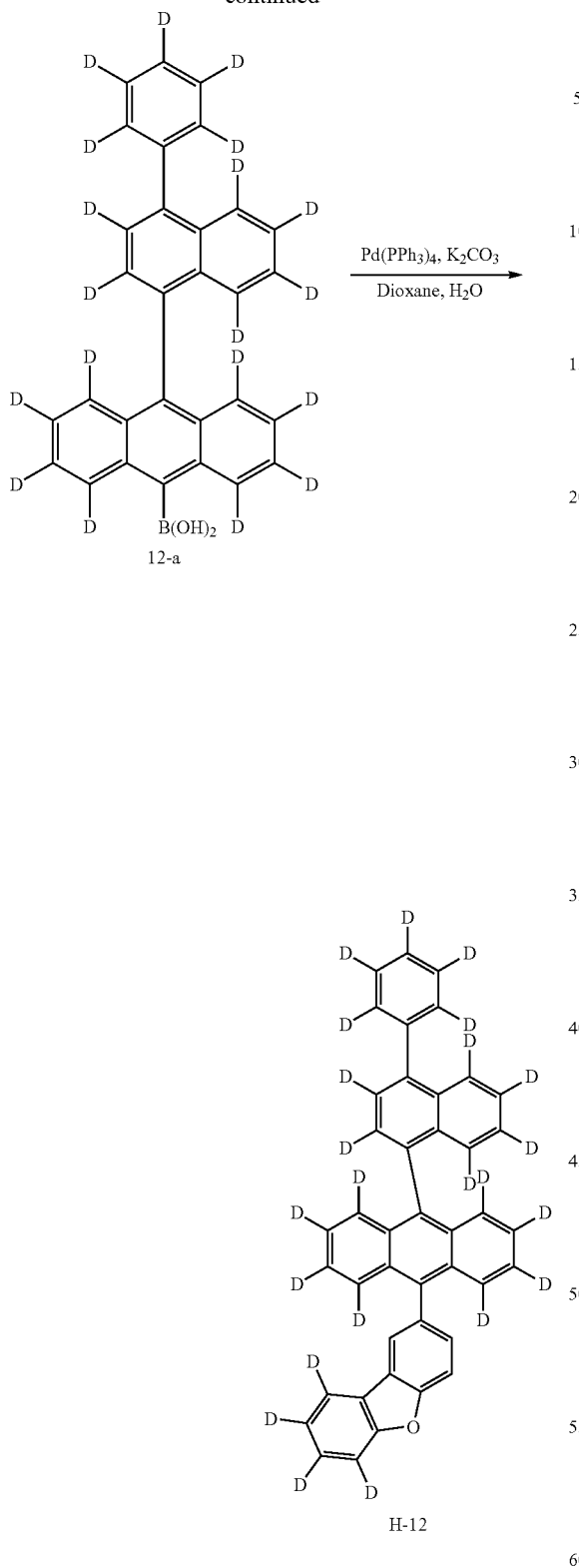
Referring to the synthesis method for Compound H-1, 1-b was replaced with 11-b (2.07 g, 10 mmol) and 1-a was replaced with 12-a (4.43 g, 10 mmol) to obtain Compound H-12 (4.10 g, yield: 72%), MS: m/z 569.34 [M+].
SYNTHESIS EXAMPLE 13
This synthesis example provided Compound H-13, and the synthesis route of the compound was as follows:
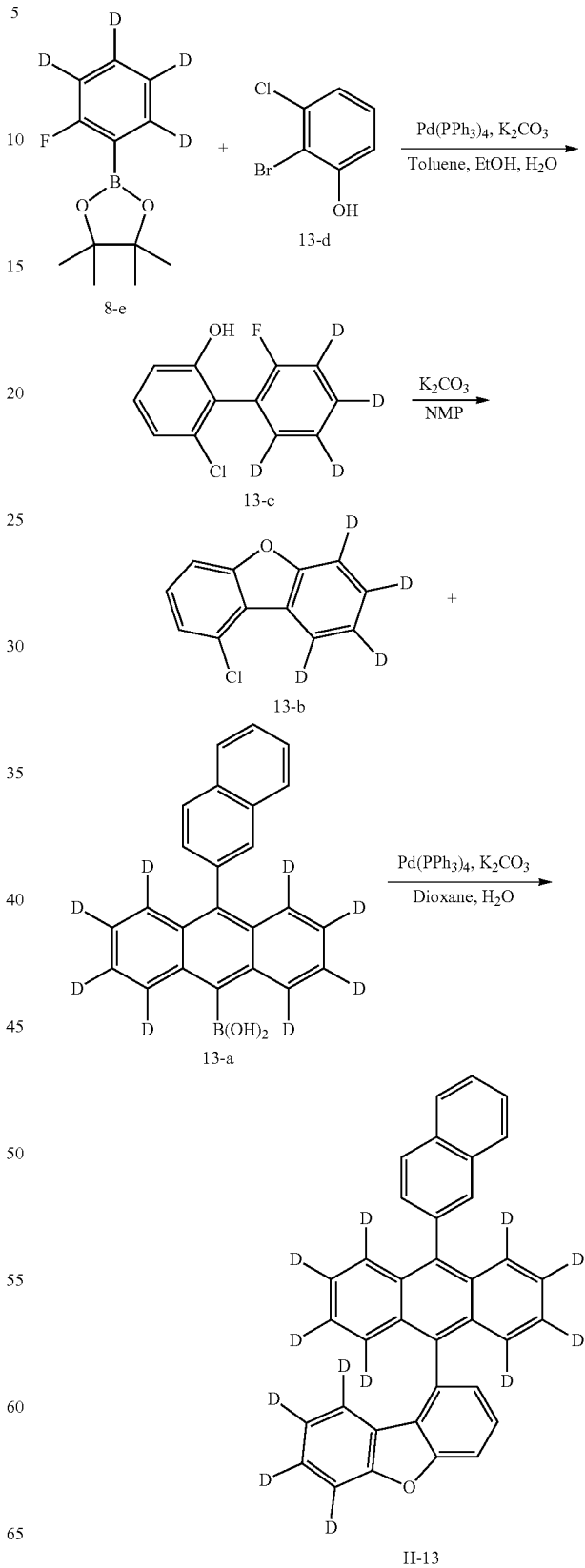

Referring to the synthesis method for Compound 1-c, 1-e was replaced with 8-e (2.26 g, 10 mmol) and 1-d was replaced with 13-d (2.07 g, 10 mmol) to obtain Compound 13-c (1.68 g, yield: 74%).

Referring to the synthesis method for Compound 1-b, 1-c was replaced with 13-c (2.27 g, 10 mmol) to obtain Compound 13-b (1.41 g, yield: 68%).

Referring to the synthesis method for Compound H-1, 1-b was replaced with 13-b (2.07 g, 10 mmol) and 1-a was replaced with 13-a (3.56 g, 10 mmol) to obtain Compound H-13 (3.23 g, yield: 67%), MS: m/z 482.24 [M+].

SYNTHESIS EXAMPLE 14

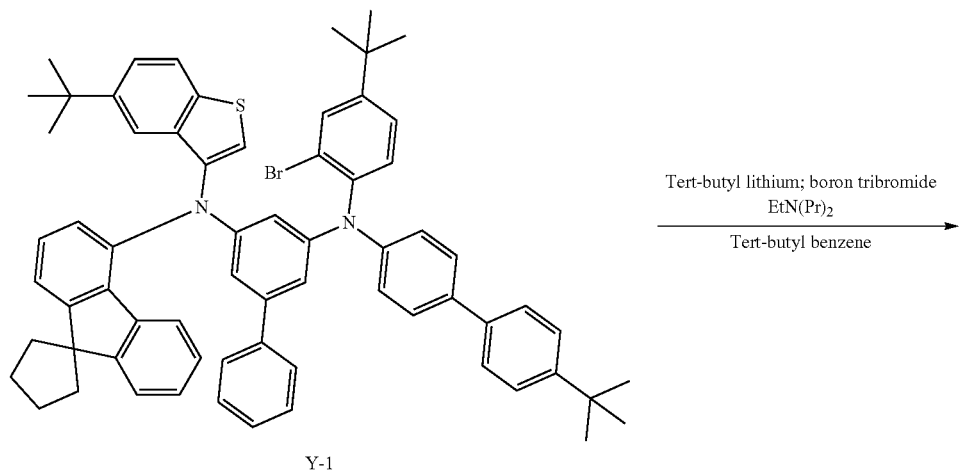

Y-1

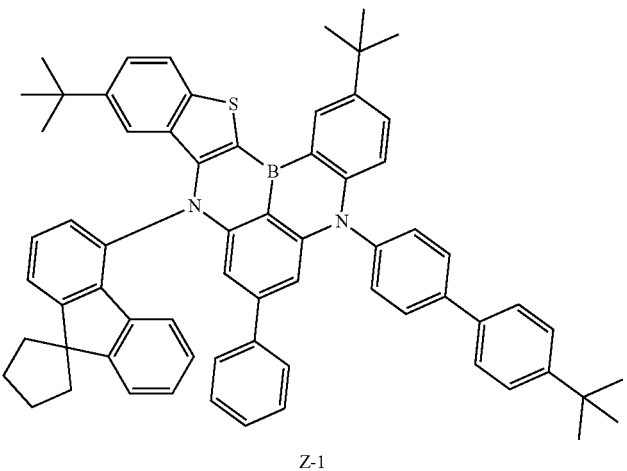

Z-1

Y-1 (10.10 g, 10 mmol) was added to tert-butyl benzene (125 ml). Under nitrogen protection, the mixture was then 0° C., and 12.4 ml of a 1.7M tert-butyl lithium pentane solution (21 mmol) was added. The mixture was warmed to 60° C., stirred for 2 h, and then further cooled to 0° C. 2.0 ml of boron tribromide (21 mmol) was added and stirred for 0.5 h. The mixture was then cooled to 0° C., 3.65 ml of N,N-diisopropylethylamine (21 mmol) was added, and the mixture was warmed to 60° C. and stirred for 2 h. After cooling to room temperature, the mixture was quenched by adding ice water and subjected to liquid separation. After the organic phase was filtered, water was removed by using anhydrous magnesium sulfate. After rotary evaporation to remove the organic solvent and subsequent recrystallization, Compound Z-1 (0.85 g, yield: 9%) was finally obtained, MS: m/z 938.48 [M+].

SYNTHESIS EXAMPLE 15

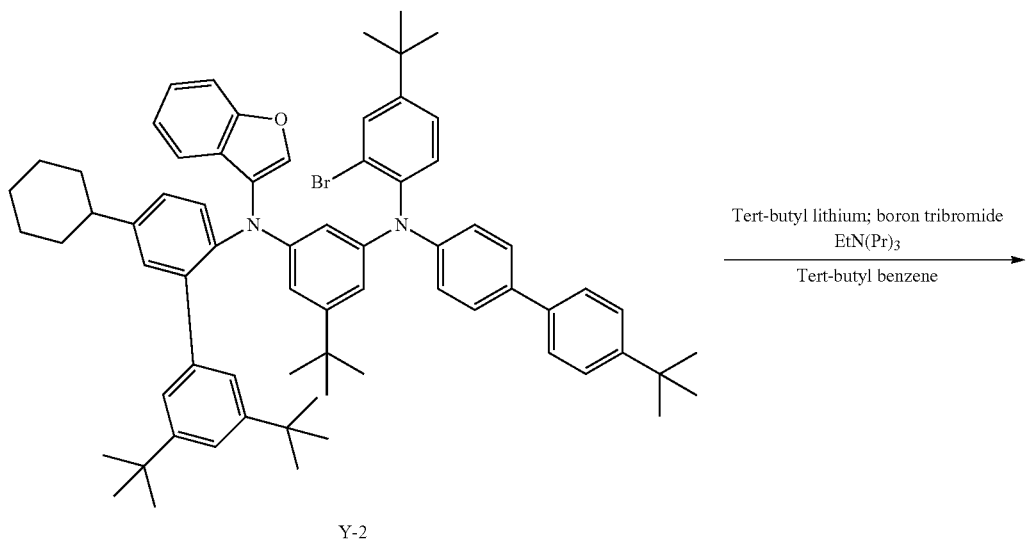

Y-2

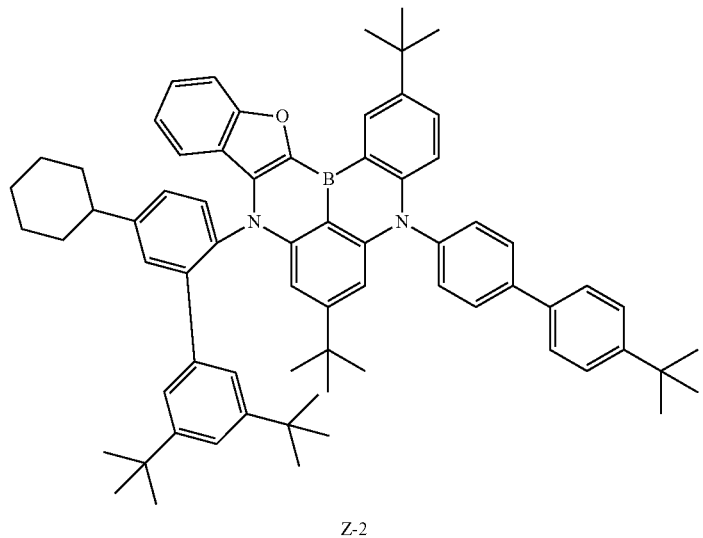

Z-2

Referring to the synthesis method for Compound Z-1, Y-1 was replaced with Y-2 (10.46 g, 10 mmol) to obtain Compound Z-2 (1.07 g, yield: 11%), MS: m/z 974.63 [M+].
SYNTHESIS EXAMPLE 16
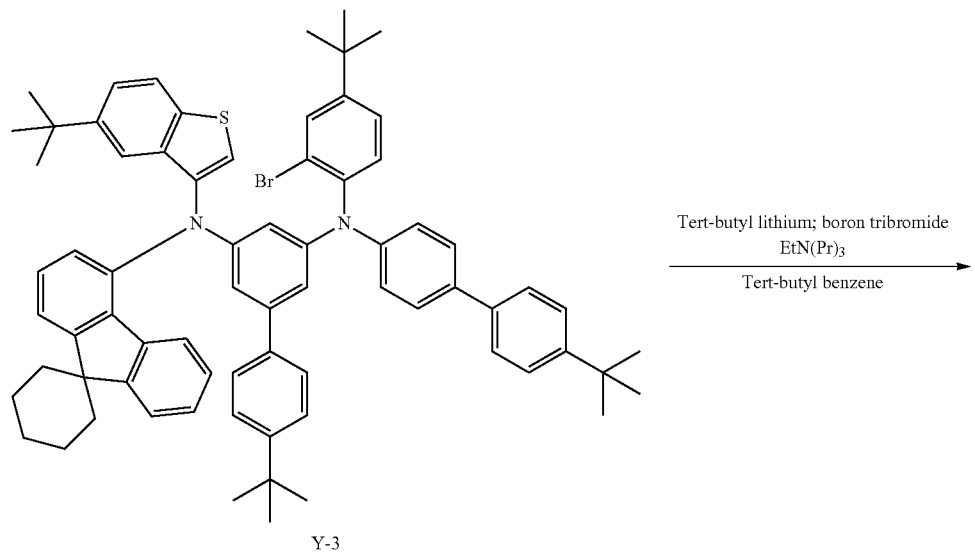
Y-3
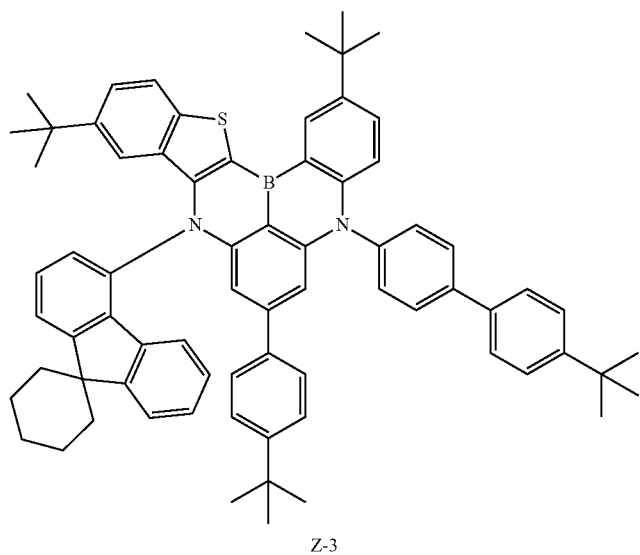
Z-3

Referring to the synthesis method for Compound Z-1, Y-1 was replaced with Y-3 (10.80 g, 10 mmol) to obtain Compound Z-3 (1.01 g, yield: 10%), MS: m/z 1008.56 [M+].
SYNTHESIS EXAMPLE 17
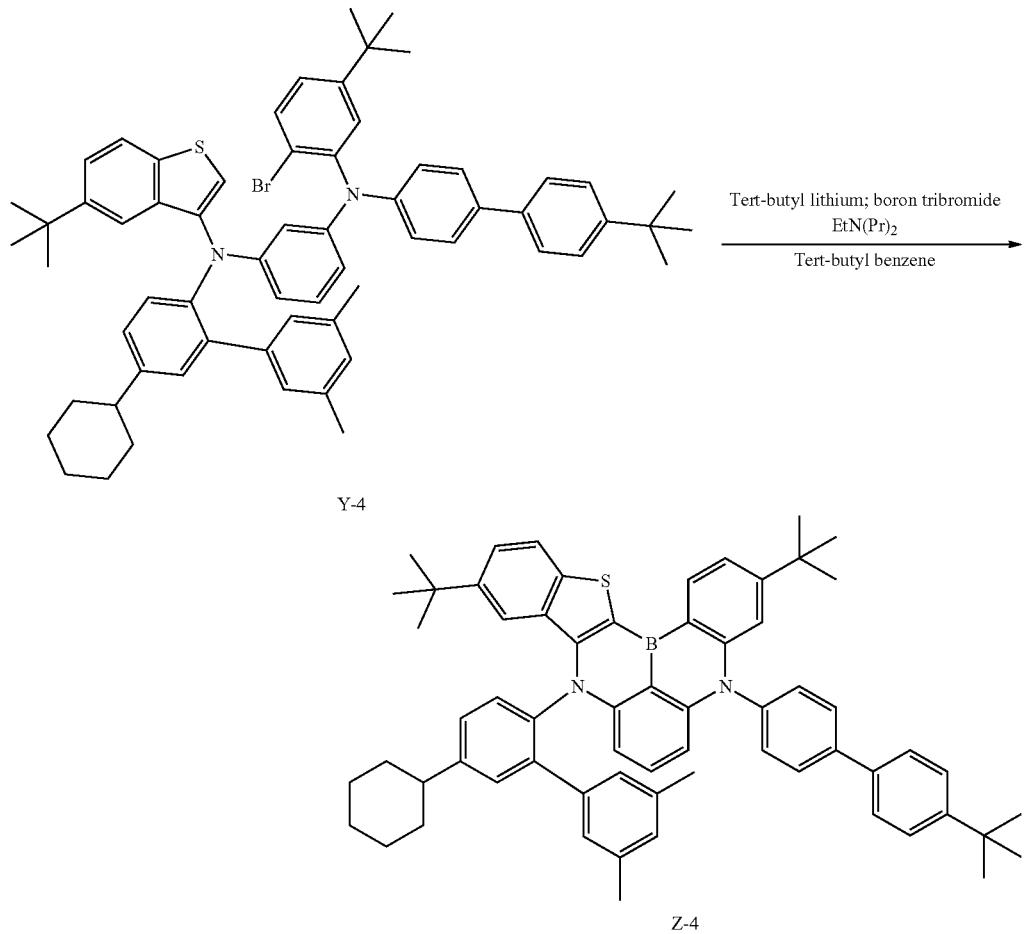
Referring to the synthesis method for Compound Z-1, Y-1 was replaced with Y-4 (9.48 g, 10 mmol) to obtain Compound Z-4 (0.73 g, yield: 8%), MS: m/z 906.51 [M+].
SYNTHESIS EXAMPLE 18
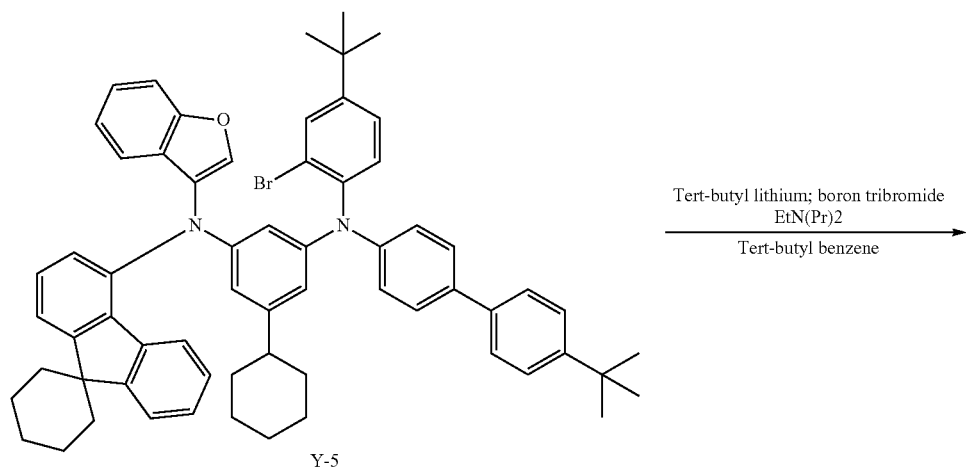

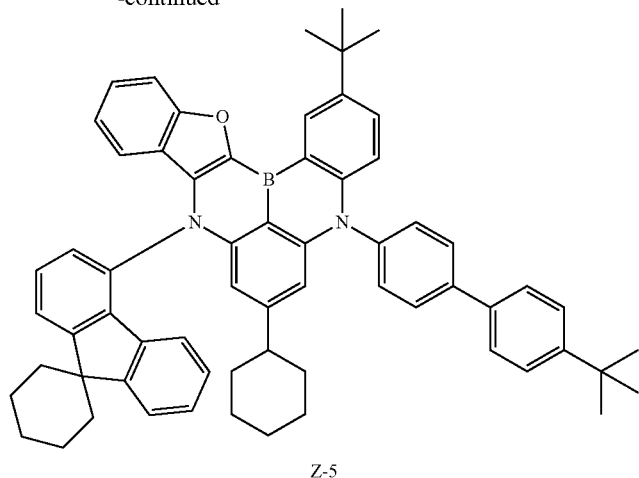
Z-5
Referring to the synthesis method for Compound Z-1, Y-1 was replaced with Y-5 (9.58 g, 10 mmol) to obtain Compound Z-5 (0.89 g, yield: 10%), MS: m/z 886.50 [M+].
SYNTHESIS EXAMPLE 19
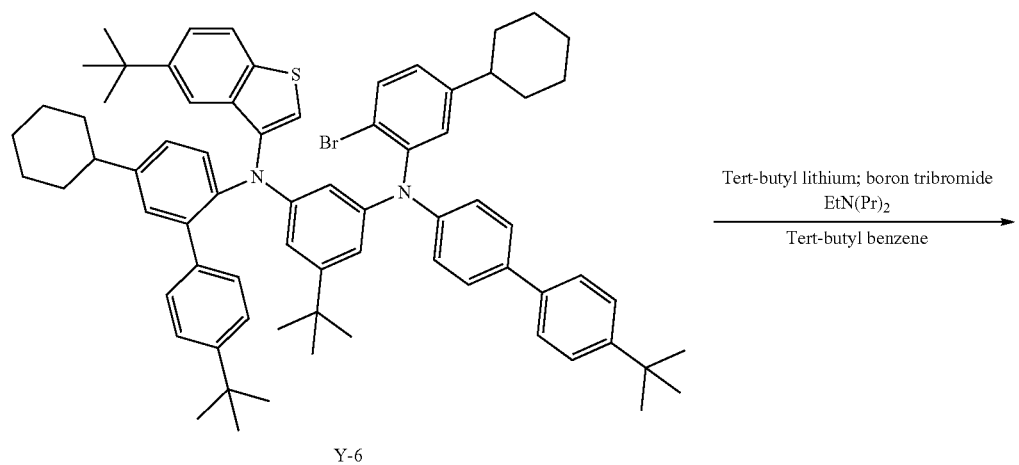
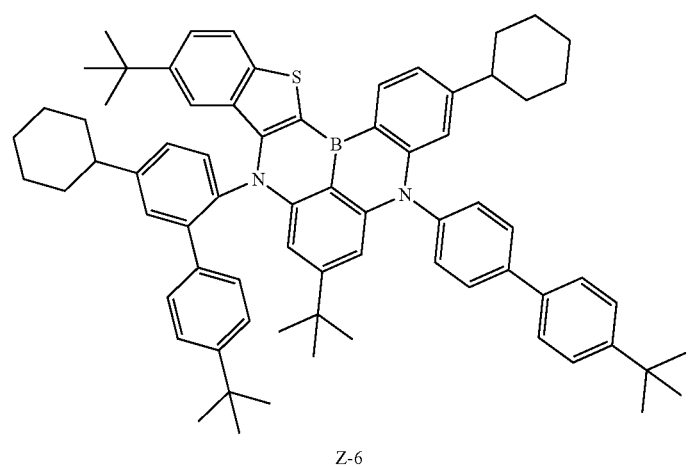
Z-6

Referring to the synthesis method for Compound Z-1, Y-1 was replaced with Y-6 (10.88 g, 10 mmol) to obtain Compound Z-6 (0.92 g, yield: 9%), MS: m/z 1016.62 [M+].
SYNTHESIS EXAMPLE 20
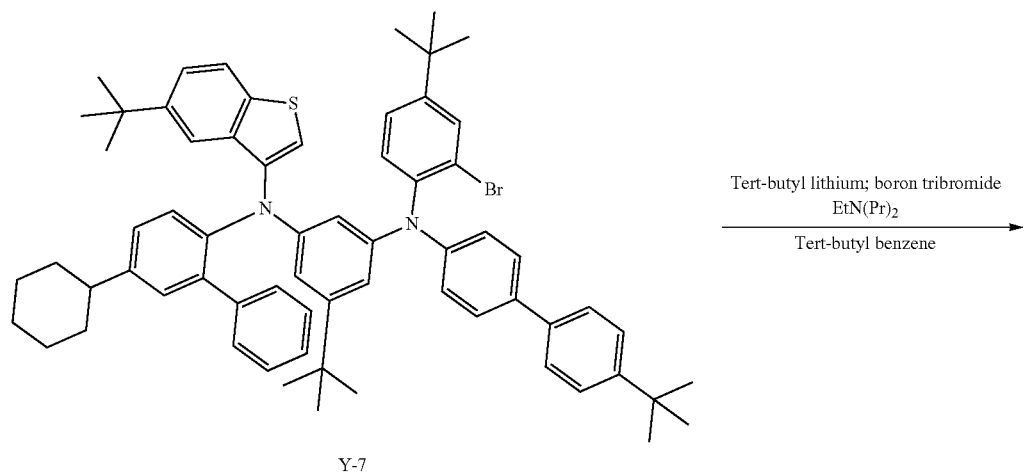
Y-7
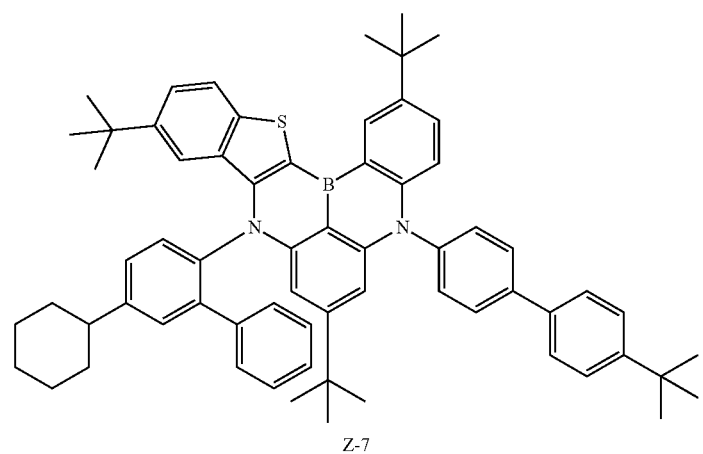
Z-7

Referring to the synthesis method for Compound Z-1, Y-1 was replaced with Y-7 (10.06 g, 10 mmol) to obtain Compound Z-7 (0.94 g, yield: 10%), MS: m/z 934.54 [M+].
SYNTHESIS EXAMPLE 21
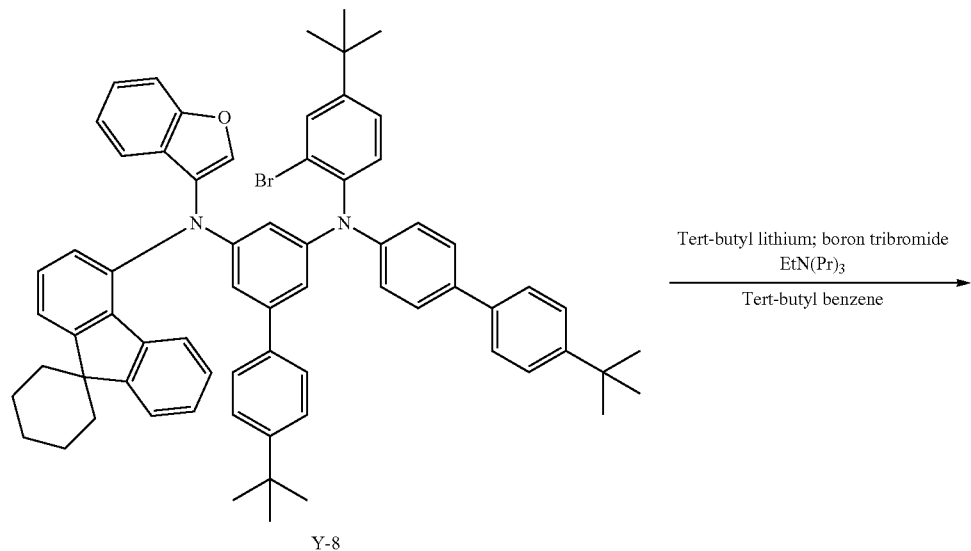
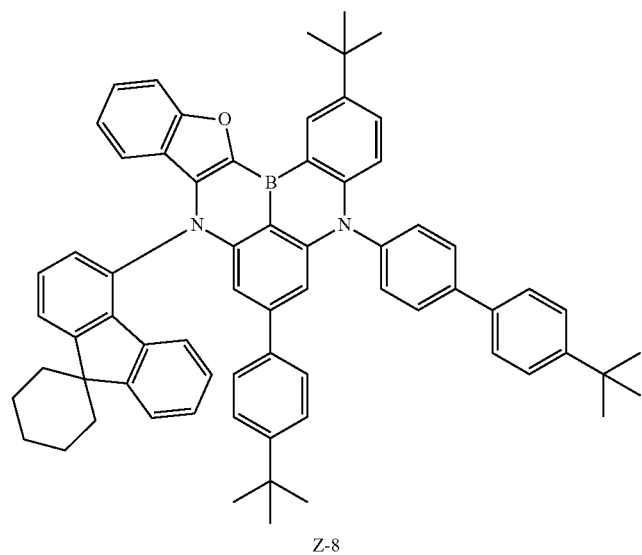

Referring to the synthesis method for Compound Z-1, Y-1 was replaced with Y-8 (10.08 g, 10 mmol) to obtain Compound Z-8 (0.84 g, yield: 9%), MS: m/z 936.52 [M+].
SYNTHESIS EXAMPLE 22
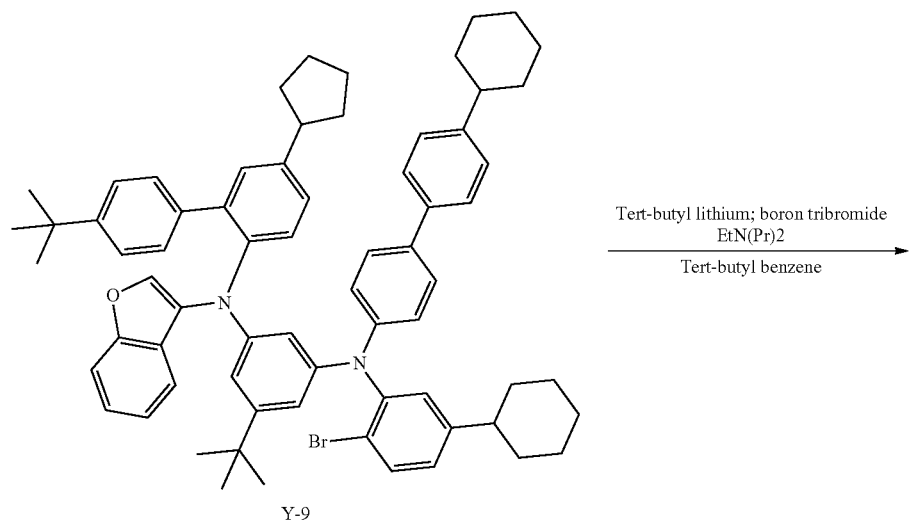
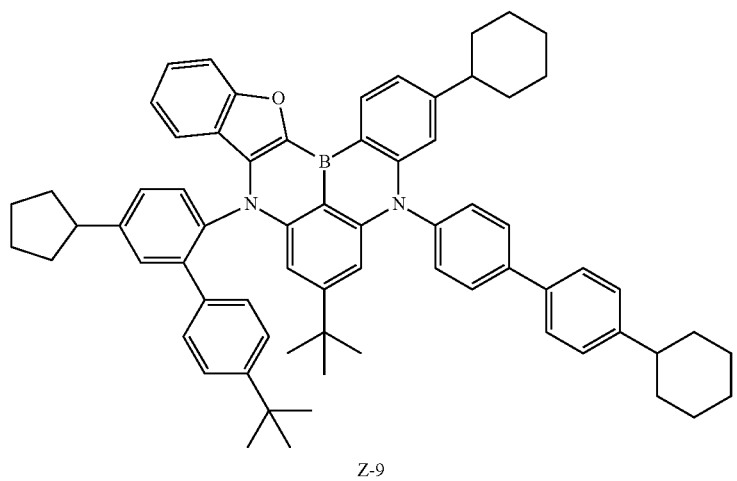

Referring to the synthesis method for Compound Z-1, Y-1 was replaced with Y-9 (10.28 g, 10 mmol) to obtain Compound Z-9 (1.05 g, yield: 11%), MS: m/z 956.58 [M+].

SYNTHESIS EXAMPLE 23

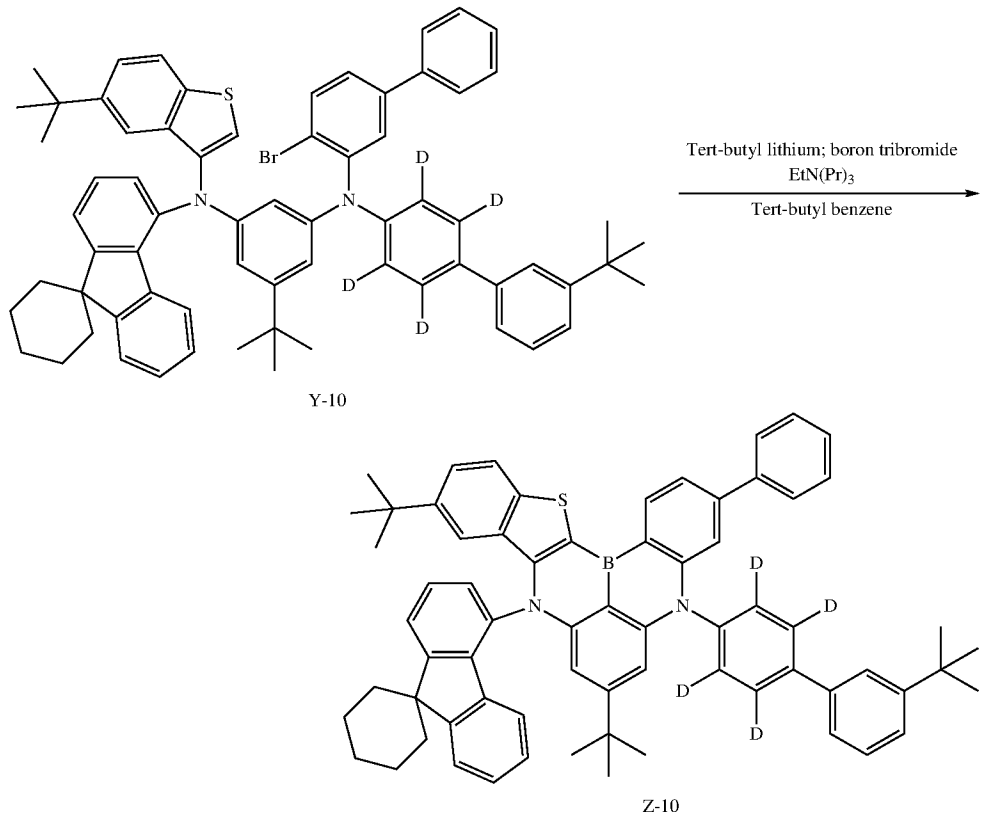

Referring to the synthesis method for Compound Z-1, Y-1 was replaced with Y-(10.28 g, 10 mmol) to obtain Compound Z-10 (1.05 g, yield: 11%), MS: m/z 956.52 [M+].
Properties of Composition In order to illustrate that the selected composition material of the present invention has unique advantages in the interaction between the host material and the guest material, the molecular structural characteristics of the host material and the guest material are respectively calculated. By means of Gaussian 09 W software and on the basis of a density functional theory (DFT) calculation method (the basis set level was set to b31yp/6-31g (d) and the charge number was 0), the molecular structure was subjected to geometry optimization, and the dipole moments $\mu_D$ and $\mu_A$ of the host material (BH) and the guest material (BD) in the ground state were respectively obtained according to the dipole-dipole interaction probability formula between the host material and the guest material:

$$p = \frac{\mu_D \mu_A}{R_{DA}^3}$$

in which $R_{DA}$ was the distance between the host material and the guest material. Due to the same doping concentration, the distance between the host material and the guest material was believed approximately the same. The orientations of the host material and the guest material were the same by default, and the probability p of the dipole-dipole interaction between the host material and the guest material was calculated.

In order to evaluate whether the device formed by the selected composition of the present invention generates a host luminescence phenomenon, the doping mass concentration proportion of the guest material was reduced to 1% according to the device preparation method, and the electroluminescence spectrum was tested. With a logarithmic scale used for the ordinate, whether there was a luminescence peak in the range of 400-440 nm was observed to evaluate whether there was a host luminescence phenomenon.

The composition of the present invention was tested by the above method. For comparison, BH-1 to BH-3 can be used as the host material and BD-1 to BD-3 can be used as the guest material. The performance test results of the composition were as shown in Table 1 below:

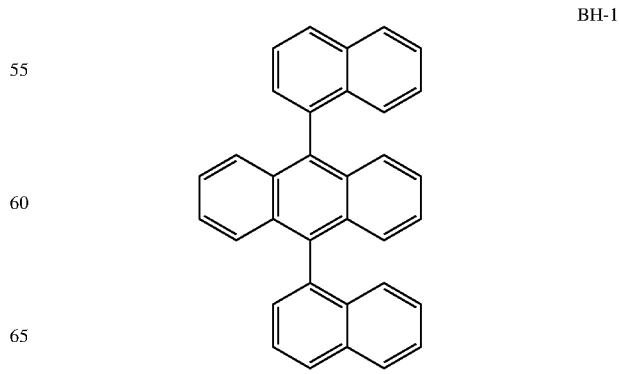

BH-1

BH-2

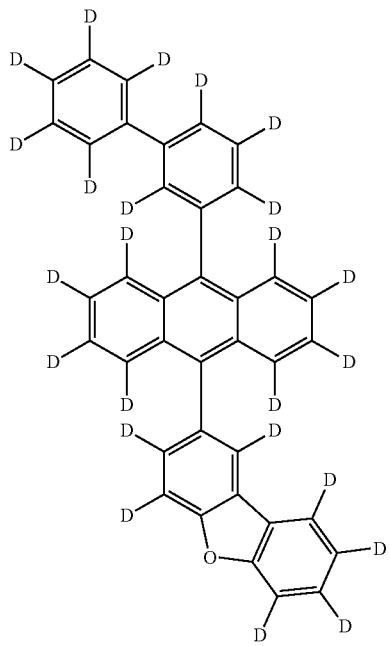

BH-3

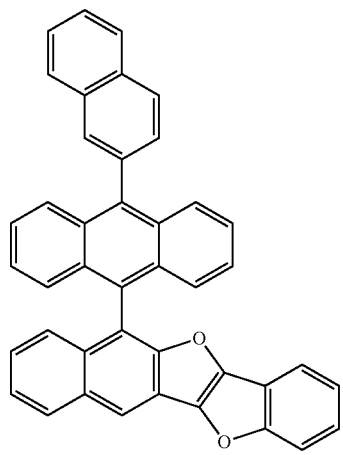

BD-1

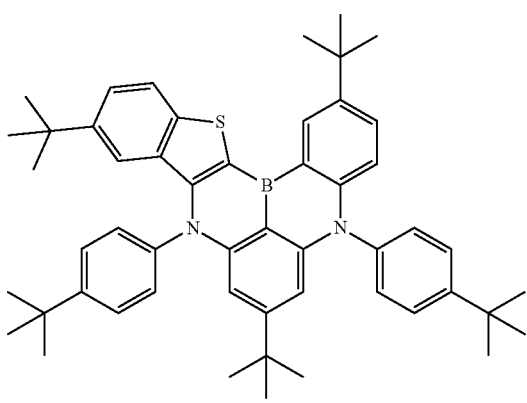

BD-2

BD-3

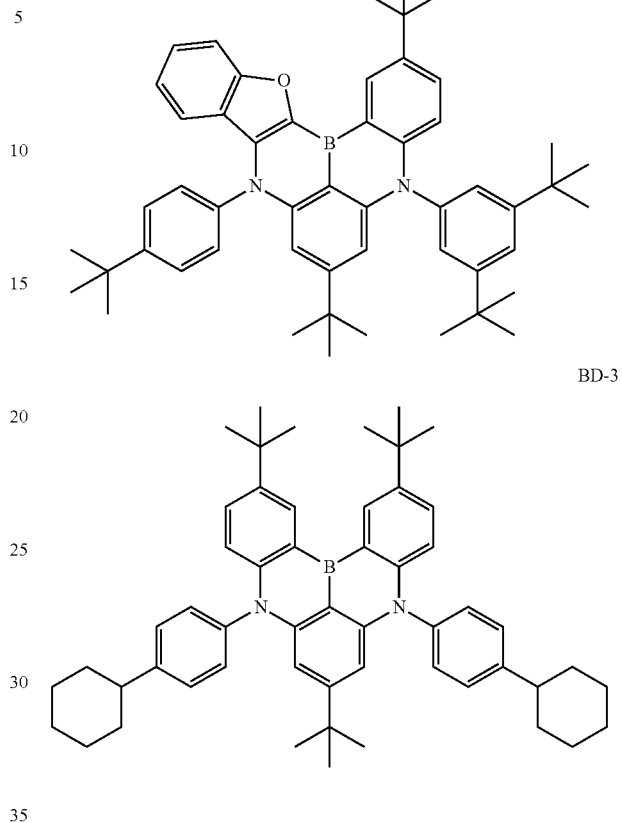

TABLE 1

Performance test results of compositions

| No. | Host material | Guest material | p | Any host luminescence phenomenon? |
|---|---|---|---|---|
| Example 1 | H-4 | Z-6 | 3.77 | No |
| Example 2 | H-4 | Z-1 | 3.65 | No |
| Example 3 | H-4 | Z-3 | 3.99 | No |
| Example 4 | H 4 | Z-4 | 3.66 | No |
| Example 5 | H-4 | Z-7 | 3.98 | No |
| Example 6 | H-4 | Z-10 | 3.85 | No |
| Example 7 | H-11 | Z-6 | 3.75 | No |
| Example 8 | H-11 | Z-1 | 3.69 | No |
| Example 9 | H-11 | Z-3 | 3.54 | No |
| Example 10 | H-11 | Z-4 | 3.87 | No |
| Example 11 | H-11 | Z-7 | 3.91 | No |
| Example 12 | H-11 | Z-10 | 3.61 | No |
| Example 13 | H-1 | Z-6 | 3.62 | No |
| Example 14 | H-5 | Z-1 | 4.01 | No |
| Example 15 | H-6 | Z-3 | 3.51 | No |
| Example 16 | H-7 | Z-4 | 3.77 | No |
| Example 17 | H-13 | Z-7 | 3.87 | No |
| Example 18 | H-2 | Z-10 | 3.59 | No |
| Example 19 | H-3 | Z-6 | 3.59 | No |
| Example 20 | H-9 | Z-1 | 3.79 | No |
| Example 21 | H-10 | Z-3 | 3.99 | No |
| Example 22 | H-12 | Z-4 | 3.55 | No |
| Example 23 | H-8 | Z-7 | 3.69 | No |
| Example 24 | H-4 | Z-2 | 3.60 | No |
| Example 25 | H-11 | Z-5 | 3.79 | No |
| Example 26 | H-4 | Z-8 | 3.99 | No |
| Example 27 | H-11 | Z-9 | 3.99 | No |
| Example 28 | H-1 | Z-2 | 3.86 | No |
| Example 29 | H-5 | Z-5 | 3.63 | No |
| Example 30 | H-6 | Z-8 | 3.90 | No |

TABLE 1-continued

Performance test results of compositions

| No. | Host material | Guest material | p | Any host luminescence phenomenon? |
|---|---|---|---|---|
| Example 31 | H-7 | Z-9 | 3.92 | No |
| Example 32 | H-13 | Z-2 | 3.55 | No |
| Example 33 | H-2 | Z-5 | 3.74 | No |
| Example 34 | H-3 | Z-8 | 3.79 | No |
| Example 35 | H-9 | Z-9 | 3.75 | No |
| Example 36 | H-10 | Z-2 | 3.54 | No |
| Example 37 | H-12 | Z-5 | 3.51 | No |
| Example 38 | H-8 | Z-8 | 3.78 | No |
| Comparative Example 1 | BH-1 | Z-6 | 0.79 | Yes |
| Comparative Example 2 | BH-2 | Z-6 | 3.34 | Yes |
| Comparative Example 3 | BH-3 | Z-6 | 3.47 | Yes |
| Comparative Example 4 | H-4 | BD-1 | 3.31 | No |
| Comparative Example 5 | H-4 | BD-2 | 3.26 | No |
| Comparative Example 6 | H-4 | BD-3 | 0.98 | Yes |
| Comparative Example 7 | BH-1 | BD-1 | 0.63 | Yes |

From the above results, it can be seen that the probabilities of dipole-dipole interactions between the host materials and the guest materials as provided by the present invention are all more than 3.5. This is because the host materials provided by the present invention contain an asymmetric structure and polar groups, so that the dipole moments of the host materials provided by the present invention are significantly increased, and the guest materials provided by the present invention contain a benzothiophene moiety and a cycloalkyl moiety, so that the polarity thereof can be ensured to be more appropriate, so as to avoid an excessively small influence by the host materials due to an excessively small polarity and also increased intermolecular aggregation due to an excessively large polarity.

Moreover, it can be seen that the composition of the present invention still does not exhibit a host luminescence phenomenon when the doping proportion is low, indicating that there is a relatively good energy transmission between the host material and the guest material in the composition of the present invention, which is beneficial to the improvement of efficiency.

Manufacturing and Characterization of OLEDs

DEVICE EXAMPLE

The organic electroluminescent device provided by the present invention comprised an anode, a hole transport region, a luminescent layer, an electron transport region, and a cathode, which were arranged in this order on a substrate plate.

Furthermore, the hole transport region comprised a hole injection layer, a hole transport layer, and a luminescent auxiliary layer; and the electron transport region comprised an electron transport layer and an electron injection layer.

Furthermore, the luminescent layer was composed of a host material and a guest material, wherein the host material of the luminescent layer can be composed of one molecular material or a plurality of molecular materials.

The composition of the present invention can be used for the luminescent layer of the above organic electroluminescent device.

The anode in the example was made of an anode material commonly used in the art, such as ITO, Ag or a multilayer structure thereof. The hole injection layer was made of a hole injection material commonly used in the art and was doped with F4TCNQ, HATCN, NDP-9, etc. The hole transport layer was made of a hole transport material commonly used in the art. For the luminescent layer, the host and guest material compositions provided in the present invention were used. The electron transport layer was made of an electron transport material commonly used in the art. For the electron injection layer, electron injection materials commonly used in the art, such as Liq, LiF or Yb were used. For the cathode, materials commonly used in the art were used, such as the metals Al, Ag or metal mixtures (Ag-doped Mg, Ag-doped Ca, etc.).

The electrode preparation method and the deposition method for each functional layer in this example were all conventional methods in the art, such as vacuum thermal evaporation or ink-jet printing. No more detailed repetition would be given here, and only some process details and test methods in the preparation process were supplemented as follows:

Device Example 1

This example provided a blue-light organic electroluminescent device, the preparation method of which was as follows: firstly, on an ITO layer (anode) formed on a substrate, HTL-01 and p-dopant-01 (at a mass ratio of HTL-01 to p-dopant-01 of 97:3) were deposited in vacuo to a thickness of 10 nm to form a hole injection layer; secondly, on the above hole injection layer, HTL-01 was deposited in vacuo to a thickness of 120 nm to form a hole transport layer; thirdly, on the above hole transport layer, B prime-01 was deposited in vacuo to a thickness of 5 nm to form a luminescent auxiliary layer; again, on the above luminescent auxiliary layer, a composition of H-4 and Z-6 was deposited in vacuo to a thickness of 20 nm to form a luminescent layer, wherein H-4 acted as a host material and Z-6 acted as a guest material, with the mass ratio of the host material to the guest material being 98:2; next, on the above luminescent layer, HBL-01 was deposited in vacuo to a thickness of 5 nm to form a hole barrier layer; a mixture of ET-01 and Liq (at a mass ratio of 1:1) was deposited in vacuo to a thickness of 30 nm to form an electron transport layer; then, on the above electron transport layer, LiF was deposited to a thickness of 0.2 nm to form an electron injection layer; and finally, on the above electron injection layer, aluminum (Al) was deposited with a thickness of 150 nm to form a cathode, thereby preparing a blue-light organic electroluminescent device.

The molecular structural formulas of the materials in the remaining layers other than the host and guest materials in the luminescent layer were as follows:

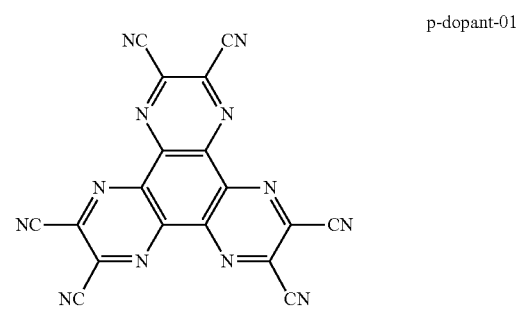

p-dopant-01

-continued

HTL-01

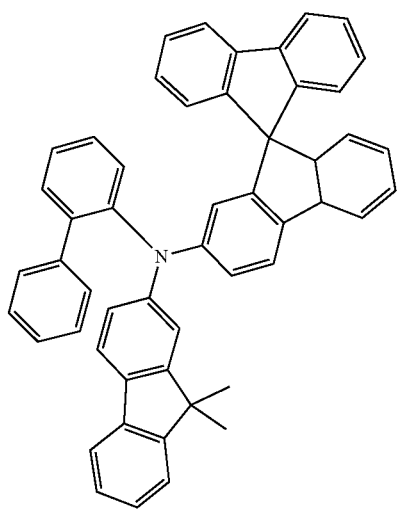

B prime-01

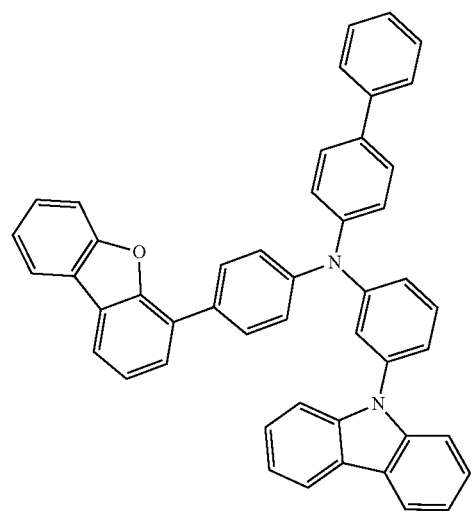

HBL-01

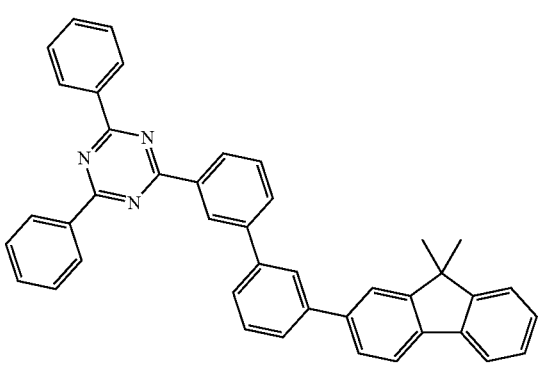

Liq

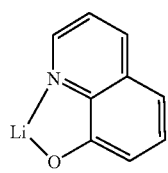

-continued

ET-01

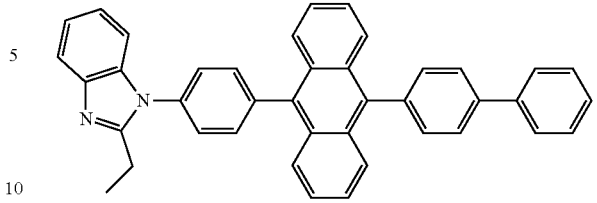

Device Examples 2-38

Using the above method, the compositions described in the other examples in Table 1 were manufactured into organic electroluminescent devices. The composition of H-4 and Z-6 in Device Example 1 was replaced by the host and guest material compositions shown in the examples in Table 1, respectively, to make blue-light organic electroluminescent devices of Examples 2-38.

Devices of Comparative Examples 1-7

Using the above method, the compositions described in the comparative examples in Table 1 were manufactured into organic electroluminescent devices, and the composition of H-4 and Z-6 in Device Example 1 was replaced by the host and guest material compositions shown in the comparative examples in Table 1, respectively, to make blue-light organic electroluminescent devices of Comparative Examples 1-7.

The OLED devices described above were tested by means of a standard method. In this regard, the organic electroluminescent devices were measured at a current density of $J=10$ mA/cm$^2$ for a driving voltage, brightness, electroluminescent current efficiency (in cd/A), and External Quantum Efficiency (EQE, in %), calculated as a function of luminous density, from the current/voltage/luminous density characteristic curves (IVL characteristic curves) showing Lambertian emission characteristics. The lifetime LT was defined as the time till the brightness of the device was deduced to a specific proportion $L_1$ of its initial value $L_0$, while operating at a constant current J. For example, the expressions 50 mA/cm$^2$ and LT90 mean that the time LT till the brightness of the device was deduced to 90% of the initial value $L_0$ while operating at 50 mA/cm$^2$. Similarly, the expressions 20 mA/cm$^2$ and LT80 mean that the time LT till the brightness of the device was deduced to 80% of the initial value $L_0$ while operating at 20 mA/cm$^2$.

The data of these OLED devices were summarized in Table 2. The parameters of the examples were compared with those of the comparative examples, and the performance data of these OLED devices were exhibited.

The test instruments and methods for testing the performance of the OLED devices of the above examples and comparative examples were as follows:

the brightness was tested by means of spectrum scanner PhotoResearch PR-635;

the current density and turn-on voltage were tested by digital SourceMeter Keithley 2400; and lifetime test: LT-96ch lifetime test device was used.

The performance test results of the above devices were listed in Table 2.

TABLE 2

Performance test results of blue-light devices

| Device | Host material | Guest material | VOP/ (V) | EQE/ (%) | 10 mA/cm² LT95/(h) | Light color |
|---|---|---|---|---|---|---|
| Device Example 1 | H-4 | Z-6 | 3.60 | 6.73 | 329 | Blue |
| Device Example 2 | H-4 | Z-1 | 3.63 | 6.70 | 322 | Blue |
| Device Example 3 | H-4 | Z-3 | 3.60 | 6.73 | 326 | Blue |
| Device Example 4 | H-4 | Z-4 | 3.60 | 6.71 | 326 | Blue |
| Device Example 5 | H-4 | Z-7 | 3.61 | 6.70 | 326 | Blue |
| Device Example 6 | H-4 | Z-10 | 3.62 | 6.70 | 322 | Blue |
| Device Example 7 | H-11 | Z-6 | 3.60 | 6.73 | 329 | Blue |
| Device Example 8 | H-11 | Z-1 | 3.61 | 6.72 | 323 | Blue |
| Device Example 9 | H-11 | Z-3 | 3.60 | 6.72 | 328 | Blue |
| Device Example 10 | H-11 | Z-4 | 3.63 | 6.72 | 325 | Blue |
| Device Example 11 | H-11 | Z-7 | 3.61 | 6.71 | 323 | Blue |
| Device Example 12 | H-11 | Z-10 | 3.63 | 6.73 | 325 | Blue |
| Device Example 13 | H-1 | Z-6 | 3.64 | 6.66 | 314 | Blue |
| Device Example 14 | H-5 | Z-1 | 3.64 | 6.66 | 314 | Blue |
| Device Example 15 | H-6 | Z-3 | 3.65 | 6.69 | 308 | Blue |
| Device Example 16 | H-7 | Z-4 | 3.68 | 6.68 | 312 | Blue |
| Device Example 17 | H-13 | Z-7 | 3.68 | 6.68 | 312 | Blue |
| Device Example 18 | H-2 | Z-10 | 3.66 | 6.68 | 316 | Blue |
| Device Example 19 | H-3 | Z-6 | 3.64 | 6.66 | 316 | Blue |
| Device Example 20 | H-9 | Z-1 | 3.64 | 6.68 | 321 | Blue |
| Device Example 21 | H-10 | Z-3 | 3.65 | 6.68 | 315 | Blue |
| Device Example 22 | H-12 | Z-4 | 3.64 | 6.66 | 321 | Blue |
| Device Example 23 | H-8 | Z-7 | 3.71 | 6.68 | 319 | Blue |
| Device Example 24 | H-4 | Z-2 | 3.64 | 6.63 | 316 | Blue |
| Device Example 23 | H-11 | Z-5 | 3.65 | 6.64 | 319 | Blue |
| Device Example 26 | H-4 | Z-8 | 3.65 | 6.63 | 319 | Blue |
| Device Example 27 | H-11 | Z-9 | 3.64 | 6.62 | 316 | Blue |
| Device Example 28 | H-1 | Z-2 | 3.71 | 6.58 | 302 | Blue |
| Device Example 29 | H.5 | Z-5 | 3.73 | 6.59 | 304 | Blue |
| Device Example 30 | H-6 | Z-8 | 3.74 | 6.59 | 302 | Blue |
| Device Example 31 | H-7 | Z-9 | 3.71 | 6.59 | 301 | Blue |
| Device Example 32 | H-13 | Z-2 | 3.70 | 6.59 | 307 | Blue |
| Device Example 33 | H-2 | Z-5 | 3.74 | 6.57 | 311 | Blue |
| Device Example 34 | H-3 | Z-8 | 3.70 | 6.57 | 312 | Blue |
| Device Example 35 | H-9 | Z-9 | 3.69 | 6.59 | 311 | Blue |
| Device Example 36 | H-10 | Z-2 | 3.73 | 6.56 | 308 | Blue |
| Device Example 37 | H-12 | Z-5 | 3.73 | 6.57 | 309 | Blue |
| Device Example 38 | H-8 | Z-8 | 3.76 | 6.55 | 309 | Blue |
| Device of Comparative Example 1 | BH-1 | Z-6 | 4.04 | 5.92 | 129 | Blue |
| Device of Comparative Example 2 | BH-2 | Z-6 | 3.94 | 5.93 | 193 | Blue |
| Device of Comparative Example 3 | BH3 | Z-6 | 3.99 | 3.92 | 136 | Blue |
| Device of Comparative Example4 | H-4 | BD-1 | 3.74 | 5.67 | 202 | Blue |
| Device of Comparative Example 5 | H-4 | BD.2 | 3.76 | 5.62 | 198 | Blue |
| Device of Comparative Example 6 | H-4 | BD-3 | 3.79 | 5.51 | 195 | Blue |
| Device of Comparative Example 7 | BH-1 | BD-1 | 4.11 | 5.01 | 100 | Blue |

From the device performance test results in Table 2 above, it can be seen that when the compositions of the present invention were used in organic electroluminescent devices, the voltages thereof were all decreased, and the efficiencies and lifetimes were significantly improved as compared with the comparative examples. This is because the present invention makes full use of the interaction between the host material and the guest material and the combination of different host materials by rational selection of the host material and the guest material, so that the final device of the present invention shows obvious advantages.

Obviously, the above examples of the present invention are only examples for clearly explaining the present invention and are not intended to limit the embodiments of the present invention. For those of ordinary skill in the art, other changes or variations in different forms may also be made on the basis of the above description. It is impossible to exhaust all the embodiments herein, and all derived obvious changes or variations that belong to the technical solution of the present invention still fall within the scope of protection of the present invention.

We claim:

1. A blue luminescent composition, characterized in that the blue luminescent composition comprises a compound with a general structural formula as represented by Formula I and a compound with a general structural formula as represented by Formula II:

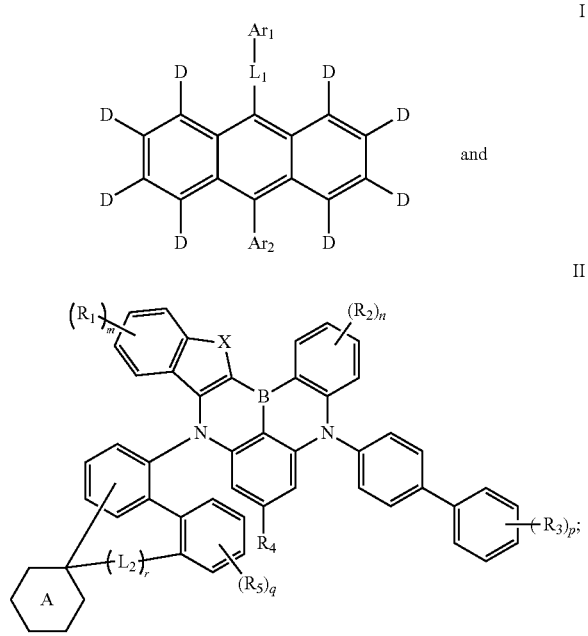

wherein in the Formula I,
$Ar_1$ represents one of a deuterium-substituted or unsubstituted phenyl group, a deuterium-substituted or unsubstituted naphthyl group, a deuterium-substituted or unsubstituted phenanthryl group, or a deuterium-substituted or unsubstituted pyrenyl group;
$L_1$ represents one of a single bond, a deuterium-substituted or unsubstituted phenylene group, and a deuterium-substituted or unsubstituted naphthylene group;

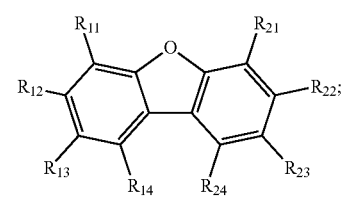

$Ar_2$ represents
$R_{11}$ to $R_{14}$ and $R_{21}$ to $R_{24}$ each independently represent hydrogen or deuterium;
any one of $R_{11}$ to $R_{14}$ and $R_{21}$ to $R_{24}$ is bonded to the anthracene structure in Formula I; and
when any one of $R_{11}$ to $R_{14}$ is selected from deuterium, none of $R_{21}$ to $R_{24}$ is selected from deuterium; when none of $R_{11}$ to $R_{14}$ is selected from deuterium, at least one of $R_{21}$ to $R_{24}$ is selected from deuterium; and when any one of $R_{11}$ to $R_{14}$ and $R_{21}$ to $R_{24}$ is selected from deuterium, hydrogens in the same benzene ring to which the deuterium belongs are all replaced by deuterium; and in Formula II, ring A represents a substituted or unsubstituted cycloalkyl group with a carbon atom number of 3 to 10; and La represents a single bond;

$R_1$, $R_2$, $R_3$, and $R_5$ each independently represent any one of hydrogen, deuterium, halogen, a substituted or unsubstituted alkyl group with a carbon atom number of 1 to 30, a substituted or unsubstituted alkenyl group with a carbon atom number of 2 to 30, a substituted or unsubstituted cycloalkyl group with a carbon atom number of 3 to 30, a substituted or unsubstituted aryl group with a carbon atom number of 6 to 60, a substituted or unsubstituted heteroaryl group with a carbon atom number of 5 to 60, a substituted or unsubstituted fused cyclic aryl group with a carbon atom number of 5 to 60, a substituted or unsubstituted fused cyclic heteroaryl group with a carbon atom number of 5 to 60, and a substituted or unsubstituted amino group; two or more of $R_1$, $R_2$, $R_3$, and $R_5$ can be connected to each other to form a cyclic structure;

$R_4$ represents any one of hydrogen, deuterium, halogen, a substituted or unsubstituted alkyl group with a carbon atom number of 1 to 30, a substituted or unsubstituted alkoxy group with a carbon atom number of 1 to 30, a substituted or unsubstituted cycloalkyl group with a carbon atom number of 3 to 30, a substituted or unsubstituted aryl group with a carbon atom number of 6 to 60, a substituted or unsubstituted heteroaryl group with a carbon atom number of 5 to 60, a substituted or unsubstituted fused cyclic aryl with a carbon atom number of 5 to 60, a substituted or unsubstituted fused cyclic heteroaryl with a carbon atom number of 5 to 60, and a substituted or unsubstituted amino group;

X represents O or S;

m, n, and q each independently represent 0, 1, 2, 3, or 4; when m represents 2, 3, or 4, $R_1$ can be the same or different; when n represents 2, 3, or 4, $R_2$ can be the same or different; and when q represents 2, 3, or 4, $R_5$ can be the same or different;

p represents 0, 1, 2, 3, 4, or 5; and when p represents 2, 3, 4, or 5, $R_5$ can be the same or different;

r represents 0 or 1;

substituents in ring A, $R_1$, $R_2$, $R_3$, $R_4$, and $R_5$ can be the same or different and are each independently selected from one of deuterium, halogen, cyano, an alkyl group with a carbon atom number of 1 to 10, an aryl group with a carbon atom number of 6 to 60, a heteroaryl group with a carbon atom number of 5 to 60, a fused cyclic aryl group with a carbon atom number of 5 to 60, a cycloalkyl group with a carbon atom number of 3 to 30, and amino, wherein two or more of the substituents can be connected to each other to form an aliphatic ring, an aromatic ring, or a fused ring; and in Formulas I and II, any hydrogen can be replaced by deuterium, any nitrogen can be replaced by $^{15}N$, any sulfur can be replaced by $^{33}S$, $^{34}S$, or $^{36}S$, any oxygen can be replaced by $^{17}O$ or $^{18}O$, any carbon can be replaced by $^{13}C$, and any boron can be replaced by $^{11}B$.

2. The blue luminescent composition according to claim 1, characterized in that when $L_1$ represents a single bond, $Ar_1$ represents one of a deuterium-substituted or unsubstituted phenyl group, a deuterium-substituted or unsubstituted naphthyl group, a deuterium-substituted or unsubstituted phenanthryl group, and a deuterium-substituted or unsubstituted pyrenyl group;

when $L_1$ represents phenylene, $Ar_1$ represents phenyl or naphthyl;

when $L_1$ represents a deuterium-substituted phenylene group, $Ar_1$ represents a deuterium-substituted phenyl group or a deuterium-substituted naphthyl group;

when $L_1$ represents naphthylene, $Ar_1$ represents phenyl; and when $L_1$ represents a deuterium-substituted naphthylene group, $Ar_1$ represents a deuterium-substituted phenyl group.

3. The blue luminescent composition according to claim 1, characterized in that $Ar_2$ is selected from one of structures represented by Formulas A-1 to A-8 below:

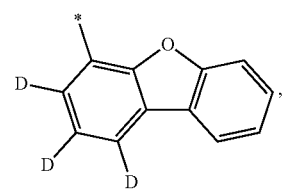
A-1

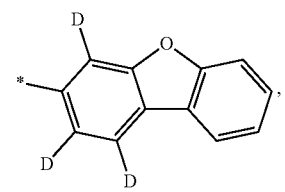
A-2

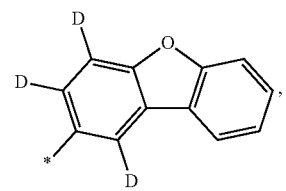
A-3

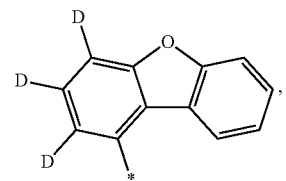
A-4

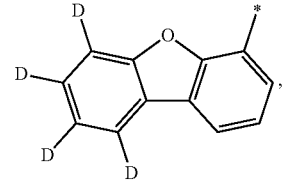
A-5

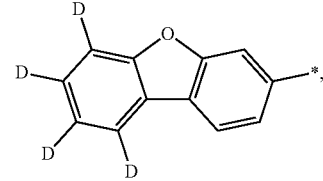
A-6

-continued

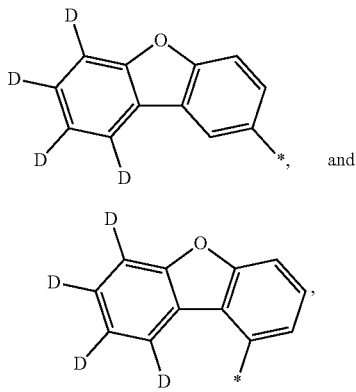

A-7

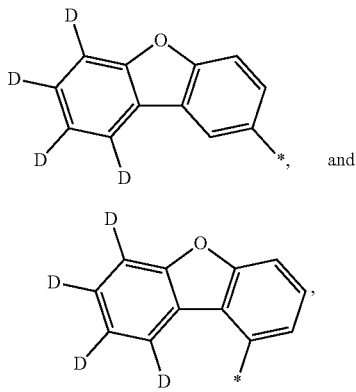

A-8 wherein

\* represents a site at which $Ar_2$ is bonded to the anthracene structure in Formula I.

4. The blue luminescent composition according to claim 1, characterized in that the compound represented by Formula II is selected from any one of Formulas II-1 to II-4:

II-1

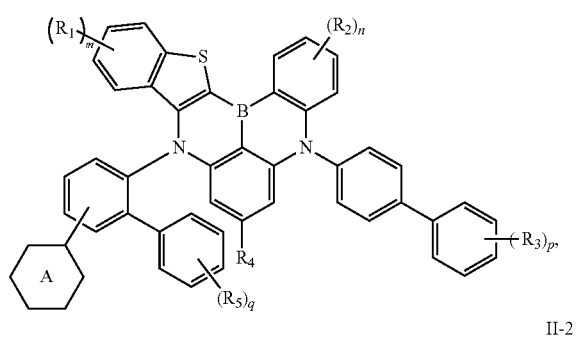

II-2

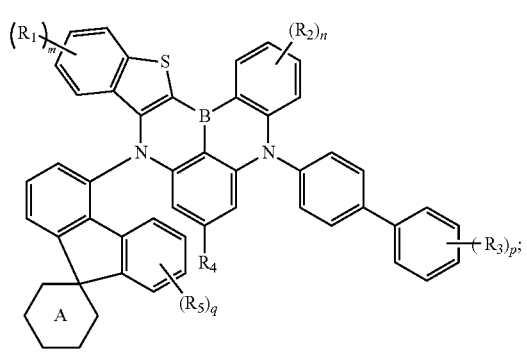

II-3

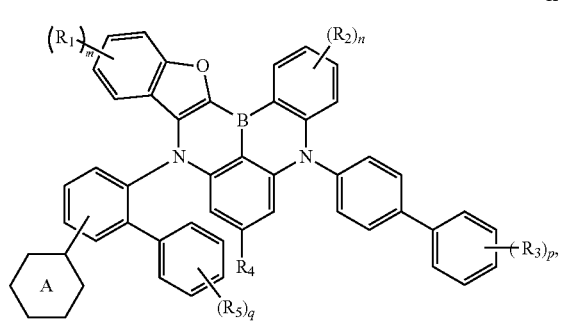

-continued
and

II-4

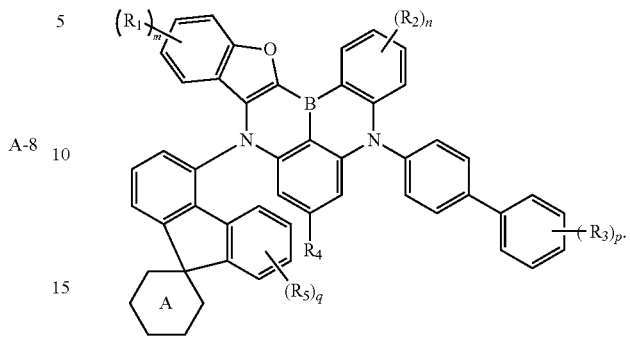

5. The blue luminescent composition according to claim 4, characterized in that $R_1$, $R_2$, $R_3$, and $R_5$ each independently represent hydrogen, deuterium, a substituted or unsubstituted alkyl group with a carbon atom number of 1 to 10, a substituted or unsubstituted alkenyl group with a carbon atom number of 2 to 10, a substituted or unsubstituted cycloalkyl group with a carbon atom number of 3 to 10, and a substituted or unsubstituted aryl group with a carbon atom number of 6 to 12, wherein two or more of $R_1$, $R_2$, $R_3$, and $R_5$ can be connected to each other to form a cyclic structure;

$R_4$ represents hydrogen, deuterium, a substituted or unsubstituted alkyl group with a carbon atom number of 1 to 10, a substituted or unsubstituted cycloalkyl group with a carbon atom number of 3 to 10, and a substituted or unsubstituted aryl group with a carbon atom number of 6 to 12; and substituents in ring A, $R_1$, $R_2$, $R_3$, $R_4$, and $R_5$ can be the same or different and are each independently selected from deuterium and an alkyl group with a carbon atom number of 1 to 10.

6. The blue luminescent composition according to claim 4, characterized in that the cycloalkyl group represents cyclohexyl or cyclopentyl.

7. The blue luminescent composition according to claim 1, characterized in that $R_1$, $R_2$, $R_3$, and $R_5$ each independently represent hydrogen, deuterium, a substituted or unsubstituted alkyl group with a carbon atom number of 1 to 10, a substituted or unsubstituted alkenyl group with a carbon atom number of 2 to 10, a substituted or unsubstituted cycloalkyl group with a carbon atom number of 3 to 10, and a substituted or unsubstituted aryl group with a carbon atom number of 6 to 12, wherein two or more of $R_1$, $R_2$, $R_3$, and $R_5$ can be connected to each other to form a cyclic structure;

$R_4$ represents hydrogen, deuterium, a substituted or unsubstituted alkyl group with a carbon atom number of 1 to 10, a substituted or unsubstituted cycloalkyl group with a carbon atom number of 3 to 10, and a substituted or unsubstituted aryl group with a carbon atom number of 6 to 12; and substituents in ring A, $R_1$, $R_2$, $R_3$, $R_4$, and $R_5$ can be the same or different and are each independently selected from deuterium and an alkyl group with a carbon atom number of 1 to 10.

8. The blue luminescent composition according to claim 1, characterized in that the cycloalkyl group represents cyclohexyl or cyclopentyl.

9. The blue luminescent composition according to claim 1, characterized in that the compound represented by Formula I is selected from any one of the following compounds:
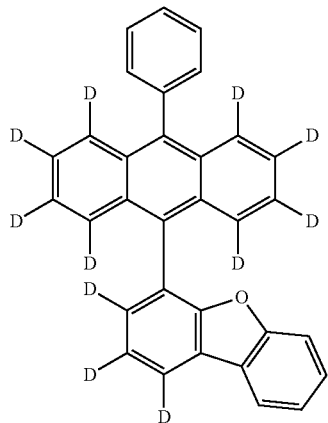
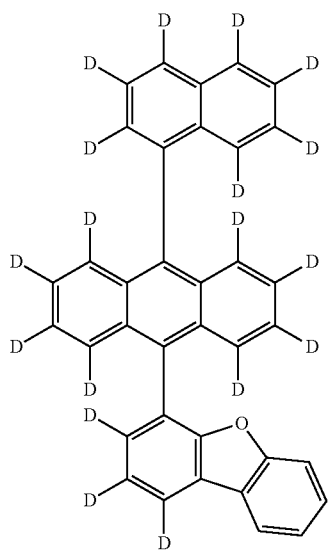
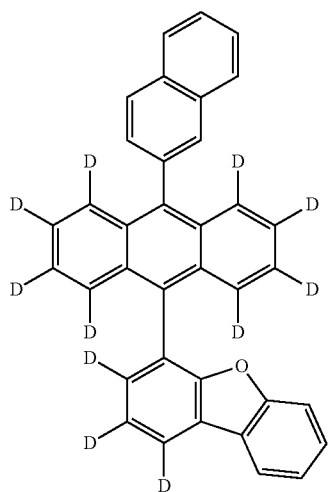
-continued
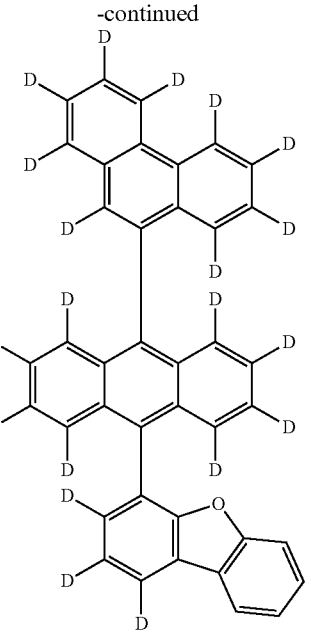
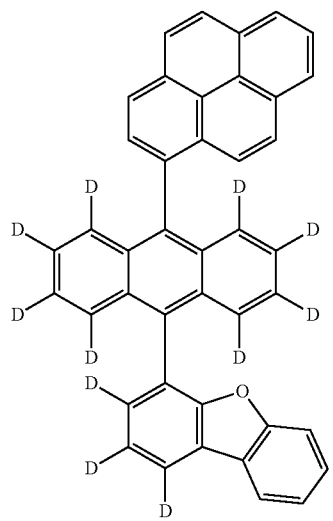
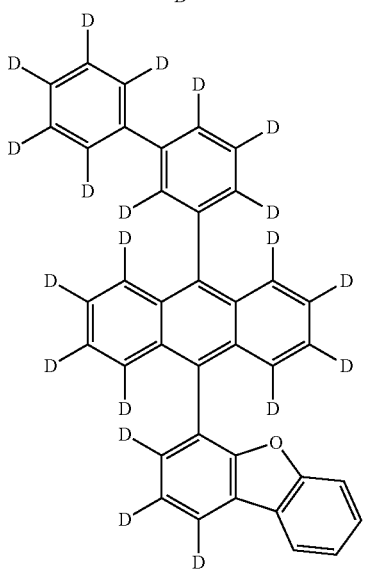

131                                                            132
-continued                                                     -continued
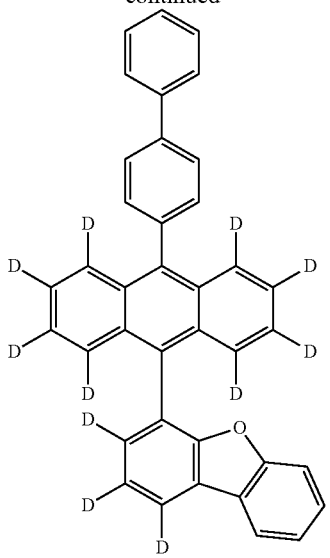

133
-continued
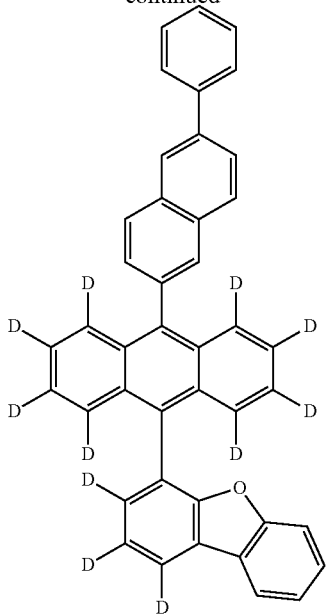
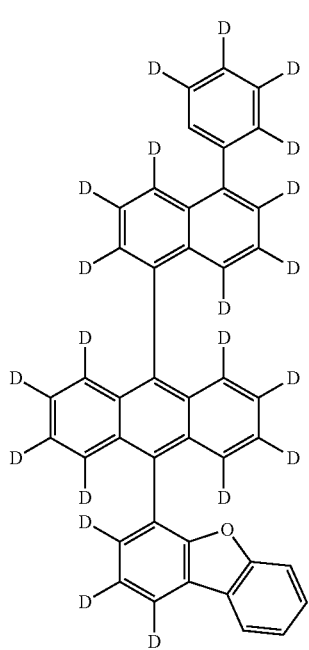
134
-continued
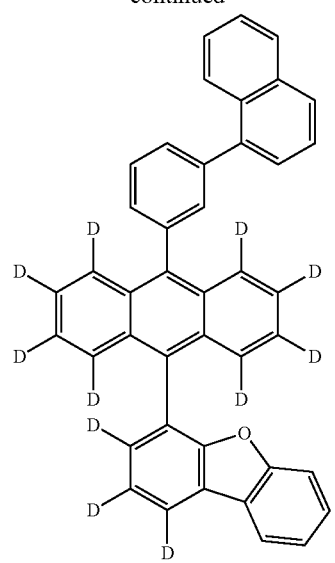
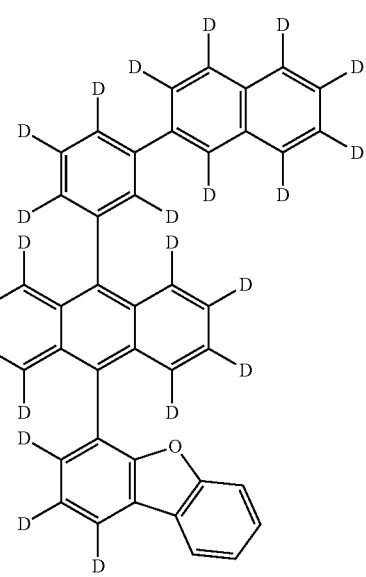
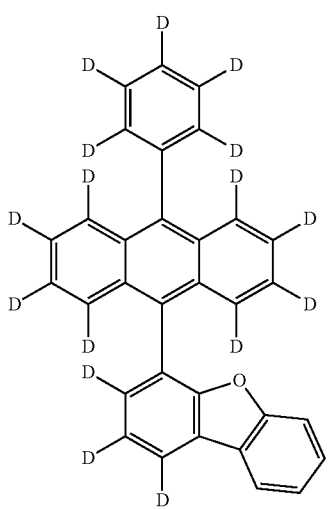

135
-continued
136
-continued
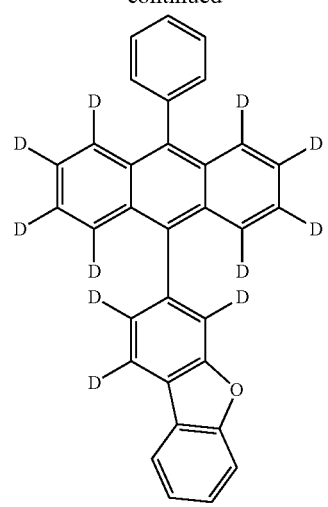
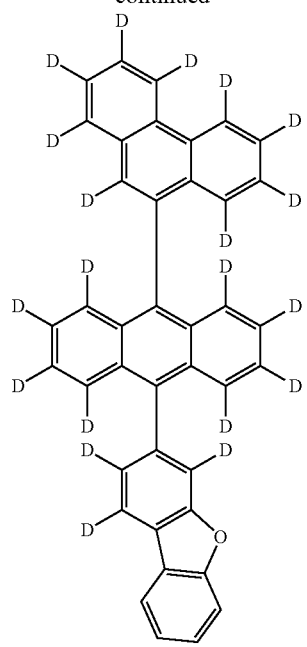
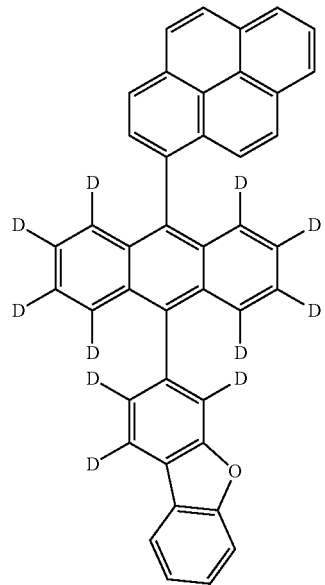

137
-continued
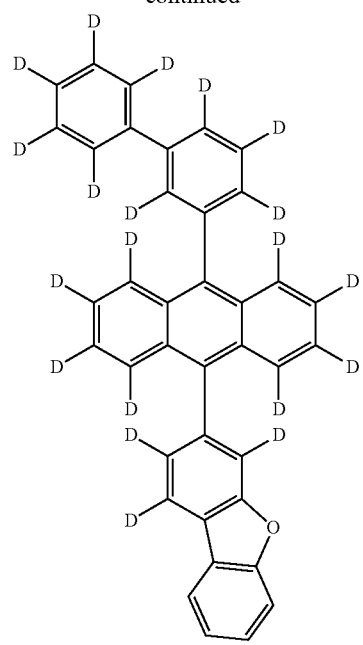
138
-continued
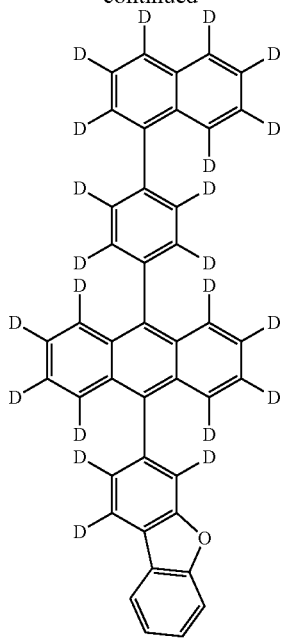
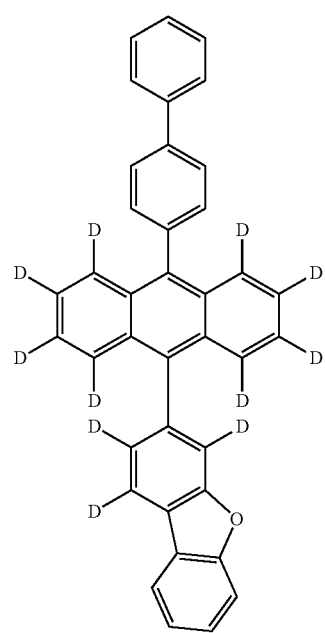
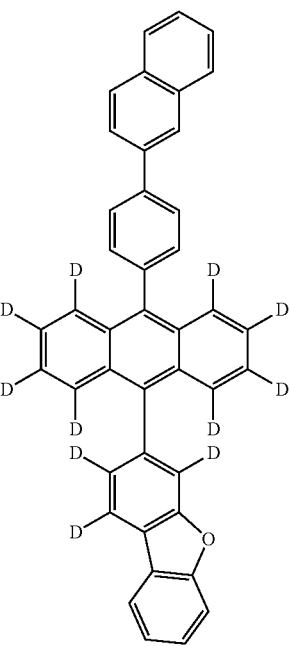

139
-continued
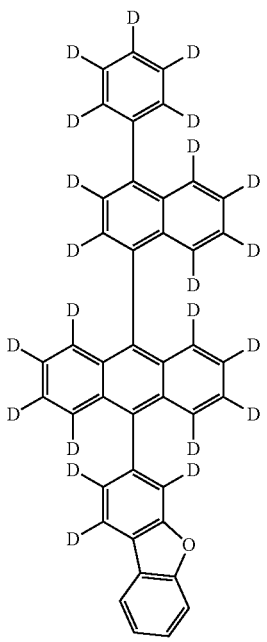
140
-continued
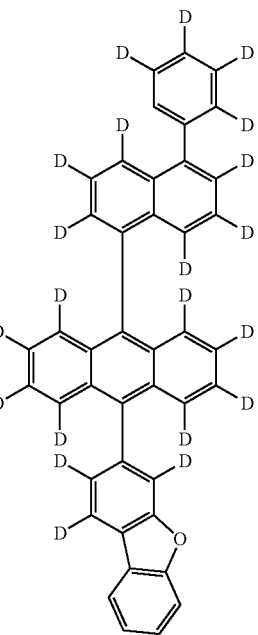
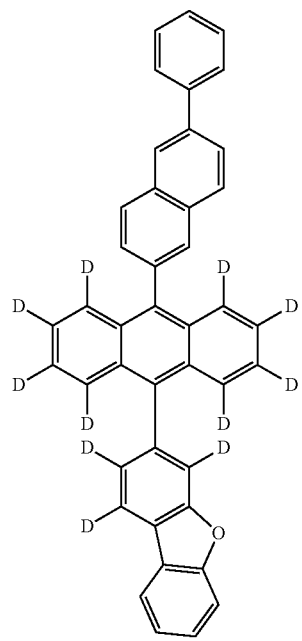
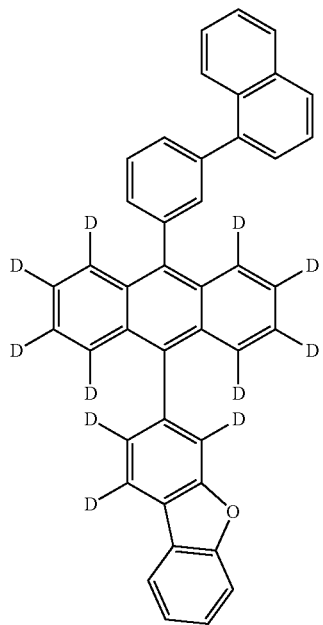

141
-continued
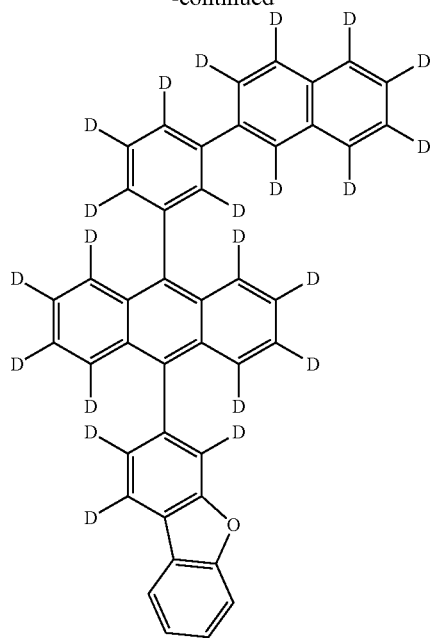
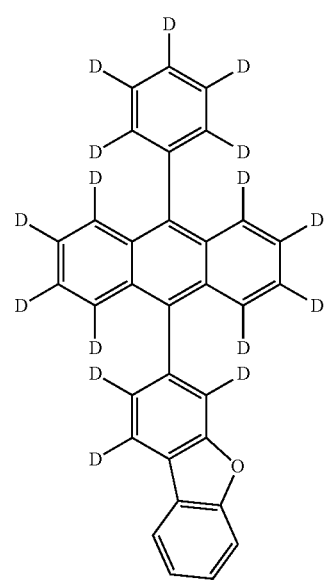
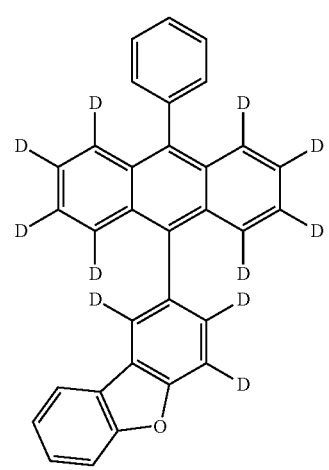
142
-continued
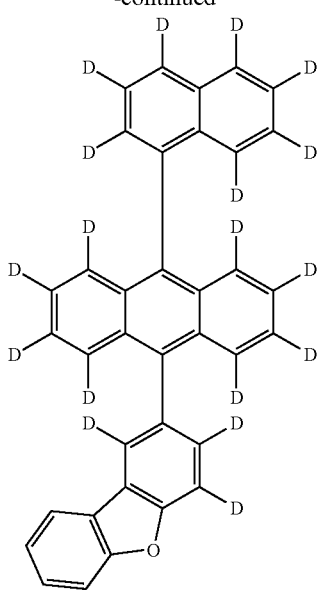
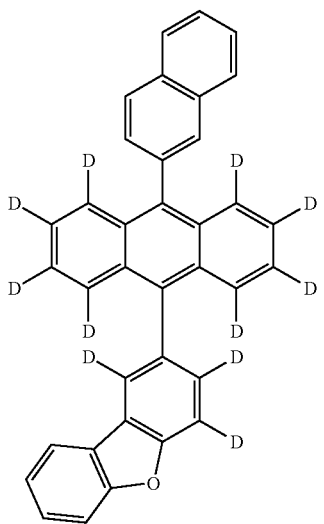

143
-continued
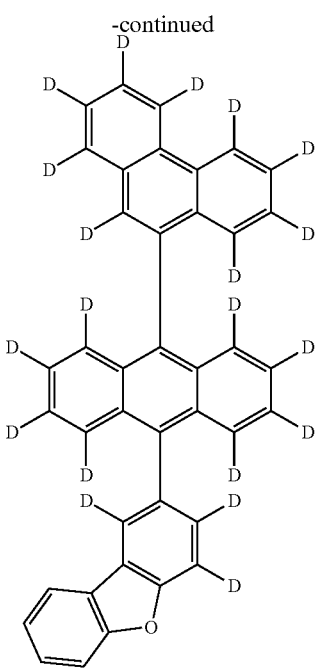
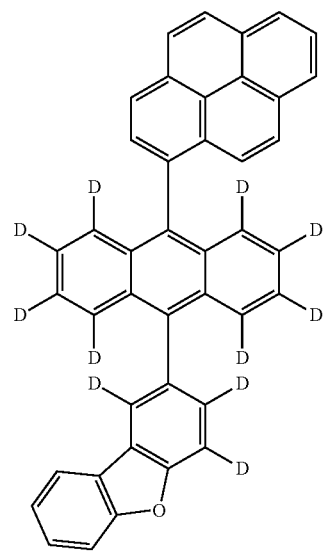
144
-continued
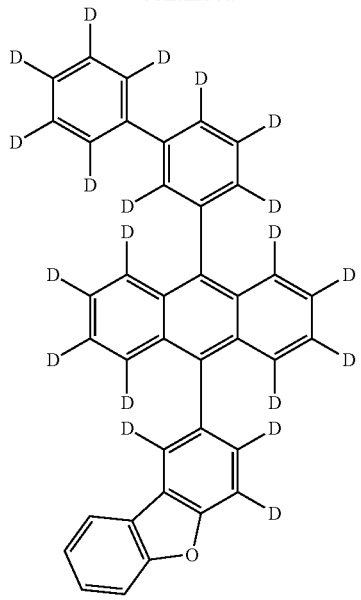
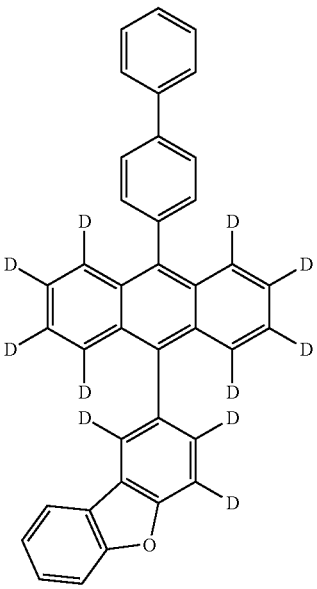

145
-continued
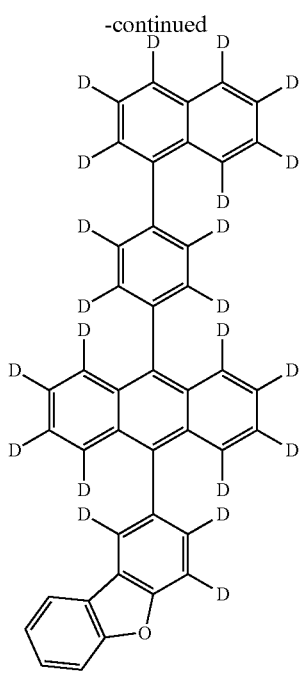
146
-continued
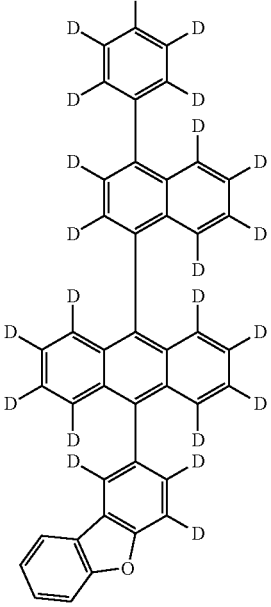
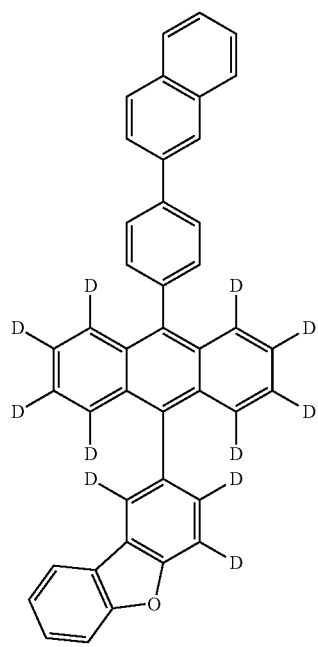

147
-continued
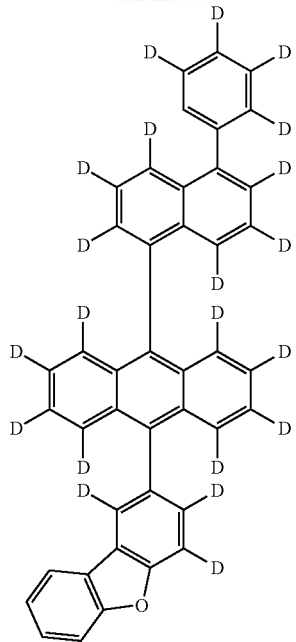
148
-continued
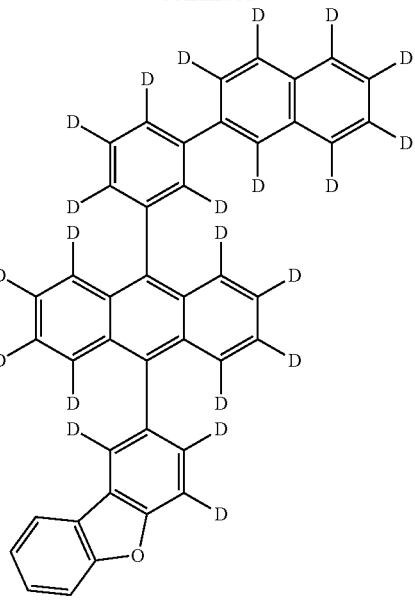
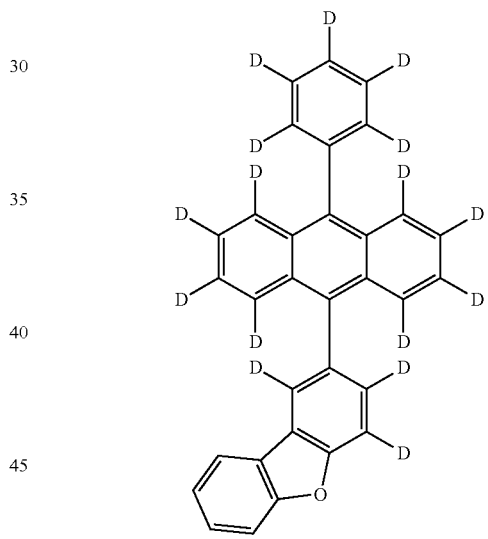
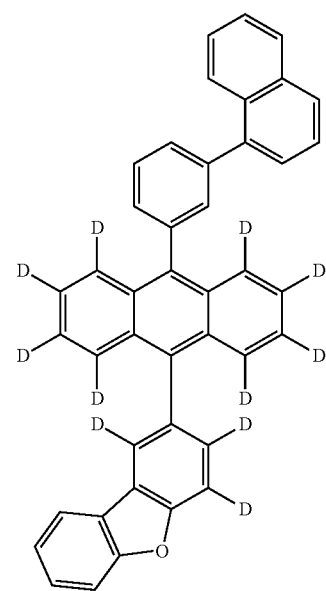
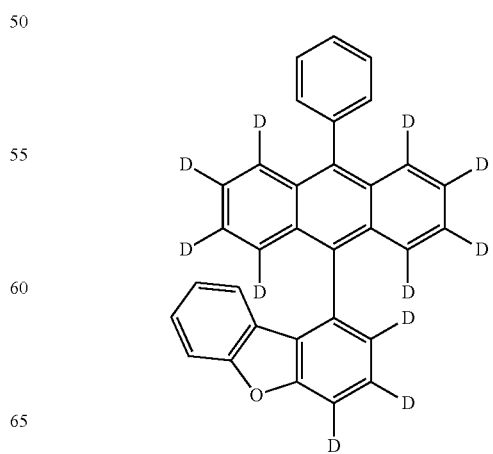

149
-continued
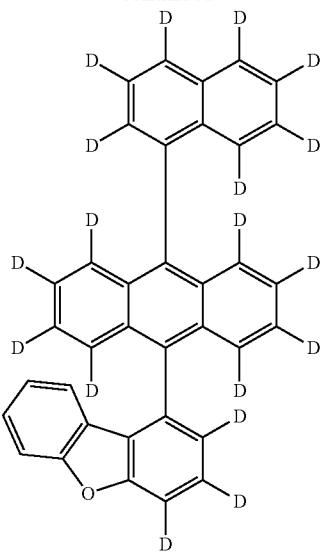
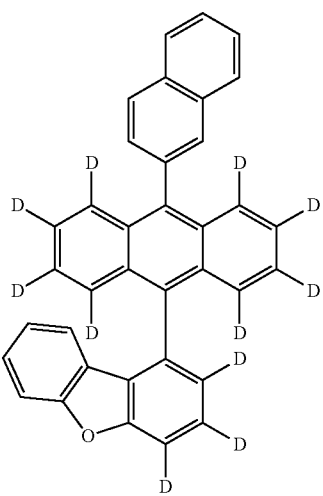
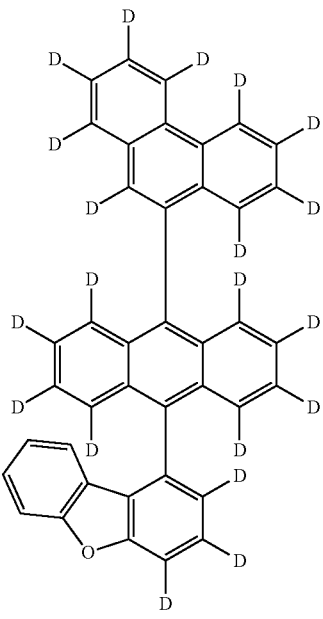
150
-continued
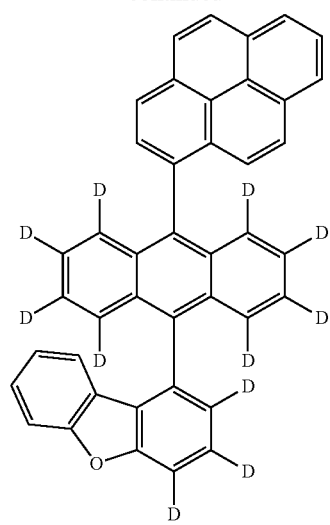
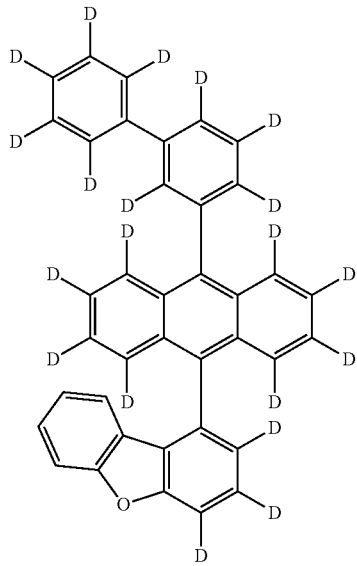
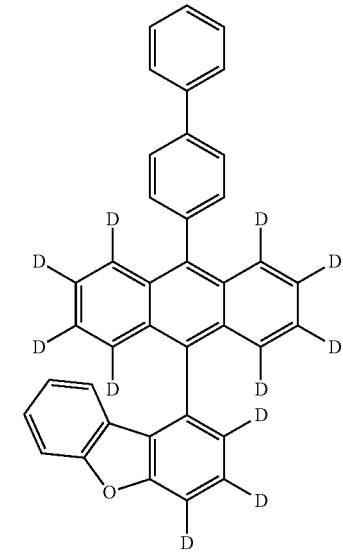

151
-continued
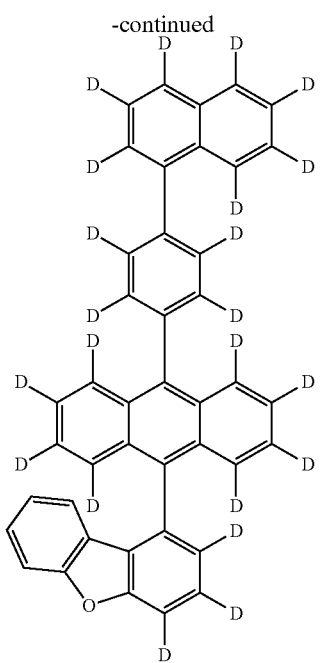
152
-continued
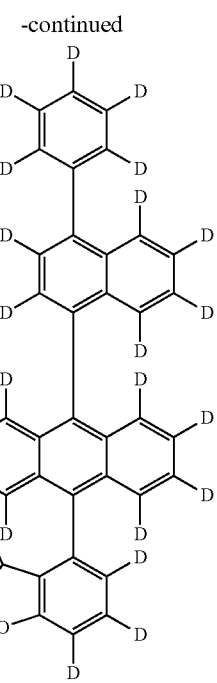
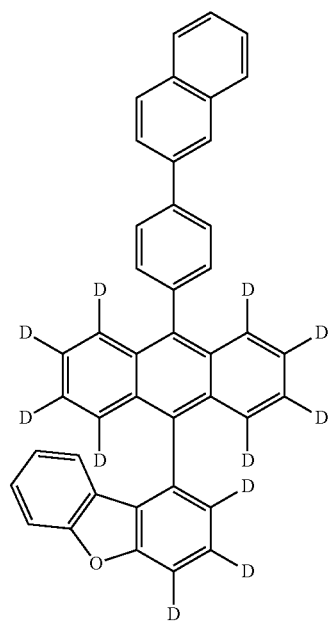
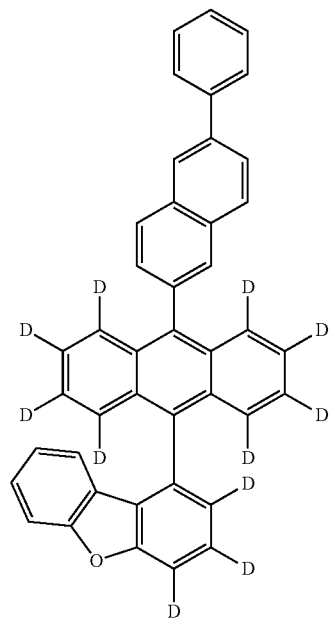

153
-continued
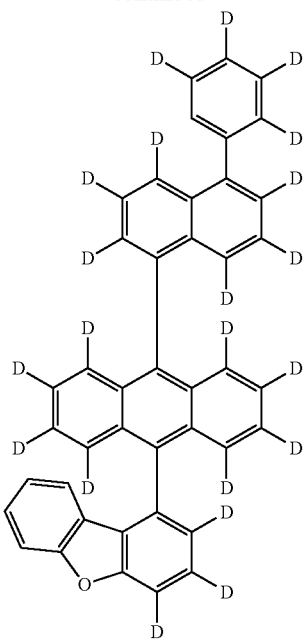
154
-continued
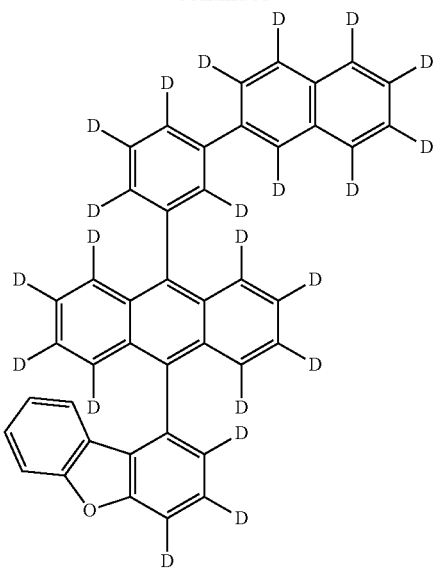
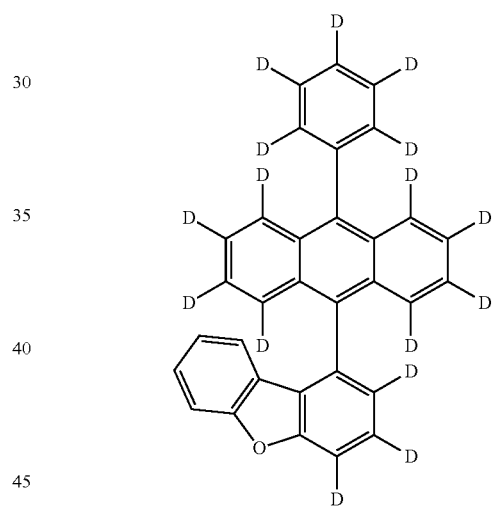
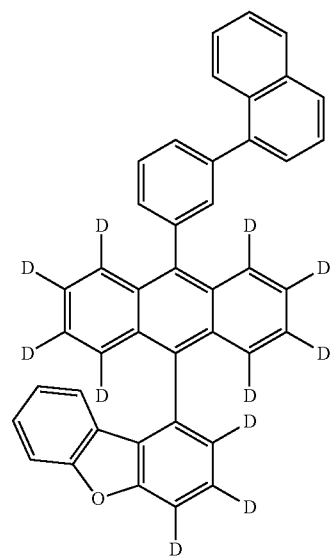

155 -continued

156 -continued

-continued
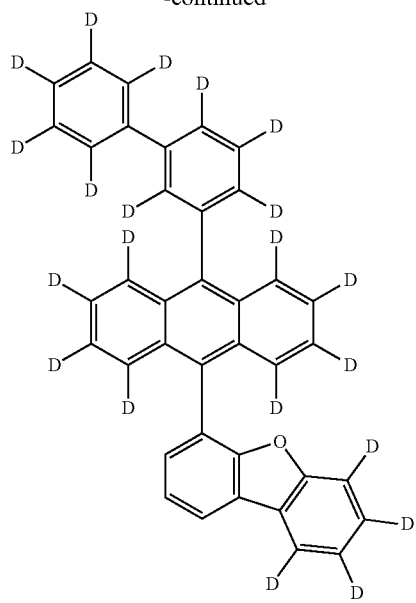
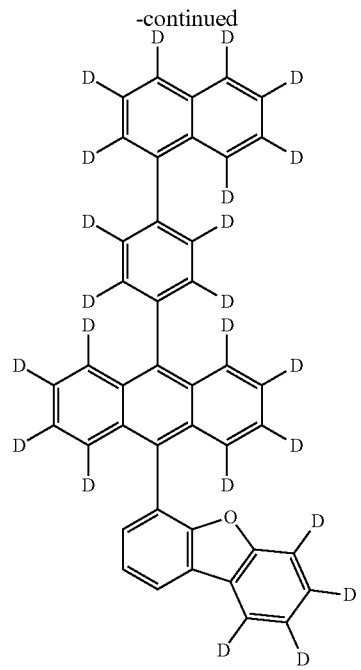
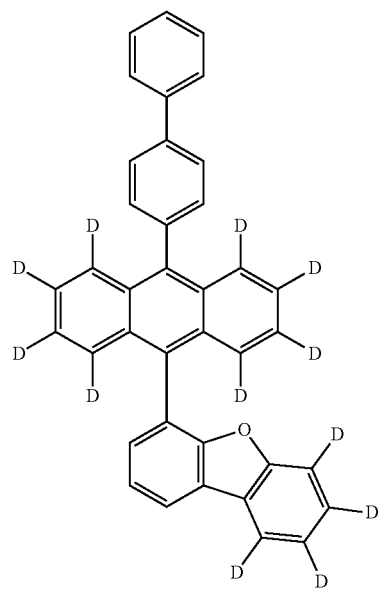
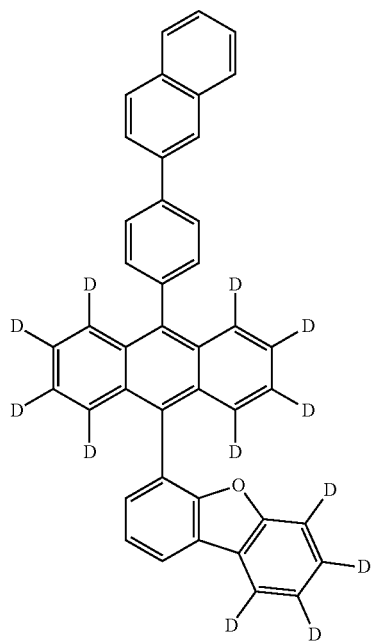

159
-continued
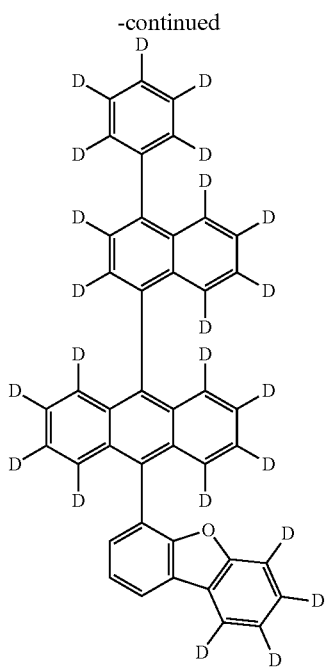
160
-continued
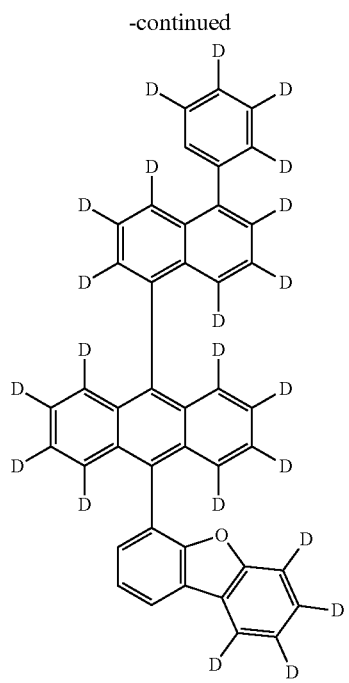
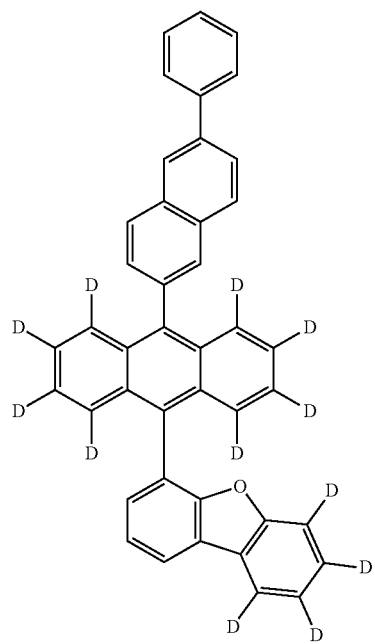

-continued
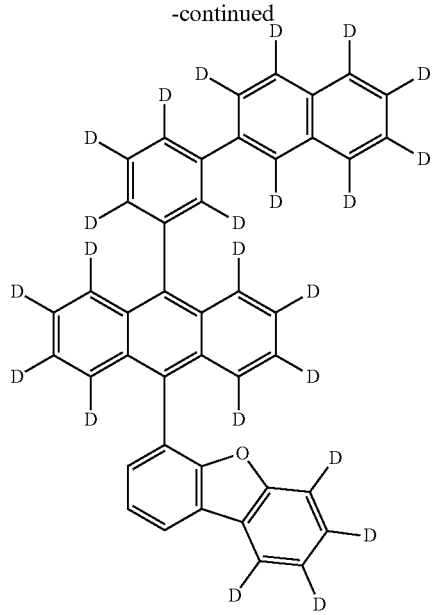
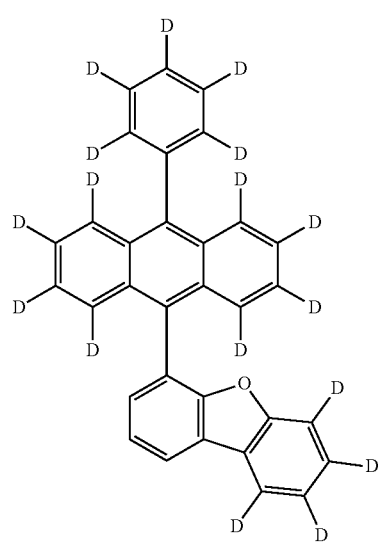
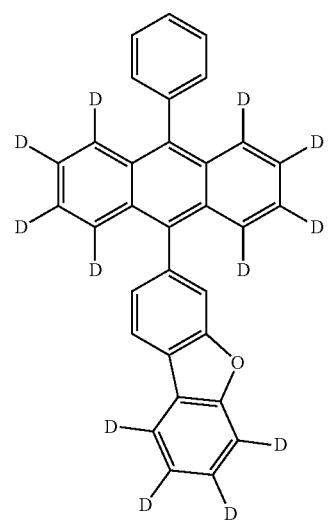
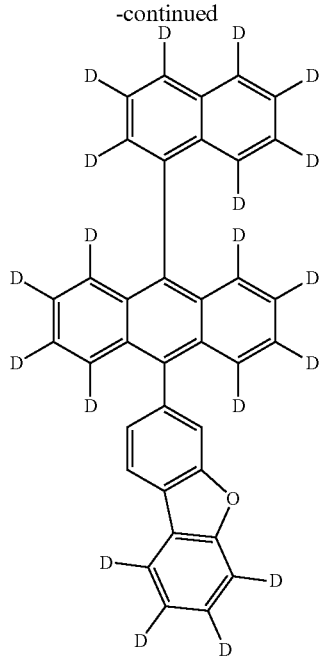
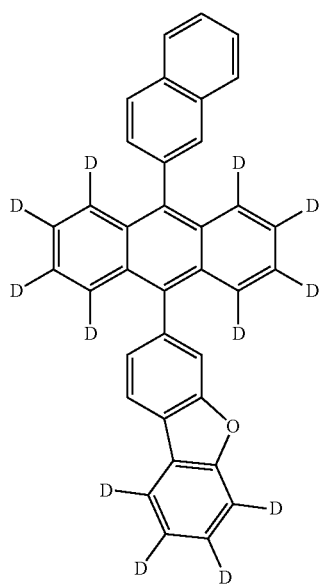

163
-continued
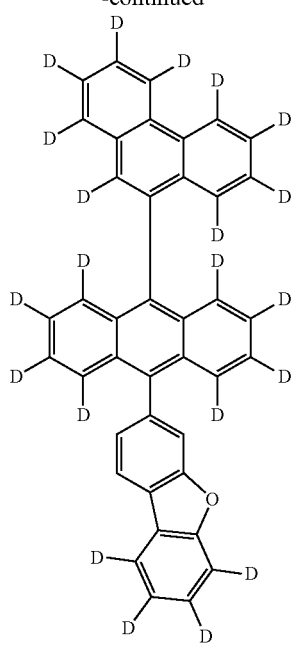
164
-continued
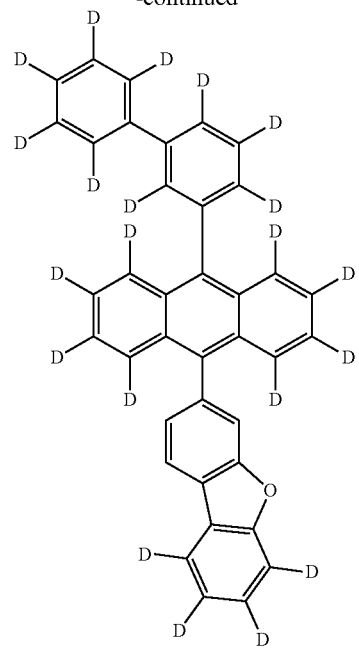
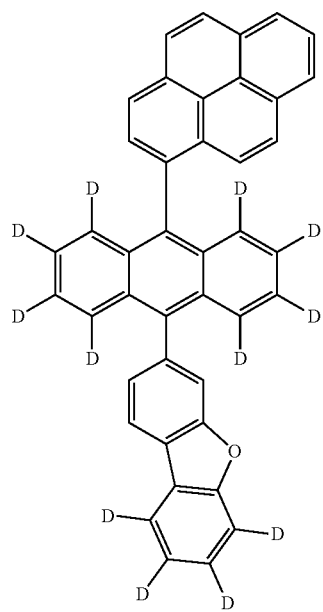
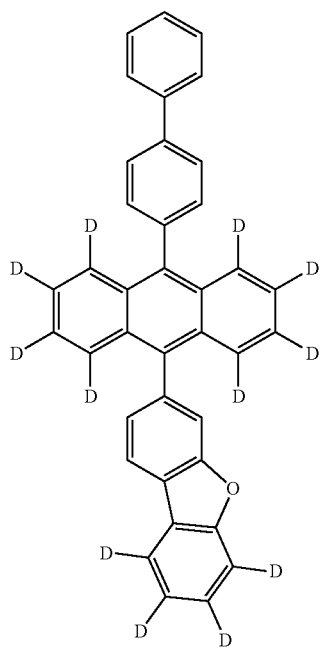

165
-continued
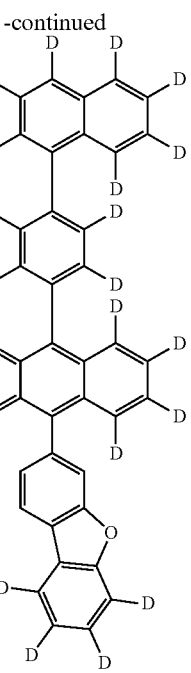
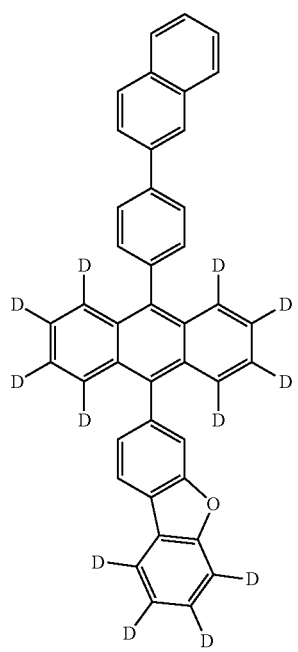
166
-continued
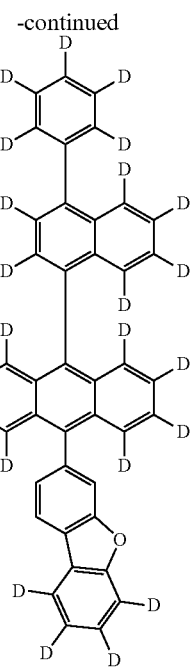
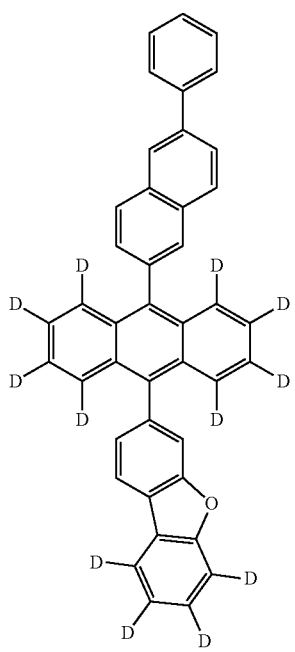

167
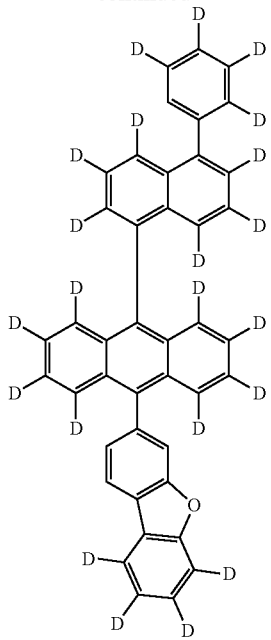
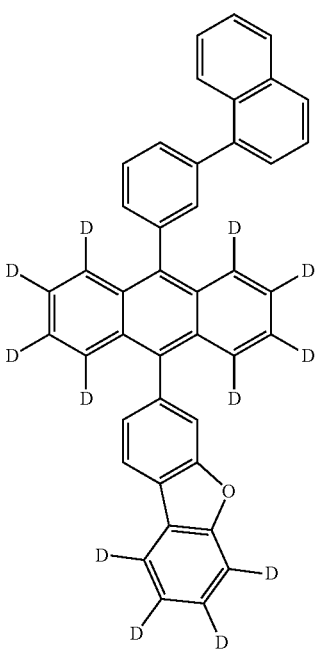
168
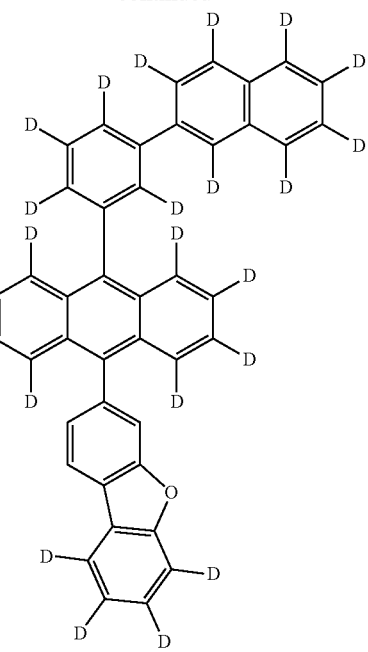
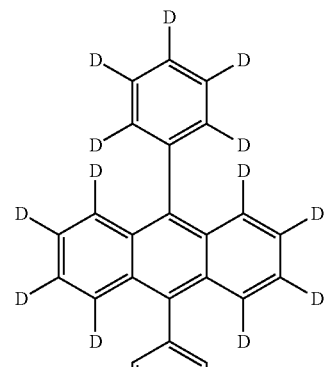
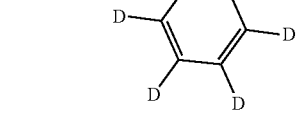
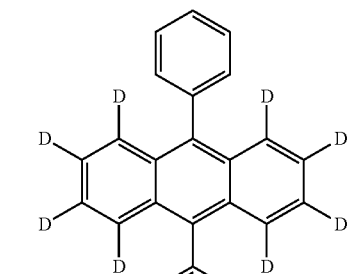
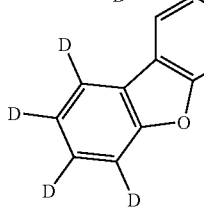

169
-continued
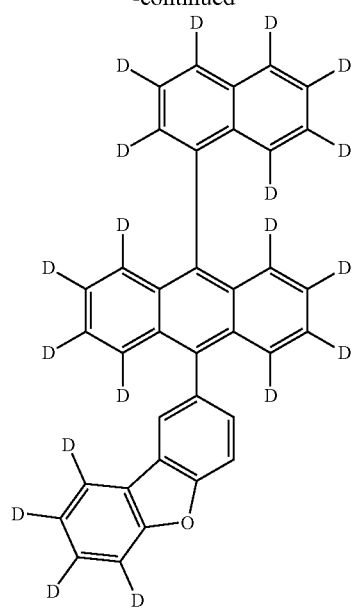
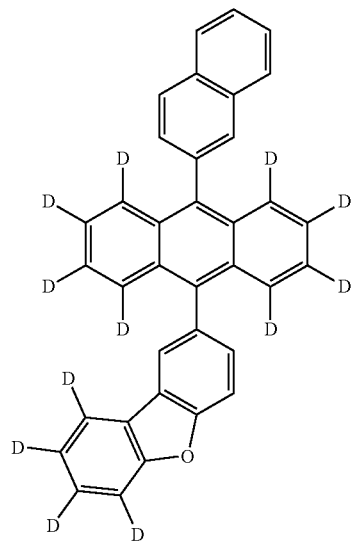
170
-continued
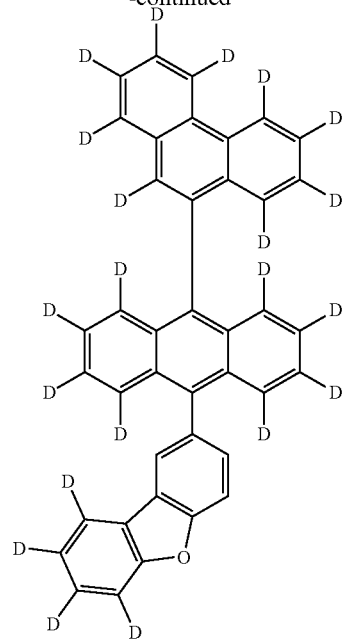
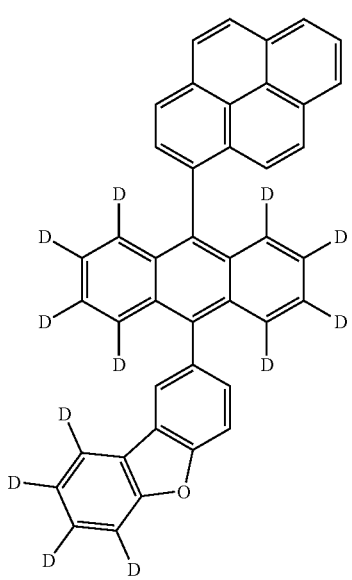

171
-continued
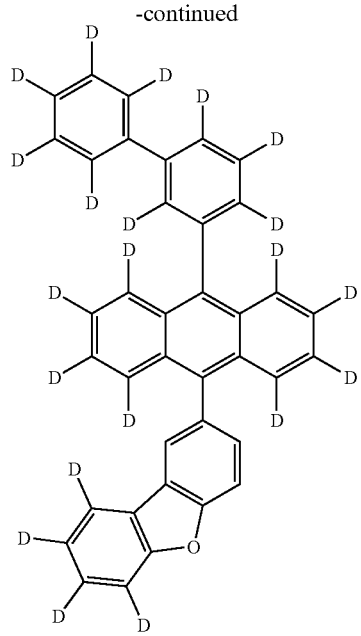
172
-continued
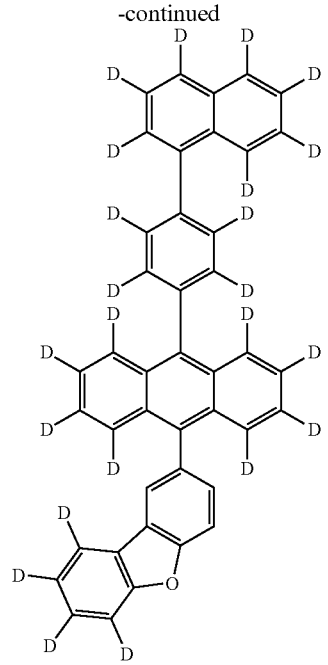
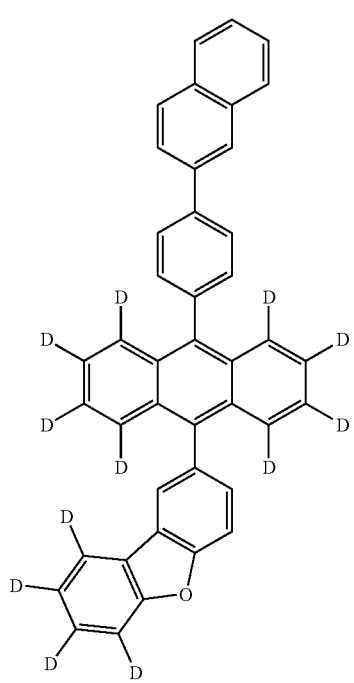

173
-continued
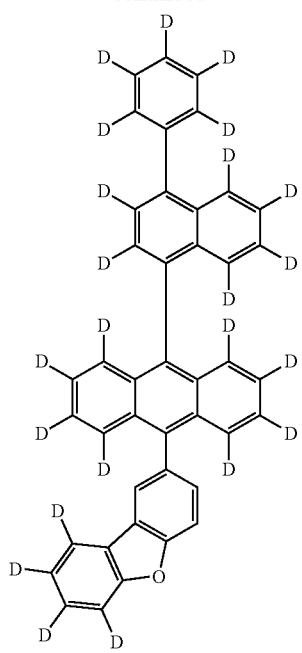
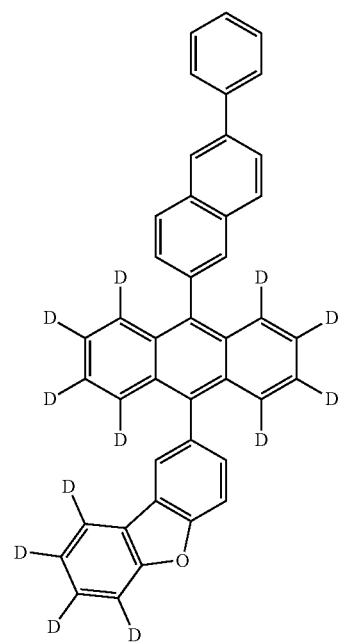
174
-continued
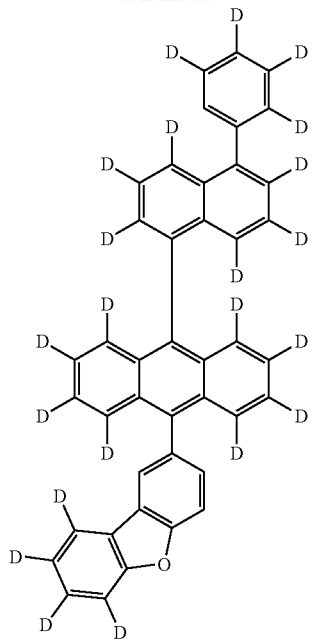
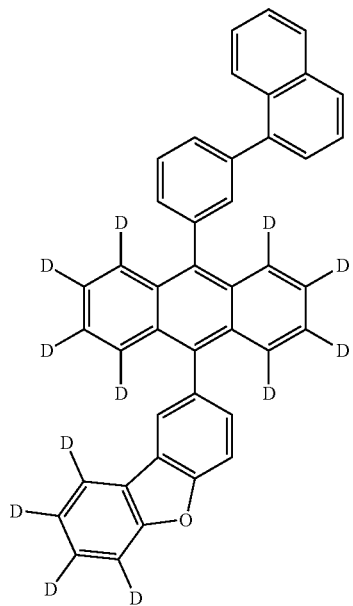

-continued
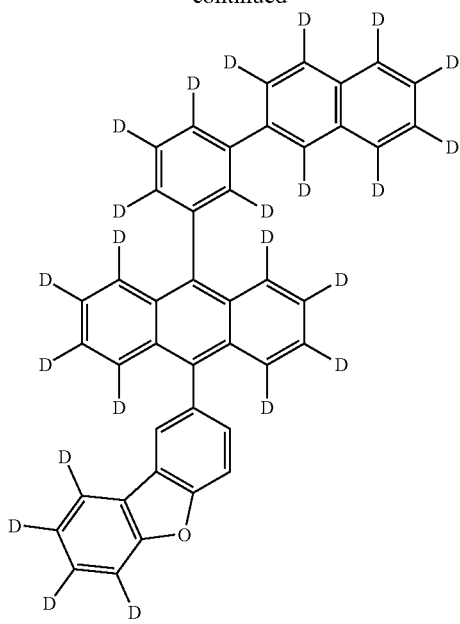
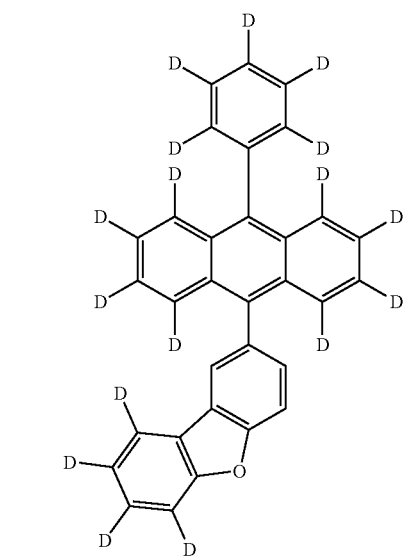
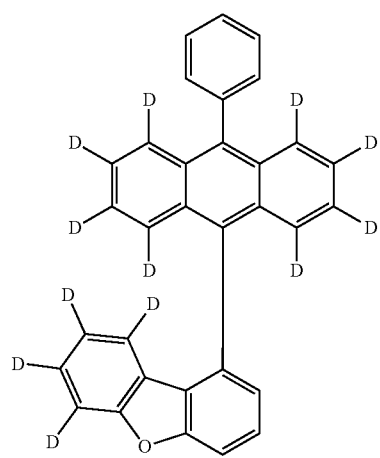
-continued
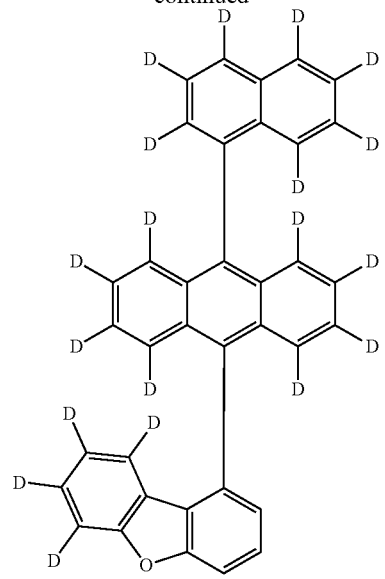
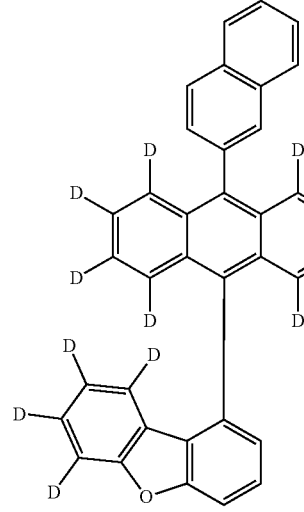
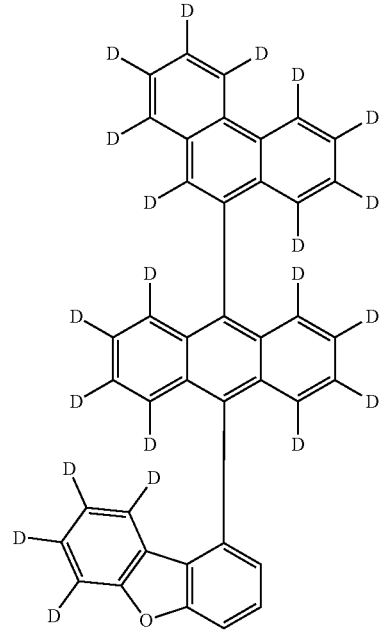

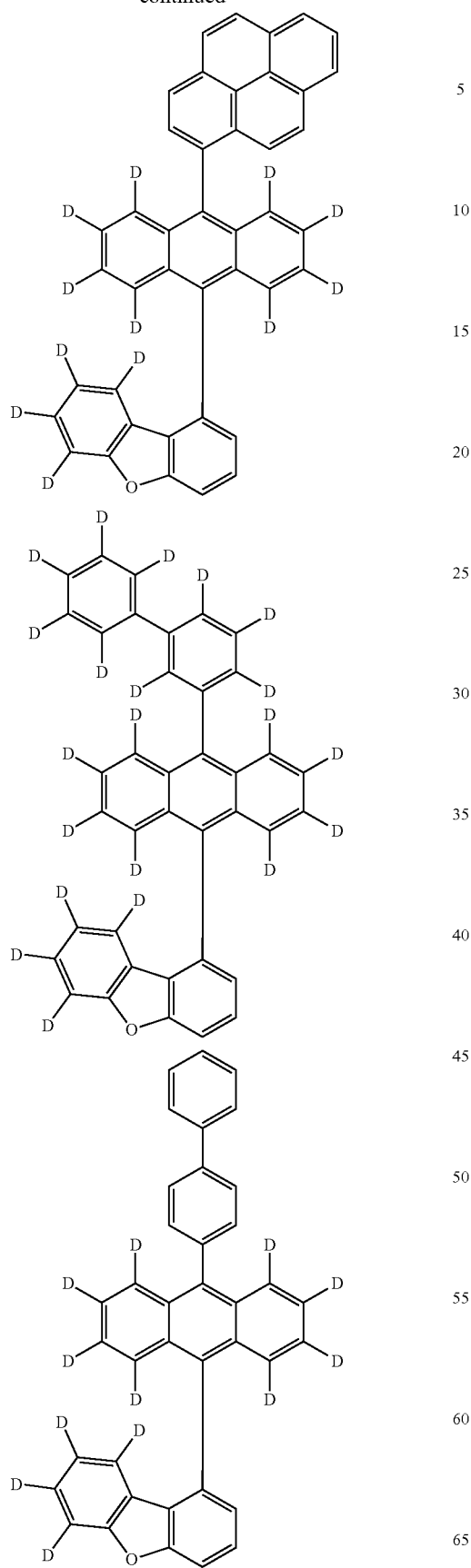

179
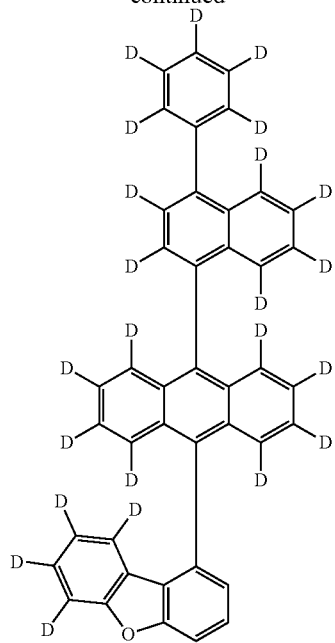
180
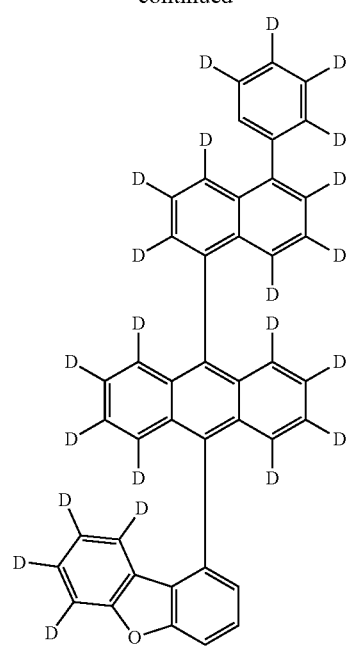
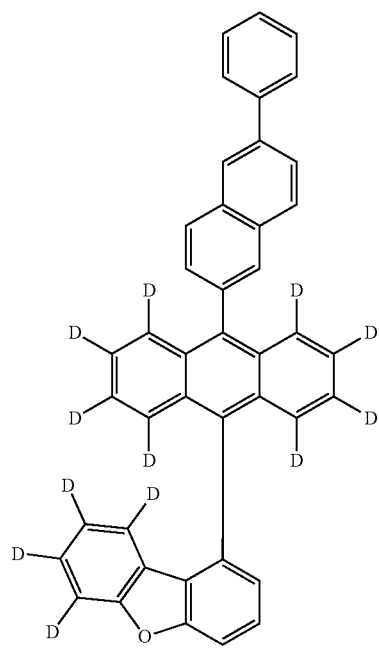
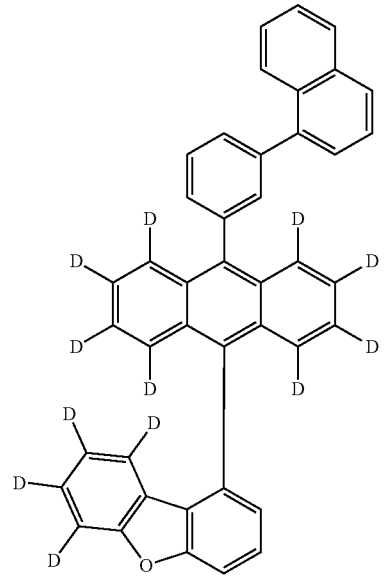

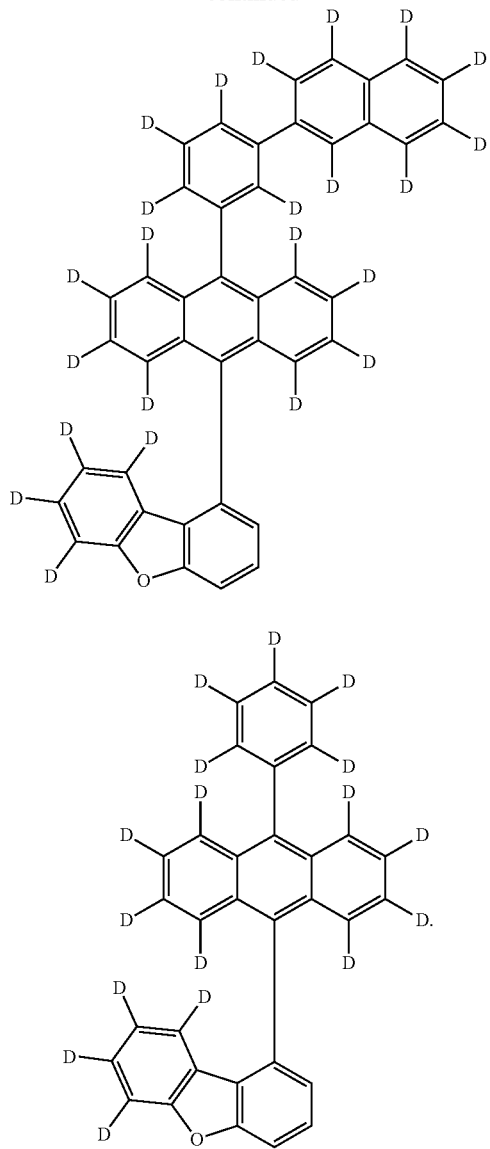
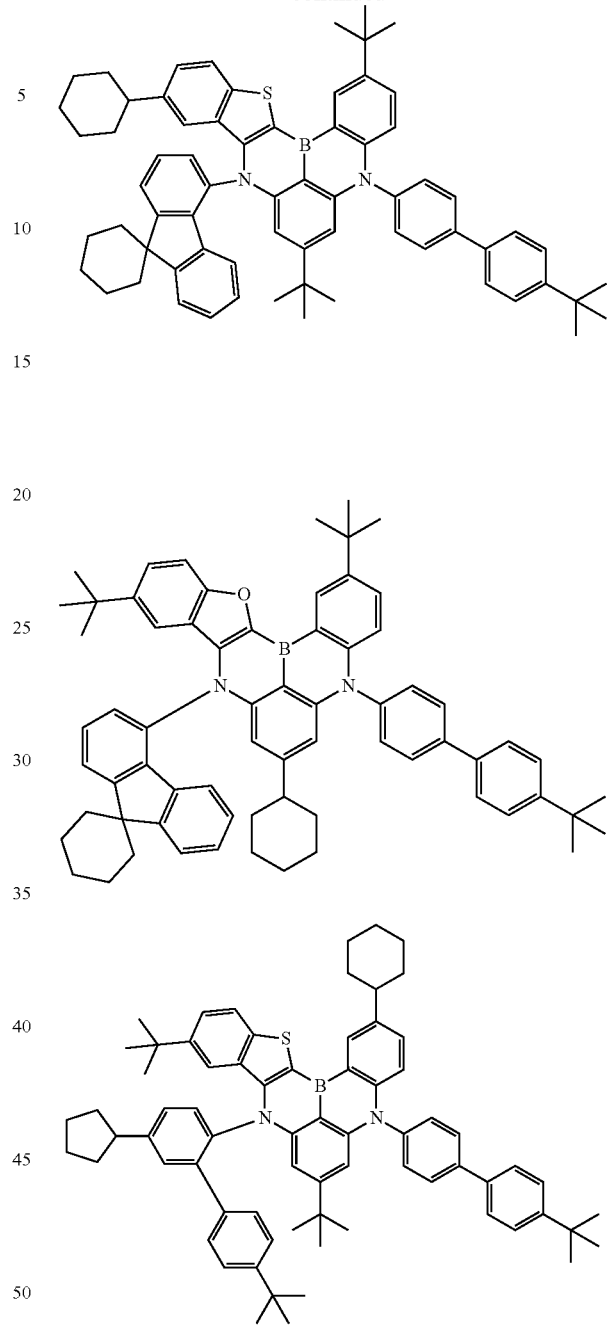
10. The blue luminescent composition according to claim 1, characterized in that the compound represented by Formula II is selected from any one of the following compounds:
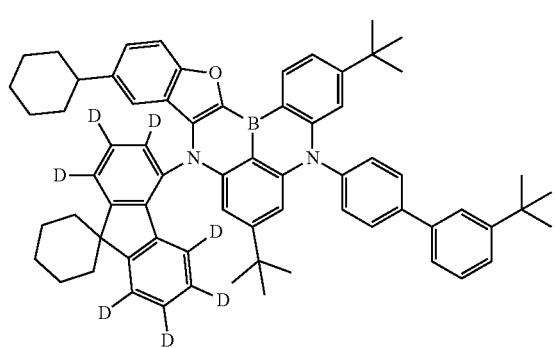
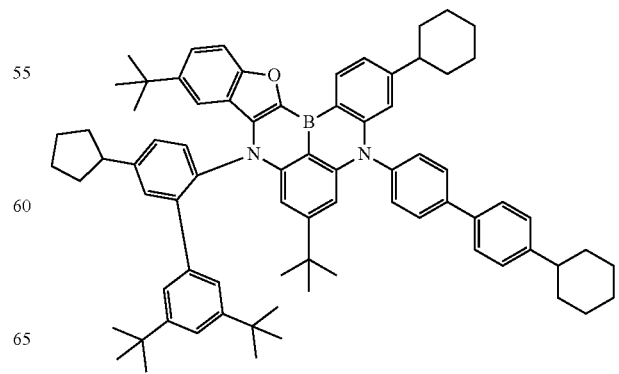

183
-continued
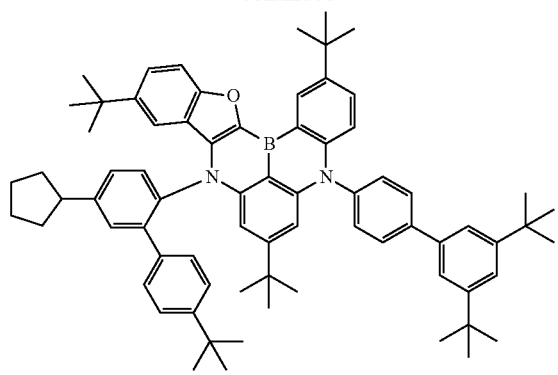
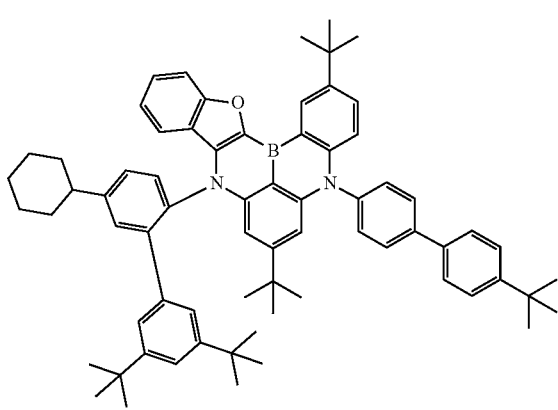
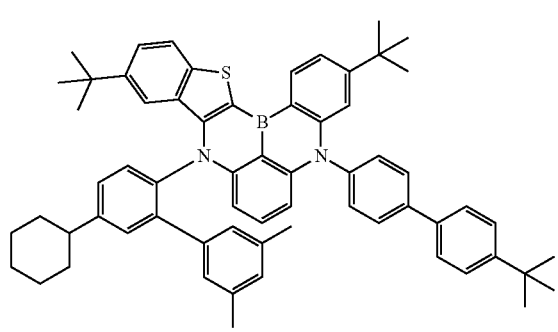
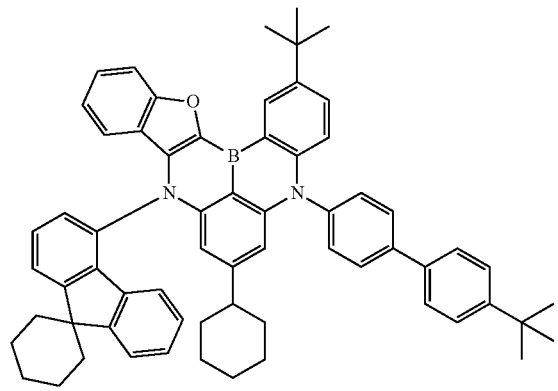
184
-continued
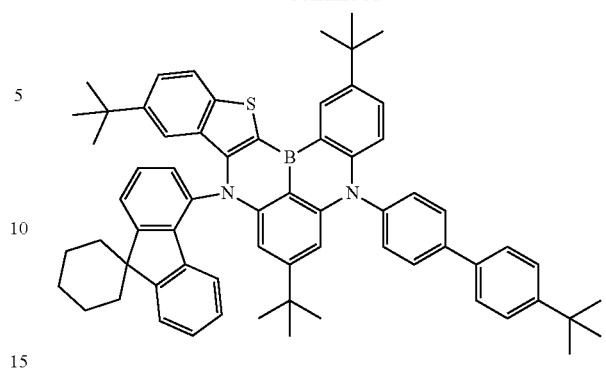
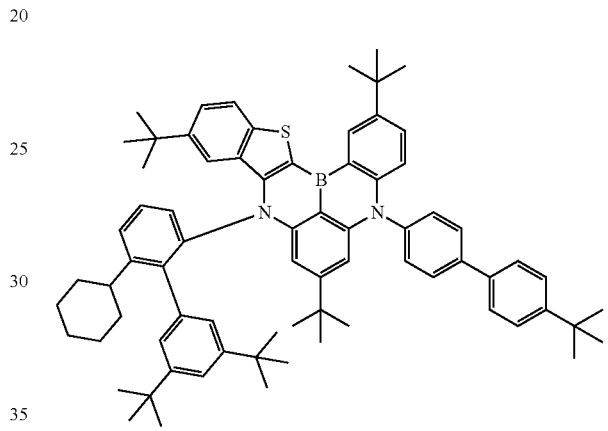
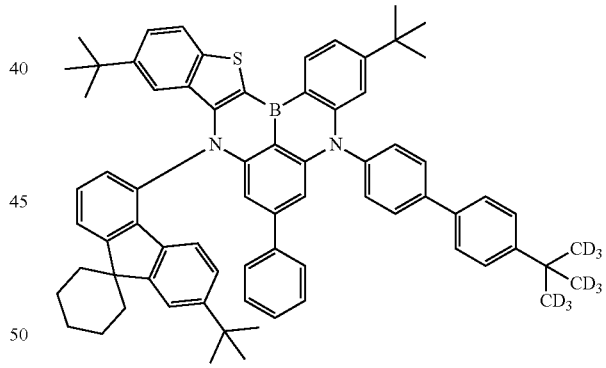
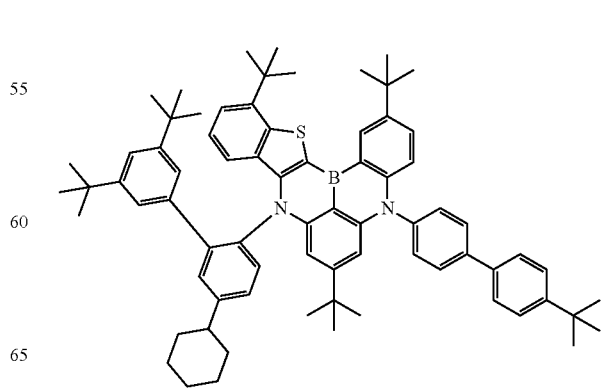

185
-continued
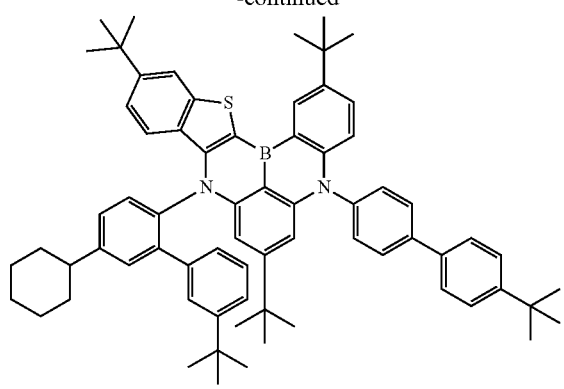
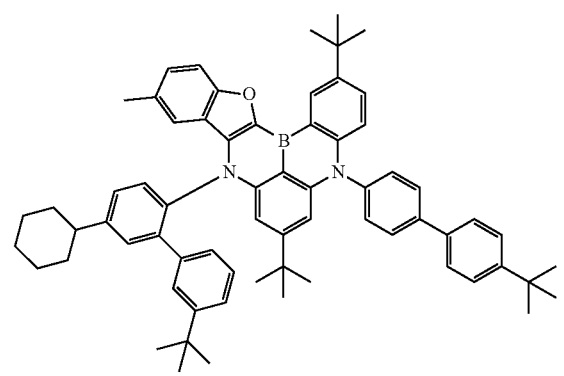
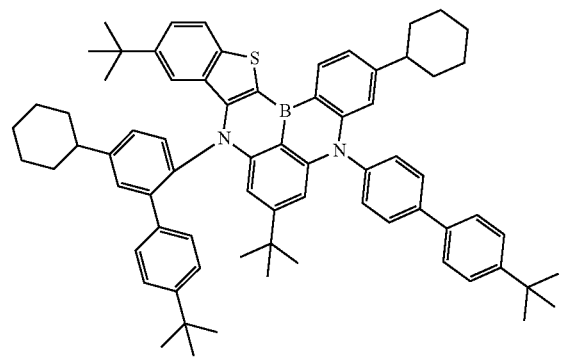
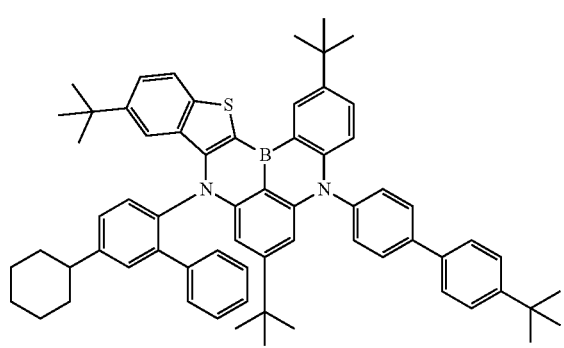
186
-continued
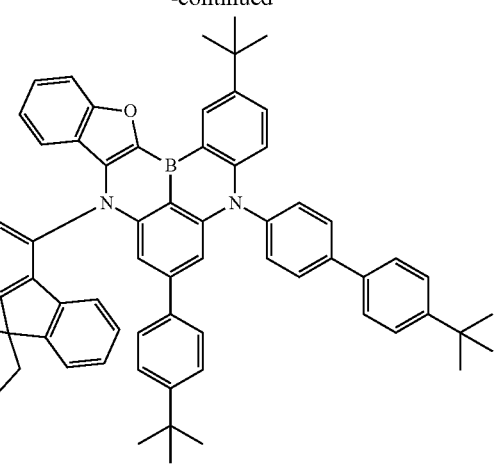
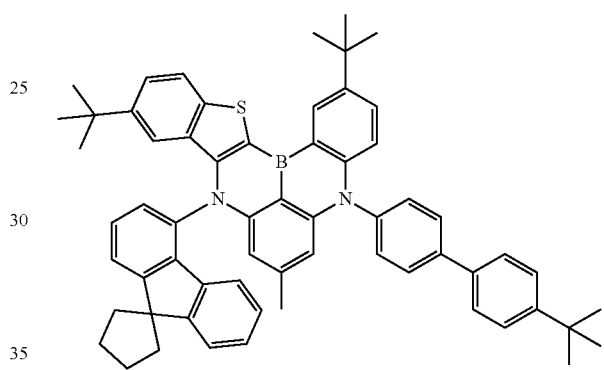
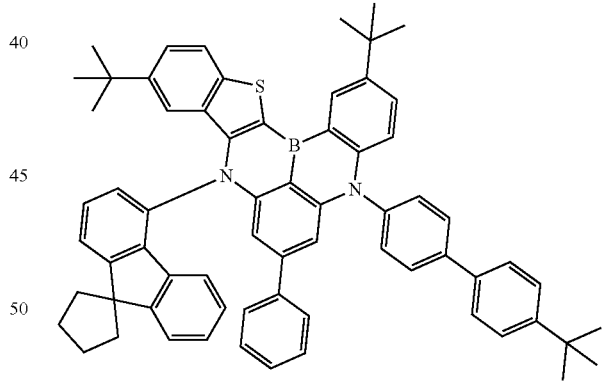
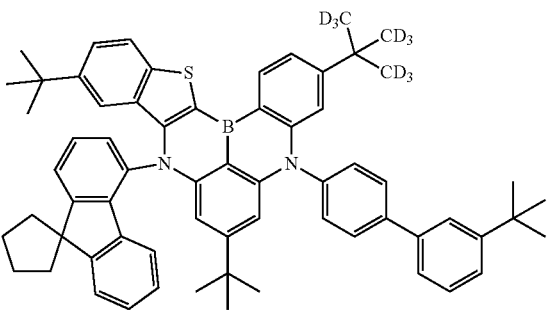

187
-continued
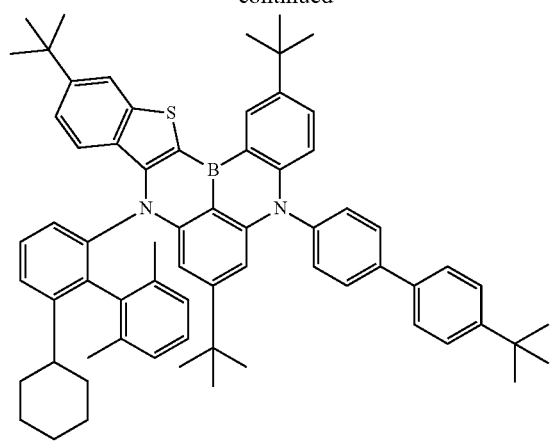
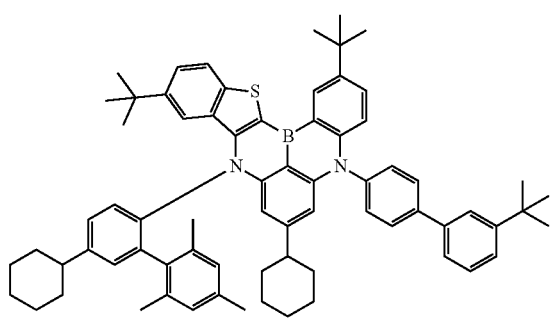
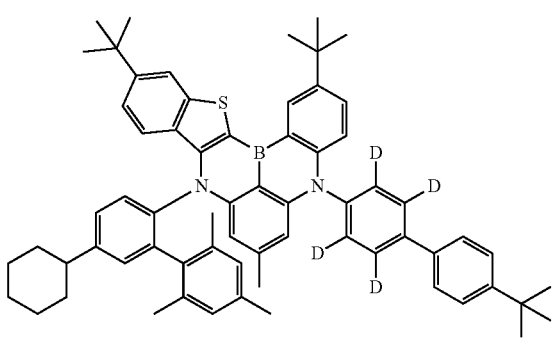
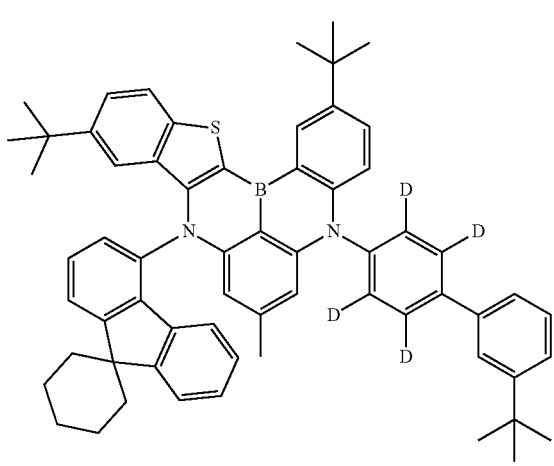
188
-continued
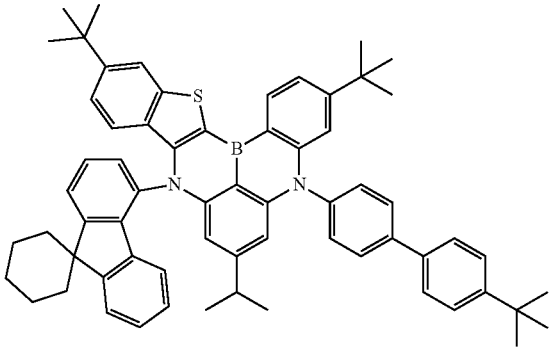
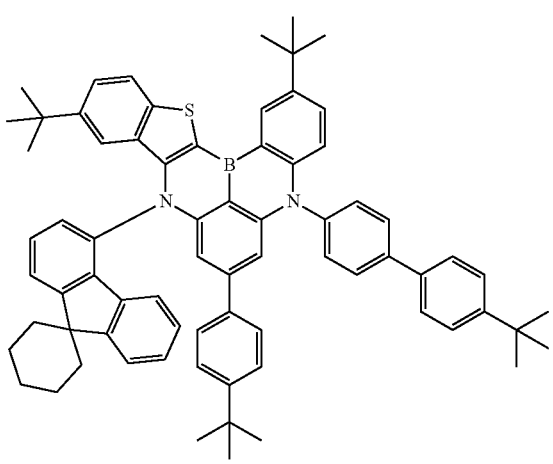
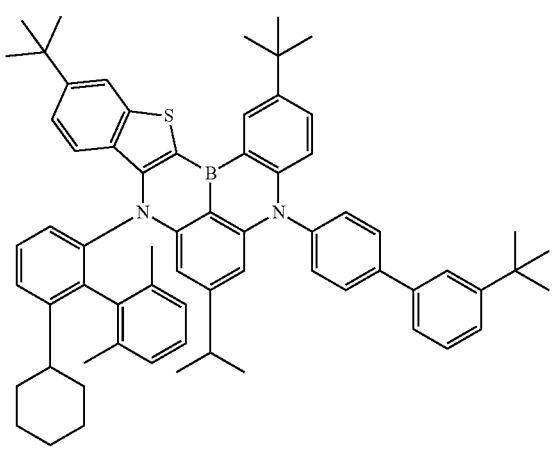
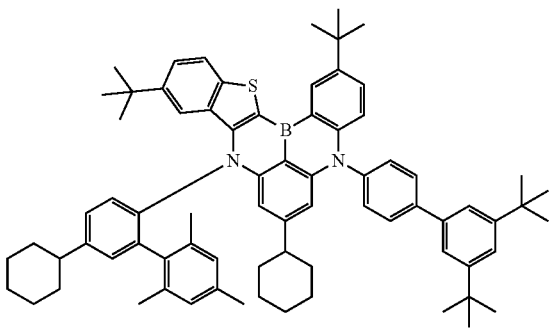

| 189 -continued | 190 -continued |
|---|---|
| 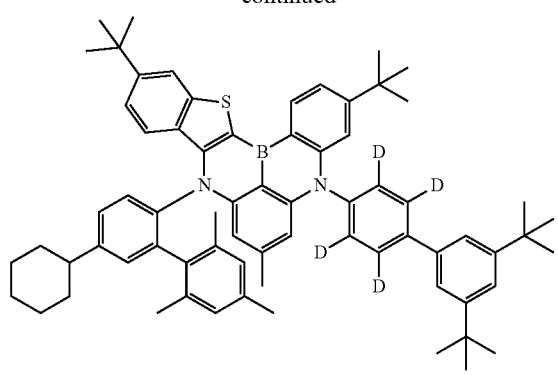 | 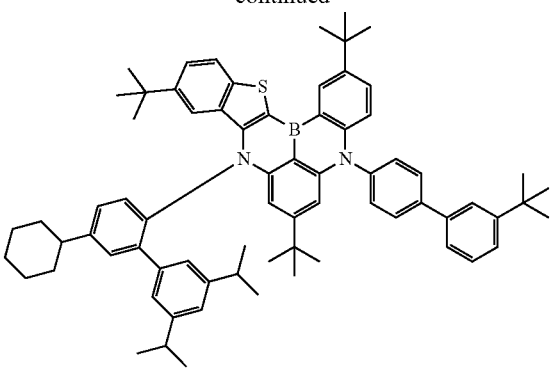 |
| 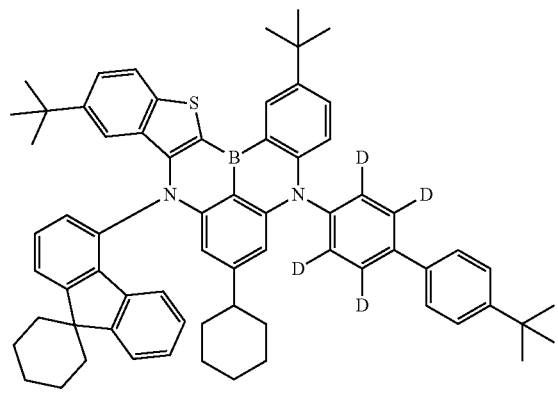 | 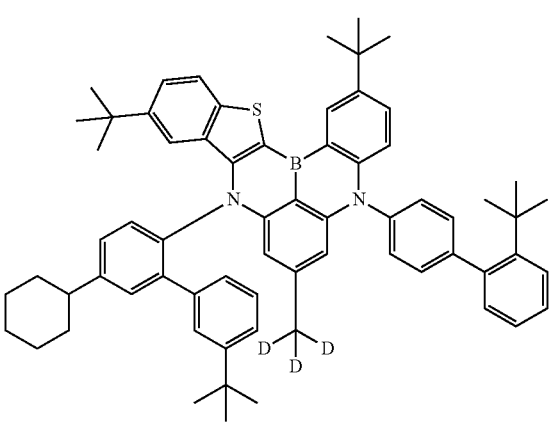 |
| 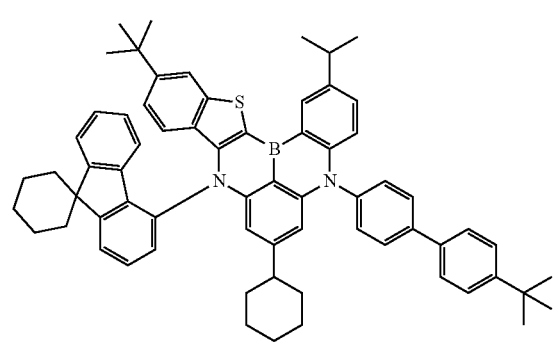 | 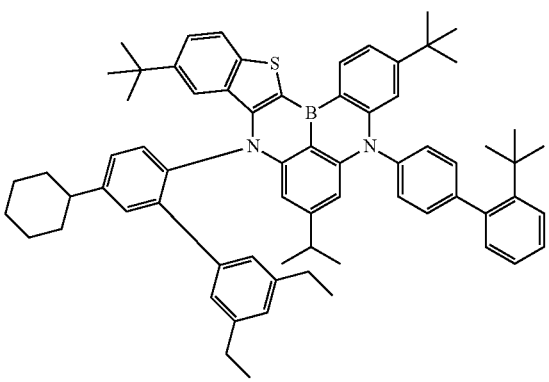 |
| 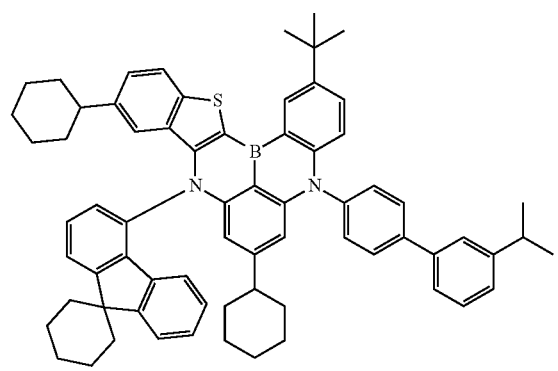 | 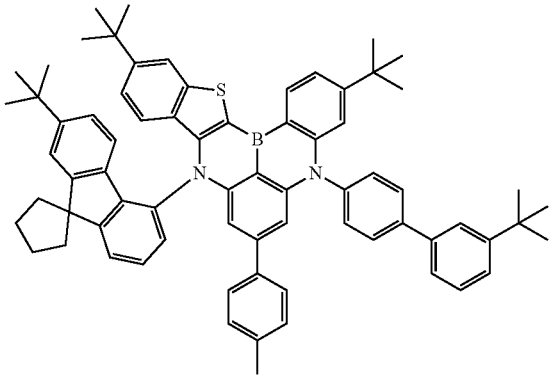 |

| 191 -continued | 192 -continued |
|---|---|
| 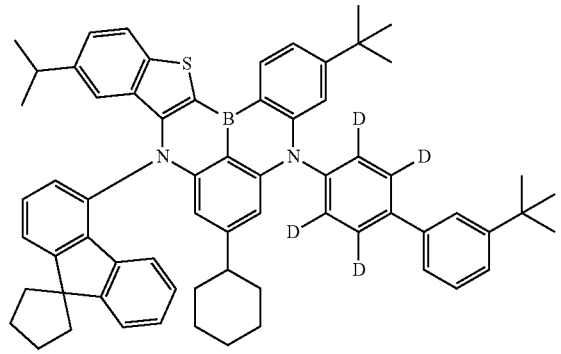 | 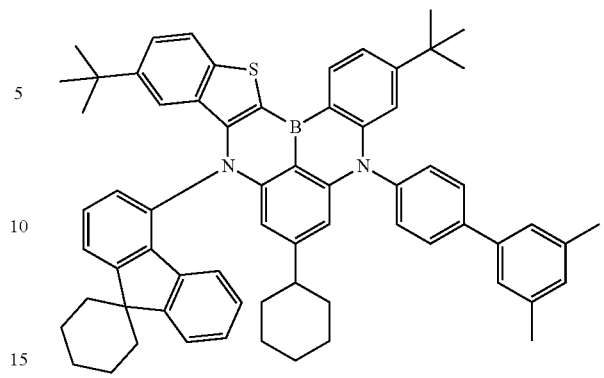 |
| 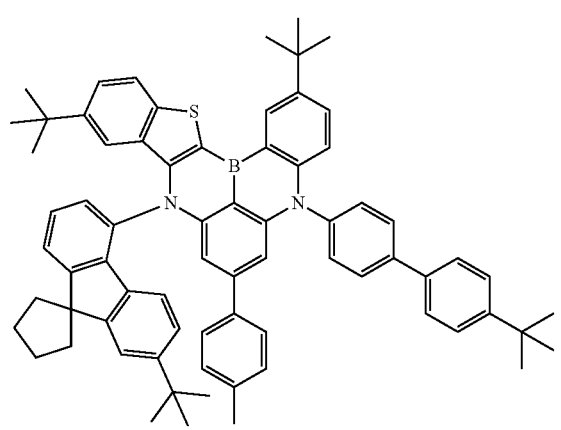 | 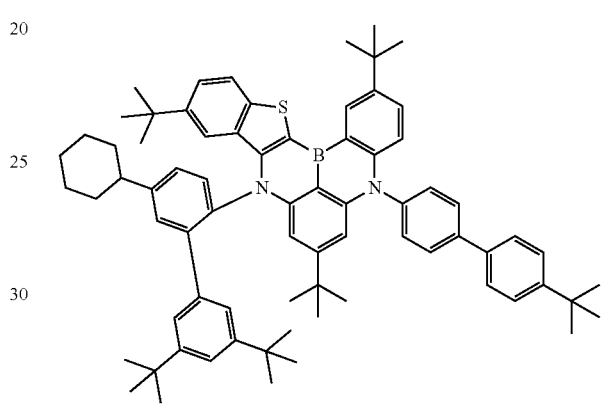 |
| 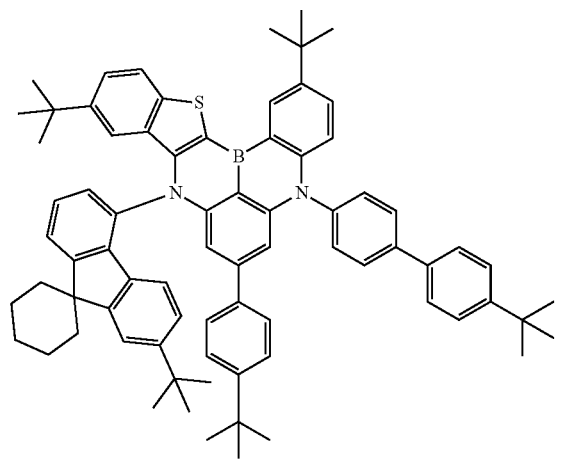 | 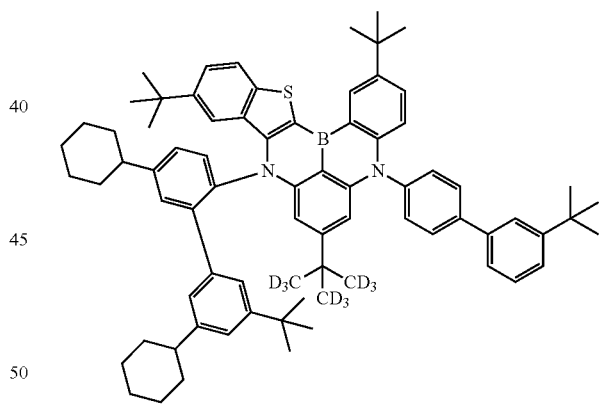 |
| 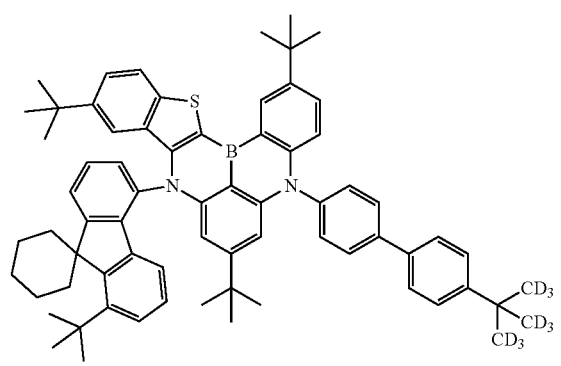 | 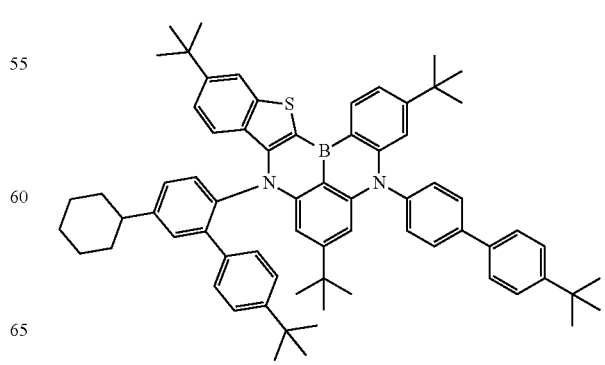 |

193
-continued
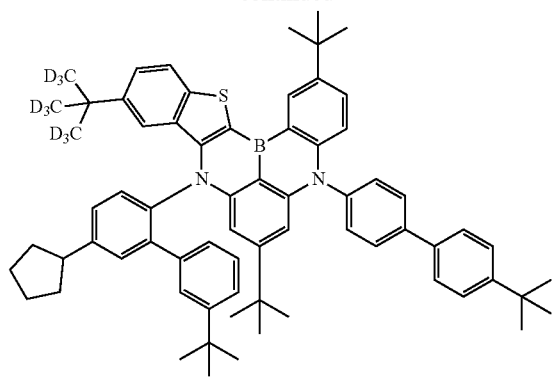
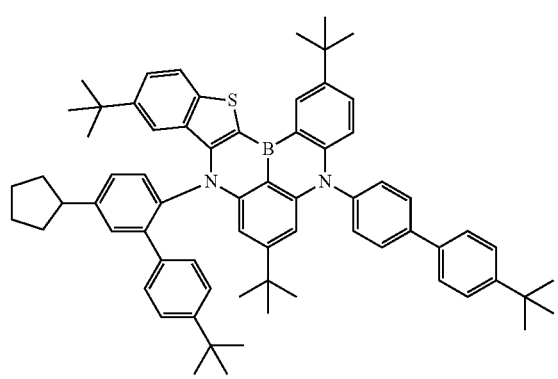
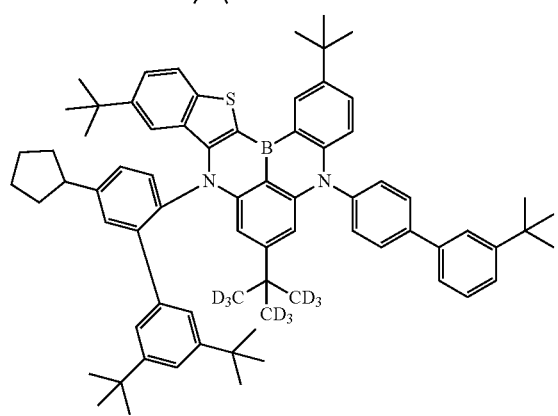
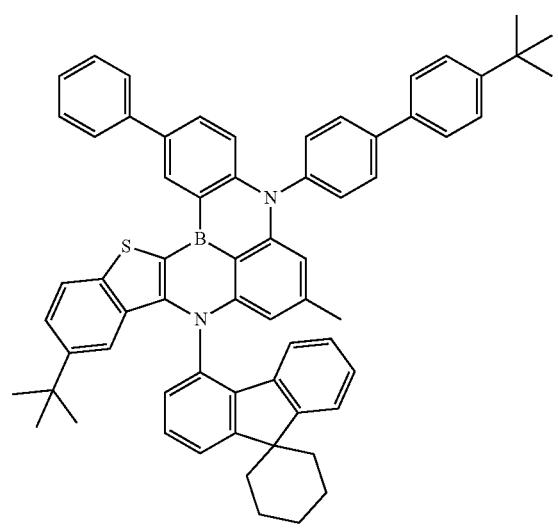
194
-continued
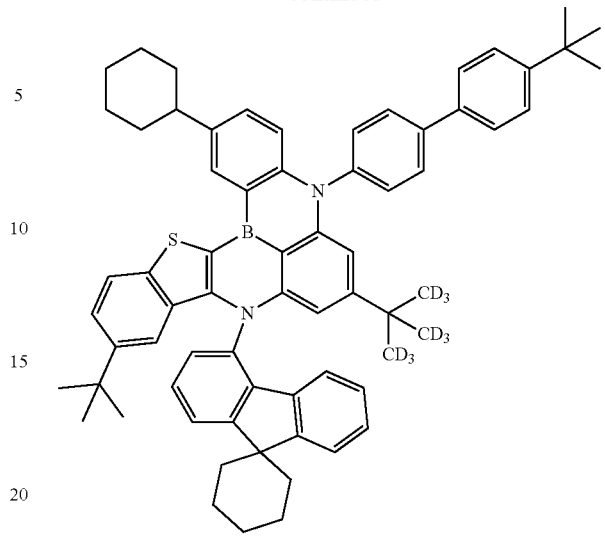
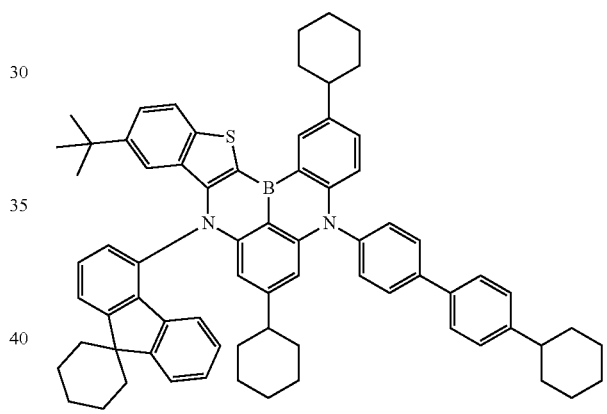
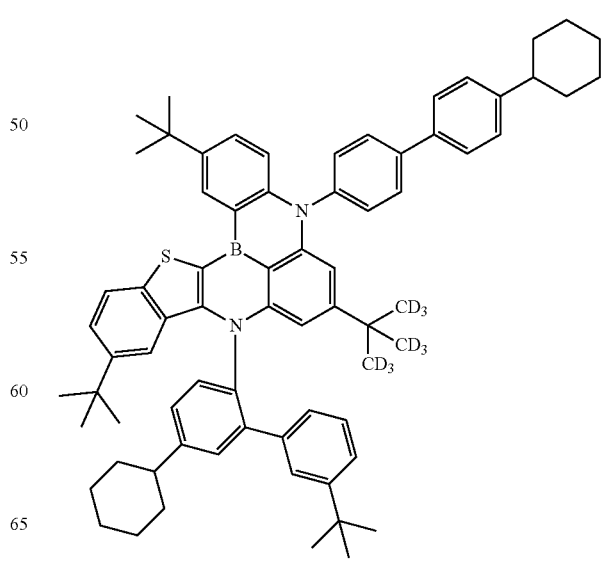

195
-continued
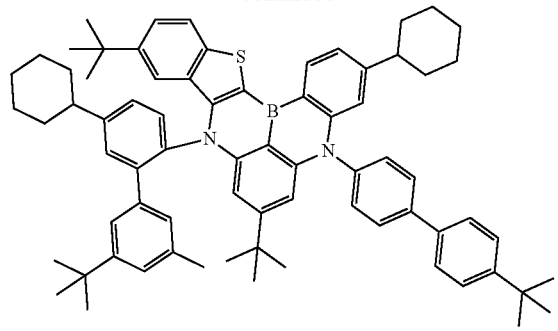
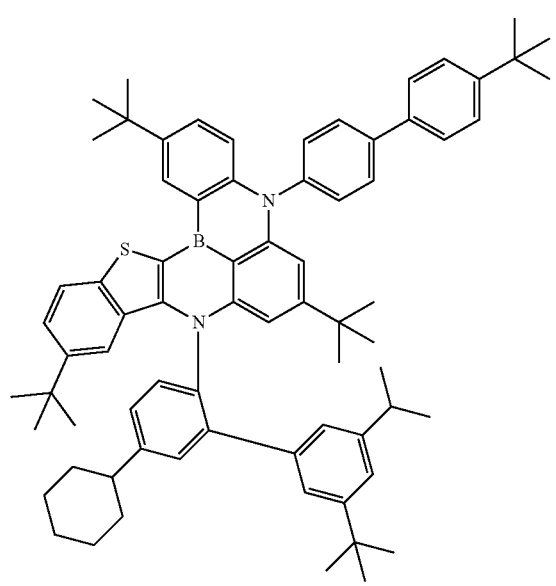
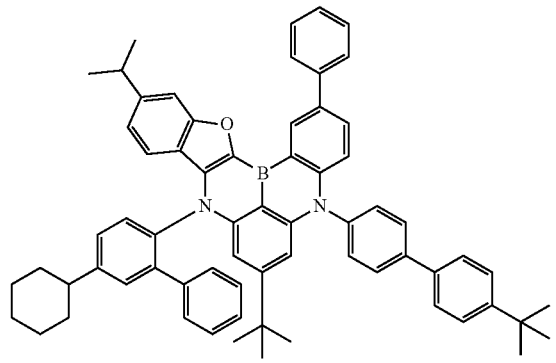
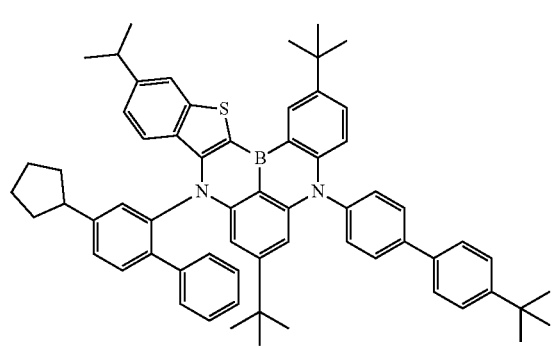
196
-continued
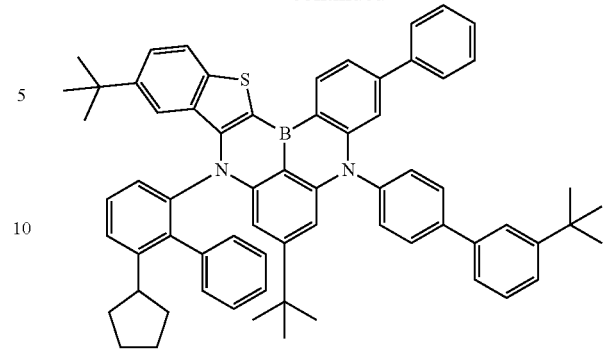
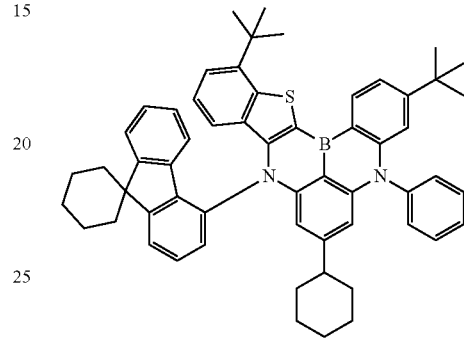
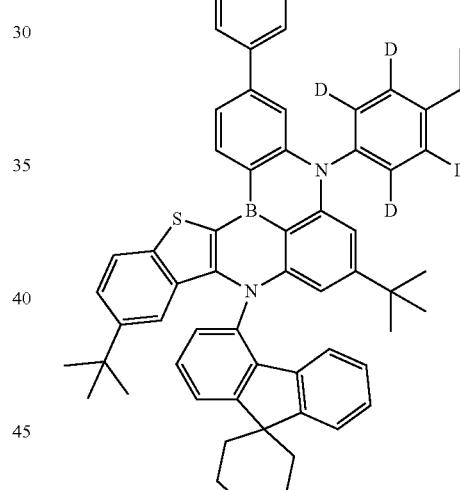
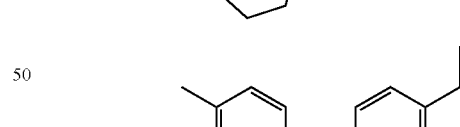
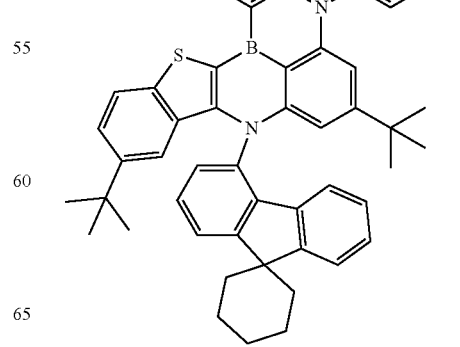

197
-continued
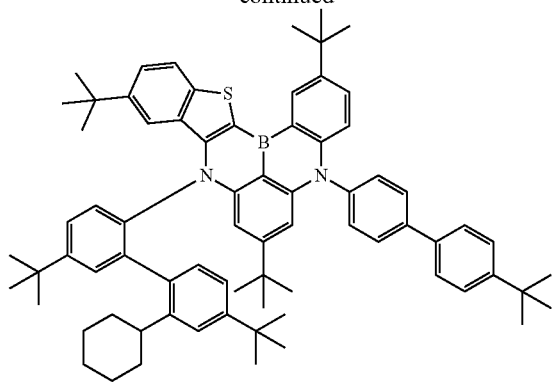
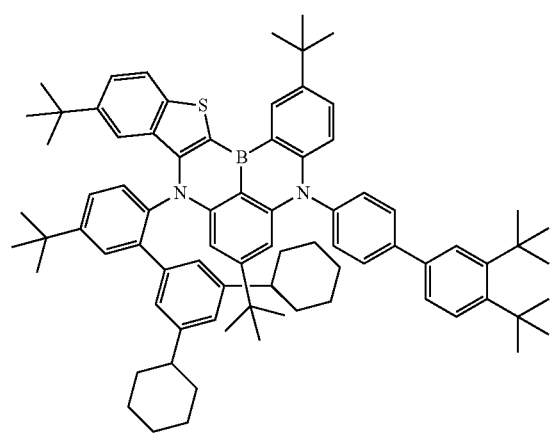
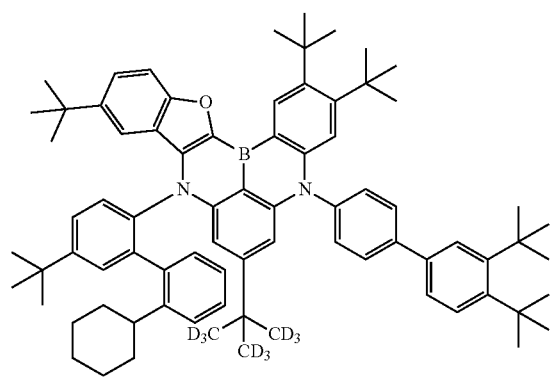
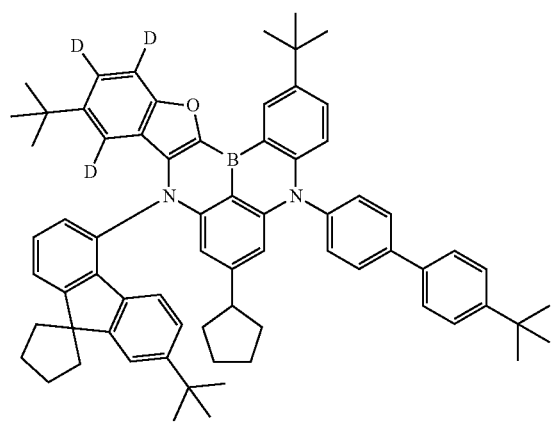
198
-continued
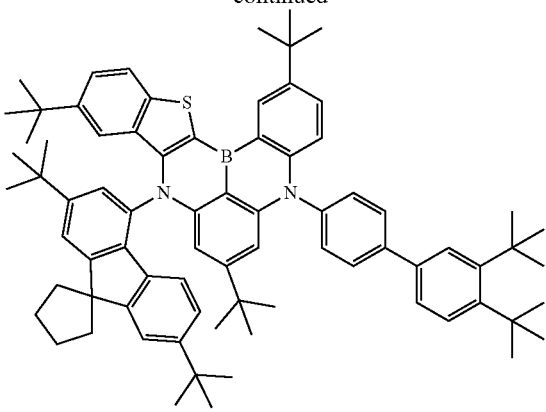
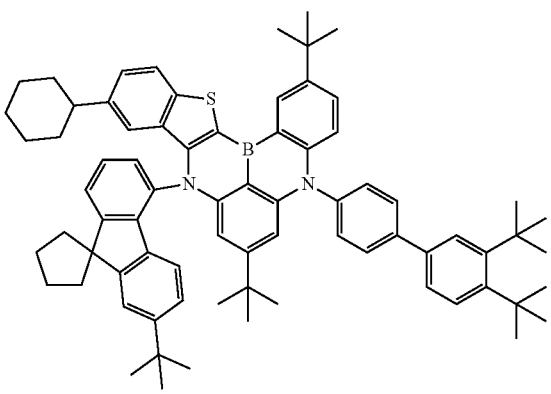
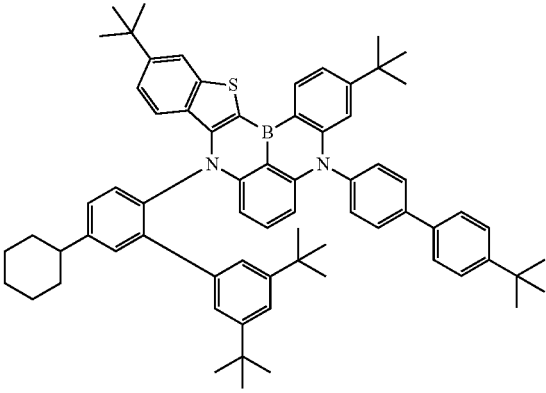
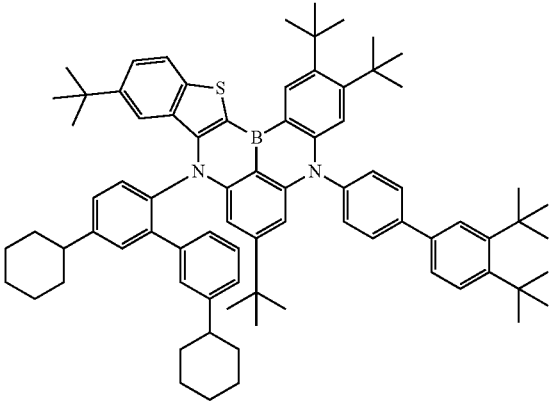

199
-continued

200
-continued

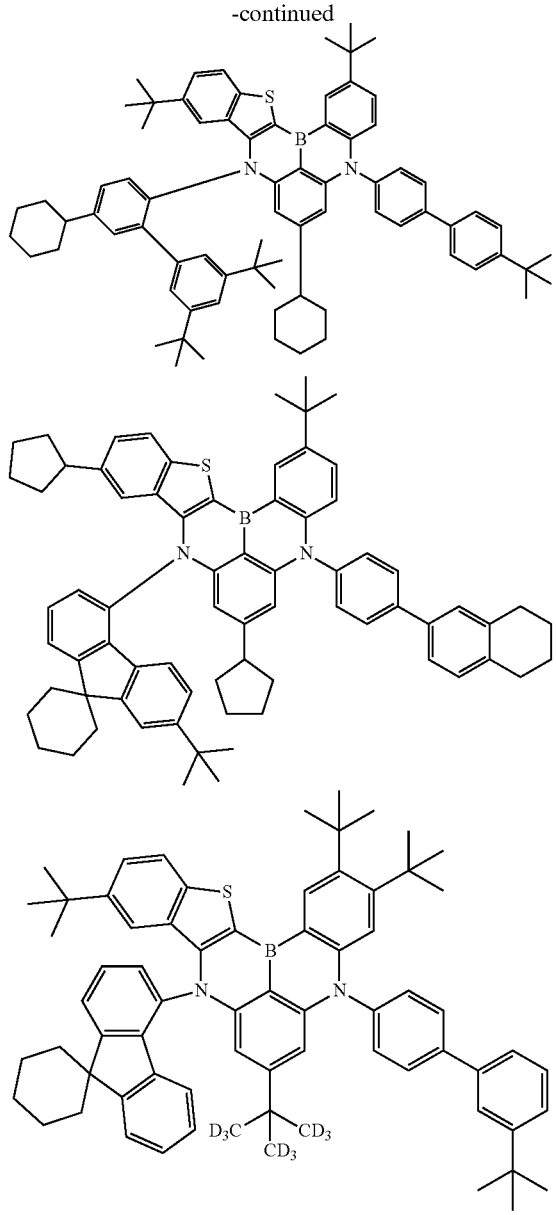

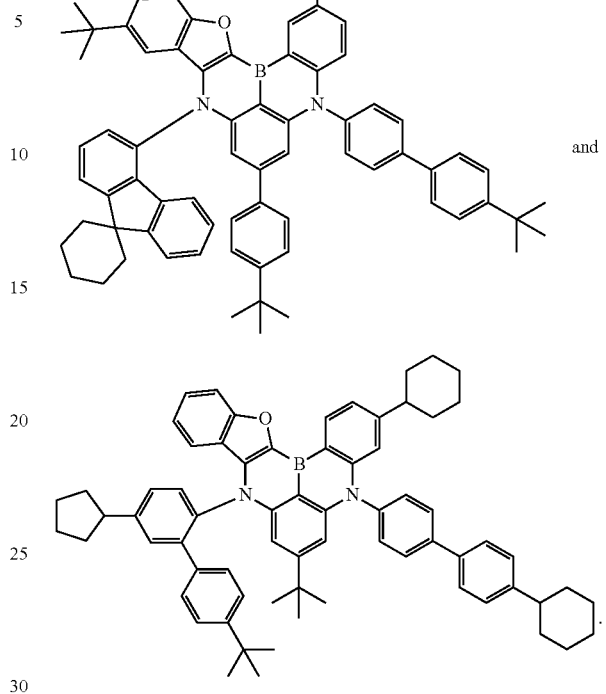

and

11. An organic electroluminescent device, characterized by comprising an anode, a hole transport region, a luminescent layer, an electron transport region, and a cathode, which are sequentially arranged on a substrate plate, wherein the luminescent layer comprises one or more blue luminescent compositions according to claim 1.

12. The organic electroluminescent device according to claim 11, characterized in that the luminescent layer comprises a host material and a guest material, wherein the host material comprises one or more compounds with general structural formulas as represented by Formula I, and the guest material comprises one or more compounds with general structural formulas as represented by Formula II.

* * * * *